US 6,684,170 B2
Jan. 27, 2004

(54) METHOD OF DETECTING AN INTEGRATED CIRCUIT IN FAILURE AMONG INTEGRATED CIRCUITS, APPARATUS OF DOING THE SAME, AND RECORDING MEDIUM STORING PROGRAM FOR DOING THE SAME

(75) Inventor: Kazuhiro Sakaguchi, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 10/320,499

(22) Filed: Dec. 17, 2002

(65) Prior Publication Data

US 2003/0093237 A1 May 15, 2003

Related U.S. Application Data

(62) Division of application No. 09/605,978, filed on Jun. 29, 2000.

(51) Int. Cl.[7] .............................................. G01R 23/16
(52) U.S. Cl. ........................................ 702/76; 324/551
(58) Field of Search .......................... 702/57–59, 64–66, 702/69–71, 75–77, 117, 118, 183–185; 324/551, 752, 769; 714/741, 742, 746

(56) References Cited

U.S. PATENT DOCUMENTS

| 5,572,160 | A | * | 11/1996 | Wadell .......................... 327/427 |
| 5,798,649 | A | * | 8/1998 | Smayling et al. ............. 324/551 |
| 5,944,847 | A | * | 8/1999 | Sanada ........................... 714/741 |
| 6,240,372 | B1 | * | 5/2001 | Gross et al. ................... 702/71 |

FOREIGN PATENT DOCUMENTS

| JP | 09-33604 | 2/1997 |
| JP | 09-211088 | 8/1997 |
| JP | 10-301843 | 11/1998 |
| JP | 11-2663 | 1/1999 |
| JP | 11-94917 | 4/1999 |

OTHER PUBLICATIONS

K. Sakaguchi, "Fault Diagnosis of IC based on Analyzing the Power Spectrum of a Supply Current", *Proceedings of the 1998 IECE General Conference C–12–8*, p. 99.
M. Serra, et al., "Digital IC Testing", *Digital Devices Testing*, pp. 1808–1816.

* cited by examiner

*Primary Examiner*—Marc S. Hoff
*Assistant Examiner*—Mohamed Charioui
(74) *Attorney, Agent, or Firm*—Sughrue Mion, PLLC

(57) ABSTRACT

There is provided a method of detecting an integrated circuit in failure among integrated circuits, based on spectrum which is a result of analyzing a frequency of a current running through an integrated circuit when a test signal is applied to the integrated circuit, comprising the steps of (a) assuming that all integrated circuits under test define a under-test integrated circuit set, and testing each one of the integrated circuits in the under-test integrated circuit set in a conventional manner, (b) removing integrated circuits having been judged to be in failure in the step (a), from the under-test integrated circuit set, (c) measuring spectrum of a current supplied from a power source into each one of the integrated circuits in the under-test integrated circuit set, (d) calculating both a mean value and standard deviation of the spectrum for the under-test integrated circuit set, (e) judging whether an integrated circuit is in failure or in no failure, based on both the mean value and the standard deviation of the spectrum, (f) removing integrated circuits having been judged to be in failure in the step (e), from the under-test integrated circuit set, and (g) judging the under-test integrated circuit set to be in no failure. The method makes it possible to find integrated circuits in failure without preparing data of an integrated circuit in no failure, as a reference.

16 Claims, 40 Drawing Sheets

METHOD OF DETECTING AN INTEGRATED CIRCUIT IN FAILURE AMONG INTEGRATED CIRCUITS, APPARATUS OF DOING THE SAME, AND RECORDING MEDIUM STORING PROGRAM FOR DOING THE SAME

This is a divisional of application Ser. No. 09/605,978 filed Jun. 29, 2000, the disclosure of which is incorporated herein by reference.

BACKGROUND OF THE INVENTION

1. Field of the Invention

The invention relates to a method of detecting an integrated circuit in failure among a plurality of integrated circuits, and more particularly to a method of doing so, based on spectrum which is a result of analyzing a frequency of a current running through an integrated circuit when a test signal is applied to the integrated circuit.

The invention relates also to an apparatus for detecting an integrated circuit in failure among a plurality of integrated circuits, and more particularly to an apparatus for doing so, based on spectrum which is a result of analyzing a frequency of a current running through an integrated circuit when a test signal is applied to the integrated circuit.

The invention relates further to a recording medium readable by a computer, storing a program therein for causing a computer to either carry out the above-mentioned method or act as the above-mentioned apparatus.

2. Description of the Related Art

A method of detecting an integrated circuit in failure among integrated circuits has usually been carried out in order to detect and remove integrated circuits which are not capable of performing desired operations due to defectiveness in fabrication steps, and ship only integrated circuits which can properly operate.

For instance, the inventor had suggested a method of detecting an integrated circuit in failure in Proceedings of the 1998 IEICE General Conference C-12-8 "Diagnosis of failure in an integrated circuit by analysis of a current with power spectrum". In this method, a current running through an integrated circuit while the integrated circuit is in operation is analyzed with respect to a frequency, to thereby detect an abnormal current caused by defectiveness in fabrication step.

Japanese Unexamined Patent Publication No. 9-33604 has suggested a method of identifying a failure mode, comprising the steps of detecting a logic operation test pattern in which a power source current abnormally runs through CMOS logic circuit, which is one of internal circuits of an integrated circuit, in an amount greater than a predetermined amount while the CMOS logic circuit stops its logic operation, when a logic operation test pattern is input into the CMOS logic circuit through an input terminal thereof, extracting a characteristic between a power source voltage and a power source current with the detected logic operation test pattern being input into the CMOS logic circuit, and comparing the thus extracted characteristic between a power source voltage and a power source current to similarity between a failure mode and data between a power source voltage and a power source current, stored in a database, to thereby identify a failure mode occurring in the CMOS logic circuit.

Japanese Unexamined Patent Publication No. 9-211088 has suggested a method of detecting a failure in CMOS integrated circuit by observing a static power source current independent of switching of a transistor, among a current running through CMOS integrated circuit when a test pattern is applied to CMOS integrated circuit. The suggested method is carried out in an apparatus including means for repeatedly applying a test pattern to CMOS integrated circuit under test, means for measuring a power source current supplied to CMOS integrated circuit under test, and means for measuring power spectrum of the detected power source current. The method includes the step of judging whether CMOS integrated circuit is in failure or not by observing a magnitude of power having a predetermined frequency band, among the power spectrum of the power source current.

Japanese Unexamined Patent Publication No. 10-301843 has suggested a data processor comprising a main memory including a plurality of memories, and a plurality of processors transmitting a plurality of requests of data transfer to the main memory for each unit of data, and processing data transmitted from the main memory. The plurality of memories include means for detecting bank competition which occurs by the requests transmitted from the processors, and transmit a bank competition signal to the processors, and a circuit measuring a period of time during which bank competition occurs, based on the bank competition signal.

Japanese Unexamined Patent Publication No. 11-2663 has suggested a method of detecting a failure in CMOS integrated circuit by observing a static power source current running CMOS integrated circuit when a series of test patterns is repeatedly applied to CMOS integrated circuit from LSI tester. The method includes the steps of repeatedly applying test patterns to an integrated circuit under test and a reference integrated circuit which is identical with the integrated circuit under test and is not in failure, measuring a difference between a current running through the integrated circuit under test and a current running through the reference integrated circuit, and judging whether the integrated circuit under test is in failure or not, based on a magnitude of spectrum component having a repetition frequency at which the test patterns are repeated.

Japanese Unexamined Patent Publication No. 11-94917 has suggested a method of testing a semiconductor device on which CMOS circuit is mounted, comprising the steps of inputting a clock signal into the semiconductor device, and calculating a maximum operating frequency on the basis of an inverse number of a delay time during which a power source current starts increasing at a clock operation timing and then becomes steadily equal to zero.

However, the above-mentioned methods are all accompanied with a problem that a reference, that is, data about a power source current of an integrated circuit having no failure has to be prepared in advance in order to test integrated circuits under test.

It is quite difficult to prepare such a reference. The reason is as follows. Data about a power source current is analog data, and is much influenced by processing conditions in fabrication of an integrated circuit. As a result, there is slight fluctuation among data about a power source current of integrated circuits having no failures. Hence, it is quite difficult to define a reference to be used for testing integrated circuits as to whether they are in failure or not.

SUMMARY OF THE INVENTION

In view of the above-mentioned problem, it is an object of the present invention to provide a method of detecting an integrated circuit in failure among integrated circuits, without preparing a reference, that is, data about a power source current of an integrated circuit having no failures, by utilizing data about a power source current of integrated circuits under test.

It is also an object of the present invention to provide an apparatus for doing the same.

Another object of the present invention is to provide a recording medium readable by a computer, storing a program therein for causing a computer to carry out the above-mentioned method or act as the above-mentioned apparatus.

In one aspect of the present invention, there is provided a method of detecting an integrated circuit in failure among integrated circuits, based on spectrum which is a result of analyzing a frequency of a current running through an integrated circuit when a test signal is applied to the integrated circuit, without preparing data of an integrated circuit in no failure, as a reference, the method including the steps of (a) assuming that all integrated circuits under test define a under-test integrated circuit set, and testing each one of the integrated circuits in the under-test integrated circuit set in a conventional manner, (b) removing integrated circuits having been judged to be in failure in the step (a), from the under-test integrated circuit set, (c) measuring spectrum of a current supplied from a power source into each one of the integrated circuits in the under-test integrated circuit set, (d) calculating both a mean value and standard deviation of the spectrum for the under-test integrated circuit set, (e) judging whether an integrated circuit is in failure or in no failure, based on both the mean value and the standard deviation of the spectrum, (f) removing integrated circuits having been judged to be in failure in the step (e), from the under-test integrated circuit set, and (g) judging the under-test integrated circuit set to be in no failure.

It is preferable that the method further includes the step (h) of normalizing the spectrum, the step (h) being to be carried out subsequently to the step (c).

It is preferable that the step (h) further includes the steps of (h1) summing up spectrum for all frequencies to have a total, and (h2) calculating a ratio of spectrum for each one of frequencies to the total.

It is preferable that the step (e) further includes the steps of (e1) calculating a gap between the spectrum and the mean value, (e2) dividing the gap by the standard deviation, (e3) comparing a quotient obtained in the step (e2) to a predetermined value, and (e4) judging an integrated circuit to be in failure, if the quotient is greater than the predetermined value, and judging an integrated circuit to be in no failure, if the quotient is equal to or smaller than the predetermined value.

There is further provided a method of detecting an integrated circuit in failure among integrated circuits, based on spectrum which is a result of analyzing a frequency of a current running through an integrated circuit when a test signal is applied to the integrated circuit, without preparing data of an integrated circuit in no failure, as a reference, the method including the steps of (a) assuming that all integrated circuits under test define a under-test integrated circuit set, and testing each one of the integrated circuits in the under-test integrated circuit set in a conventional manner, (b) removing integrated circuits having been judged to be in failure in the step (a), from the under-test integrated circuit set, (c) measuring spectrum of a current supplied from a power source into each one of the integrated circuits in the under-test integrated circuit set, (d) calculating a mean value and standard deviation of the spectrum for the under-test integrated circuit set, (e) checking whether the standard deviation is equal to or smaller than a predetermined value, (f) removing an integrated circuit having specific spectrum determined based on the mean value, from the under-test integrated circuit set, if the standard deviation is greater than the predetermined value, and repeating the steps (d), (e) and (f), and (g) judging the under-test integrated circuit set to be in no failure, if the standard deviation has been judged to be equal to or smaller than the predetermined value in the step (e).

It is preferable that the method further includes the step (h) of normalizing the spectrum, the step (h) being to be carried out subsequently to the step (c).

It is preferable that the step (h) further includes the steps of (h1) summing up spectrum for all frequencies to have a total, and (h2) calculating a ratio of spectrum for each one of frequencies to the total.

It is preferable that the step (f) further includes the steps of (f1) calculating a gap between the spectrum and the mean value for each one of frequencies, (f2) identifying an integrated circuit having a maximum gap among gaps calculated in the step (f1), and (f3) removing the integrated circuit identified in the step (f2), from the under-test integrated circuit set.

There is still further provided a method of detecting an integrated circuit in failure among integrated circuits, based on spectrum which is a result of analyzing a frequency of a current running through an integrated circuit when a test signal is applied to the integrated circuit, without preparing data of an integrated circuit in no failure, as a reference, the method including the steps of (a) testing integrated circuits to find an integrated circuit in no failure, (b) measuring spectrum of a current supplied from a power source into the integrated circuit, (c) judging the integrated circuit to be in failure, (d) repeating the steps (a) to (c) until spectrum is measured for N integrated circuits wherein N is a predetermined integer, (e) calculating a mean value and standard deviation for each frequencies with respect to the spectrum of the N integrated circuits, (f) judging whether the spectrum is abnormal or not, based on the mean value and the standard deviation, (g) deleting data of spectrum having been judged abnormal in the step (f), and repeating the steps (a) to (f), (h) defining the mean value and the standard deviation as a reference, (i) testing integrated circuits to find an integrated circuit in no failure, (j) measuring spectrum of a current supplied from a power source into the integrated circuit, (k) judging whether the spectrum is abnormal or not, based on the reference, and judging an integrated circuit to be either in no failure if the spectrum is abnormal or in failure if the spectrum is not abnormal, (l) carrying out the steps (i) to (j) for integrated circuits not tested yet, (m) defining integrated circuits having been judged to be in failure as integrated circuits not tested yet, and (n) repeating the steps (i) to (l).

It is preferable that the step (k) further includes the step of updating the reference, based on data of the spectrum.

It is preferable that the method further includes the step (o) of normalizing the spectrum, the step (o) being to be carried out subsequently to at least one of the steps (b) and (j).

It is preferable that the step (o) includes the steps of (o1) summing up spectrum for all frequencies to have a total, and (o2) calculating a ratio of spectrum for each one of frequencies to the total.

It is preferable that the method further includes the step (o) of normalizing the spectrum, the step (o) being to be carried out subsequently to at least one of the steps (b) and (j).

It is preferable that the step (o) includes the steps of (o1) summing up spectrum for all frequencies to have a total, and (o2) calculating a ratio of spectrum for each one of frequencies to the total.

It is preferable that the step (f) further includes the steps of (f1) calculating a gap between the spectrum and the mean value, (f2) dividing the gap by the standard deviation, (f3) comparing a quotient obtained in the step (f2) to a predetermined value, and (f4) judging the spectrum to be abnormal, if the quotient is greater than the predetermined value, and judging the spectrum not to be abnormal, if the quotient is equal to or smaller than the predetermined value.

It is preferable that the spectrum is judged not abnormal if the spectrum is equal to or smaller than the reference, and is judged abnormal if the spectrum is greater than the reference, in the step (k).

There is yet further provided a method of detecting an integrated circuit in failure among integrated circuits, based on spectrum which is a result of analyzing a frequency of a current running through an integrated circuit when a test signal is applied to the integrated circuit, without preparing data of an integrated circuit in no failure, as a reference, the method including the steps of (a) measuring spectrum of some of integrated circuits among integrated circuits under test, to thereby establish a reference, and (b) comparing the rest of integrated circuits among integrated circuits under test, to the reference to thereby judge whether each one of the rest of integrated circuits is in failure or not.

It is preferable that the method further includes the step of (c) judging whether the some of integrated circuits are in failure or not, based on the reference.

It is preferable that the method further includes the steps of (c) assuming that the some of integrated circuits are all in failure, and (d) judging again whether integrated circuits which have been judged to be in failure are in failure or not, after all integrated circuits have been judged as to whether they are in failure or not.

In another aspect of the present invention, there is provided an apparatus for detecting an integrated circuit in failure among integrated circuits, based on spectrum which is a result of analyzing a frequency of a current running through an integrated circuit when a test signal is applied to the integrated circuit, without preparing data of an integrated circuit in no failure, as a reference, the apparatus including (a) a tester which tests an integrated circuit in a conventional manner as to whether the integrated circuit is in failure or not, (b) a spectrum measurement unit which measures spectrum of the integrated circuit, (c) a first memory storing the spectrum therein, (d) a calculator calculating both a mean value and standard deviation of spectrum of all integrated circuits under test, based on the spectrum stored in the first memory, and (e) a controller which judges whether an integrated circuit is in failure or in no failure, based on both the mean value and the standard deviation of the spectrum.

It is preferable that the controller judges whether an integrated circuit is in failure or in no failure, based on comparison between a value defined as G/SD and a threshold value, wherein G indicates a gap between the spectrum and the mean value, and SD indicates the standard deviation.

It is preferable that the controller judges an integrated circuit to be in failure, if the value is greater than the threshold value, and judges an integrated circuit to be in no failure, if the value is equal to or smaller than the threshold value.

It is preferable that the apparatus further includes a second memory in which the threshold value is to be stored.

It is preferable that the controller judges that an integrated circuit having a maximum G/SD is in failure, when the standard deviation is greater than the threshold value.

It is preferable that the apparatus further includes a normalizer which normalizes the spectrum and replaces the previous spectrum with the normalized spectrum.

There is further provided an apparatus for detecting an integrated circuit in failure among integrated circuits, based on spectrum which is a result of analyzing a frequency of a current running through an integrated circuit when a test signal is applied to the integrated circuit, without preparing data of an integrated circuit in no failure, as a reference, the apparatus including (a) a tester which tests an integrated circuit in a conventional manner as to whether the integrated circuit is in failure or not, (b) a spectrum measurement unit which measures spectrum of the integrated circuit, (c) a first memory storing the spectrum therein, and (d) a controller which establishes a reference, based on spectrum of the predetermined number of integrated circuits under test, and judges whether an integrated circuit is in failure or in no failure, by comparing spectrum of each one of the integrated circuits under test to the reference.

It is preferable that the controller updates the reference, based on spectrum of an integrated circuit having been judged to be in no failure.

There is still further provided an apparatus for detecting an integrated circuit in failure among integrated circuits, based on spectrum which is a result of analyzing a frequency of a current running through an integrated circuit when a test signal is applied to the integrated circuit, without preparing data of an integrated circuit in no failure, as a reference, the apparatus including (a) a logic tester which tests an integrated circuit in a conventional manner as to whether the integrated circuit is in failure or not, (b) a spectrum measurement unit which measures spectrum of the integrated circuit, (c) a first memory storing the spectrum therein, (d) a calculator calculating both a mean value and standard deviation of spectrum of all integrated circuits under test, for each of frequencies, based on the spectrum stored in the first memory, and (e) a controller which judges whether an integrated circuit is in failure or in no failure, based on both the mean value and the standard deviation of the spectrum.

There is yet further provided an apparatus for detecting an integrated circuit in failure among integrated circuits, based on spectrum which is a result of analyzing a frequency of a current running through an integrated circuit when a test signal is applied to the integrated circuit, without preparing data of an integrated circuit in no failure, as a reference, the apparatus including (a) a logic tester which tests an integrated circuit in a conventional manner as to whether the integrated circuit is in failure or not, (b) a spectrum measurement unit which measures spectrum of the integrated circuit, (c) a first memory storing the spectrum therein, (d) a calculator calculating both a mean value and standard deviation of spectrum of all integrated circuits under test, for each of frequencies, based on the spectrum stored in the first memory, and (e) a controller which establishes a reference, based on spectrum of the predetermined number of integrated circuits under test, and judges whether an integrated circuit is in failure or in no failure, by comparing spectrum of each one of the integrated circuits under test to the reference.

It is preferable that the apparatus further includes (f) a first container for containing therein integrated circuits not tested yet, (g) a second container for containing therein integrated circuits having been judged to be in no failure, and (h) a third container for containing therein integrated circuits having been judged to be in failure.

It is preferable that the controller updates the reference, based on spectrum of an integrated circuit having been judged to be in no failure.

In still another aspect of the present invention, there is provided a recording medium readable by a computer, storing a program therein for causing a computer to carry out the above-mentioned method.

There is further provided a recording medium readable by a computer, storing a program therein for causing a computer to act as the above-mentioned apparatus.

The advantages obtained by the aforementioned present invention will be described hereinbelow.

As mentioned earlier, a method of detecting an integrated circuit in failure, based on spectrum of a power source current is accompanied with a problem that it is quite difficult to prepare a reference, that is, spectrum of a power source current of an integrated circuit having no failures, because of difference in processing conditions in fabrication of integrated circuits. The inventor found out the fact that almost all integrated circuits actually have no failures among integrated circuits having been judged to have no failures in accordance with a conventional method, and that quite a small number of integrated circuits having failures could not be detected in accordance with a conventional method. Based on this discovery, the inventor herein suggests a method of detecting an integrated circuit in failure by analyzing spectrum of a power source current of all integrated circuits under test.

Specifically, integrated circuits are all tested in accordance with a conventional method to thereby have an under-test integrated circuit set containing integrated circuits having been judged to have no failures in accordance with a conventional method. This under-test integrated circuit set contains integrated circuits which have failures, but have not been detected in accordance with a conventional manner, at a quite small rate, though.

Then, power source current spectrum is observed for each one of integrated circuits belonging to the under-test integrated circuit set, to thereby calculate a mean value and standard deviation. Then, a gap between spectrum and the mean value in each one of the integrated circuits is standardized by the standard deviation to thereby quantify the gap in the under-test integrated circuit set.

Though spectrum of integrated circuits having no failures are expected to distribute in the vicinity of the mean value, spectrum of integrated circuits having failures distribute much far away from the mean value. Accordingly, it would be possible to select integrated circuits having no failures by removing integrated circuits having spectrum distributing far away from the mean value, even without preparation of a reference, that is, data about spectrum of integrated circuits having no failures.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings.

[First Embodiment]

Figure 1:
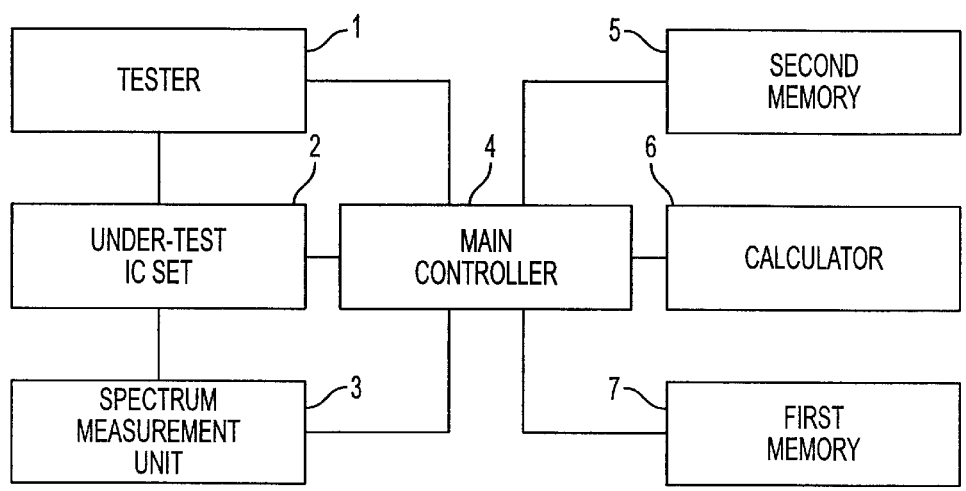
FIG. 1 is a block diagram of the apparatus in accordance with the first embodiment.

FIG. 1 is a block diagram of an apparatus for detecting an integrated circuit having failures among a plurality of integrated circuits, in accordance with the first embodiment. The illustrated apparatus is comprised of a tester 1, an under-test integrated circuit set 2, a spectrum measurement unit 3, a main controller 4, a first memory 7, a second memory 5, and a calculator 6.

The under-test integrated circuit set 2 contains a plurality of the same integrated circuits to be tested as to whether they are in failure or not. The tester 1 is controlled by the main controller 4, and tests each one of integrated circuits in the under-test integrated circuit set 2 in accordance with a conventional method as to whether each one of integrated circuits is in failure or not. For instance, the tester 1 tests integrated circuits in accordance with the method mentioned in "The Electrical Handbook", R. C. Dorf, 1993, pp. 1808–1816.

The test results are transmitted to the first memory 7 through the main controller 4, and are stored in the first memory 7. The spectrum measurement unit 3 is controlled by the main controller 4. The spectrum measurement unit 3 applies a test signal to each one of integrated circuits in the under-test integrated circuit set 2, observes a power source current running through the integrated circuit, and analyzes a frequency of the current. Power source current spectrum obtained by analysis of a frequency is stored in the first memory 7 through the main controller 4.

The power source current spectrum is observed by the spectrum measurement unit 3 only for integrated circuits having been judged to have no failures by the tester 1. On receipt of an instruction transmitted from the main controller 4, the calculator 6 judges whether each one of integrated circuits in the under-test integrated circuit set is in failure or not, based on both data about power source current spectrum, stored in the first memory 7, and data indicative of a predetermined value, stored in the second memory 5, and outputs the results of judgement.

Figure 2:
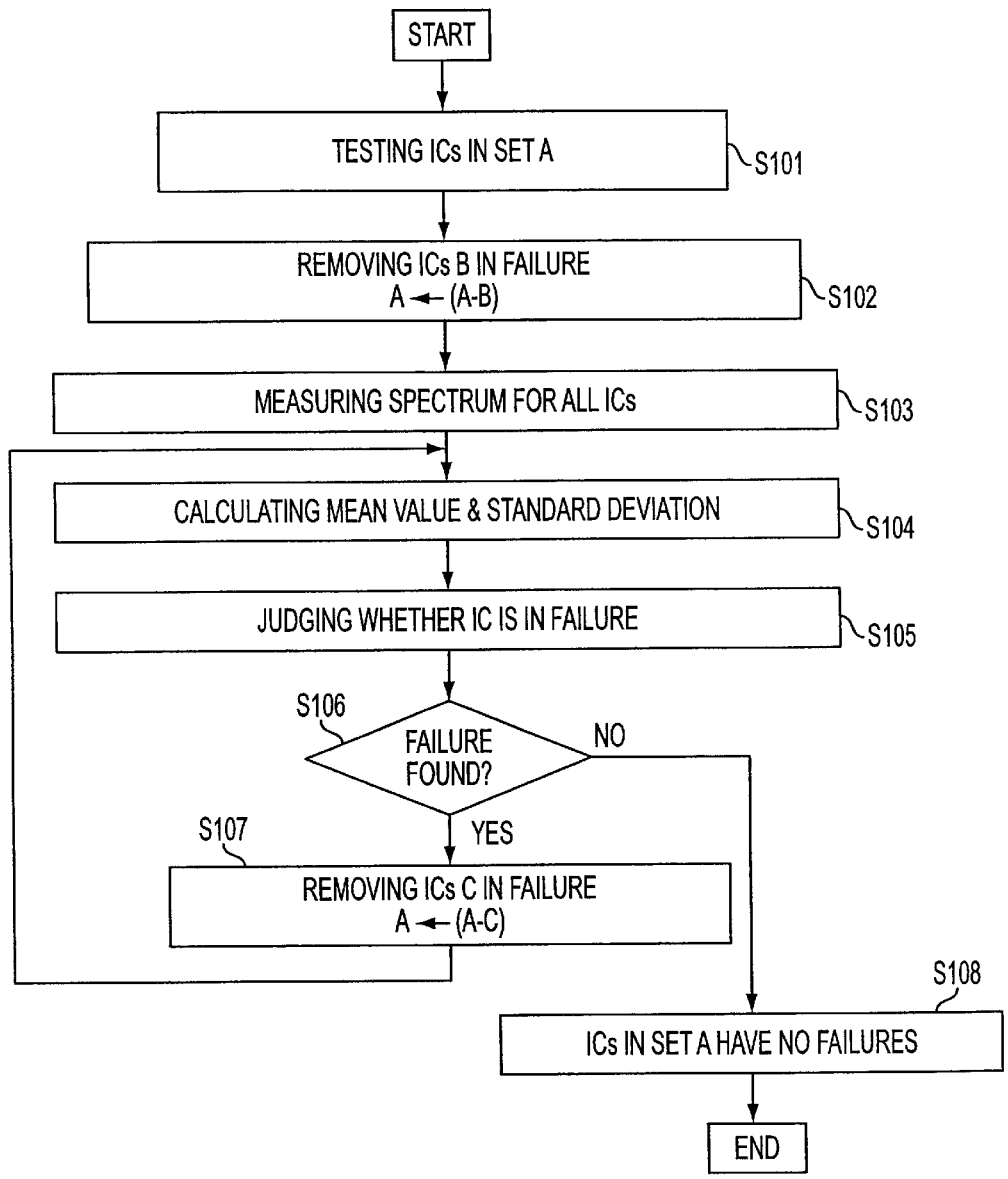
FIG. 2 is a flow-chart showing an operation of the apparatus in accordance with the first embodiment.

FIG. 2 is a flow-chart showing an operation of the apparatus in accordance with the first embodiment. Herein, the under-test integrated circuit set 2 containing a plurality of the same integrated circuits to be tested is indicated with "A". At this stage, the integrated circuit set A is identical with the under-test integrated circuit set 2.

First, integrated circuits in the integrated circuit set A are tested by the tester 1 as to whether they are in failure or not in accordance with conventional tests such as a performance test or a direct current test, in step S101.

The results of the test are transmitted to and stored in the first memory 7. At the same time, integrated circuits having been judged to be in failure by the tester 1 are removed from the integrated circuit set A, in step S102.

The spectrum measurement unit 3 applies a test signal to each one of integrated circuits in the integrated circuit set A, that is, each one of the integrated circuits having been judged to be in no failure among the under-test integrated circuit set 2 in step S101, observes a power source current running through each one of the integrated circuits, and analyzes a frequency of the observed current. Spectrum of a power source current, obtained as a result of analysis of the frequency, is transmitted to and stored in the first memory 7, in step S103.

Then, the calculator 6 calculates a mean value and standard deviation for each one of frequencies of the power source current spectrum of the integrated circuits in the integrated circuit set A, based on the spectrum of the integrated circuits in the integrated circuit set A, stored in the first memory 7, in step S104.

In addition, the calculator 6 calculates G/SD for each one of the integrated circuits for each one of frequencies wherein G indicates a difference between the spectrum of each one of integrated circuits in the integrated circuit set A and the mean value, and SD indicates the standard deviation having been calculated in step S104. If the thus calculated G/SD is greater than the predetermined value stored in the second memory 5, the calculator 6 judges that an integrated circuit having such G/SD is in failure, in step S105.

Then, it is judged in step S106 whether there has been found an integrated circuit in failure in the integrated circuit set A.

If there has been found an integrated circuit having failures (YES in step S106), such an integrated circuit is removed from the integrated circuit set A, in step S107, and steps S104 to S106 are repeated.

If there has not been found an integrated circuit having failures (NO in step S106), all the integrated circuits in the integrated circuit set A are judged to be in no failure, in step S108.

The above-mentioned operation may be described as a control program and stored in a recording medium such as a floppy disc or ROM equipped with the main controller 4. By carrying out the control program in the main controller 4, the above-mentioned operation can be repeated.

Hereinbelow are explained advantages provided by the above-mentioned first embodiment.

When an integrated circuit is tested as to whether it is in failure or not, in accordance with a conventional method, the tested integrated circuit may have any failure, even if the integrated circuit is judged to be in no failure. In other words, it is not always possible to detect all failures in an integrated circuit in accordance with a conventional method. This means that a conventional method can detect merely about 95% of possible failures.

This is because ability of detecting failures is limited to practical one on the ground that if all failures in an integrated circuit are to be detected, it would take much time and cost.

In addition, there have been increased failure modes which could not be grouped in conventional failure models, as an integrated circuit has been fabricated in a smaller size, at a higher speed, and in higher integration. Such failure modes cannot be detected in accordance with conventional methods.

Thus, an integrated circuit often improperly operates due to failures which cannot be detected by conventional methods. It is quite important to detect failures as much as possible. In the apparatus in accordance with the first embodiment, data about a power source current is used in order to detect a failure in an integrated circuit. Namely, whereas the conventional methods use data about a voltage for detecting failures, the apparatus in accordance with the first embodiment uses data about a power source current to thereby make it possible to detect failures which could not be detected by the conventional methods.

However, since a power source current is an analog value, and is much influenced by processing conditions in fabrication of an integrated circuit, it would be necessary to prepare data about a power source current of an integrated circuit having no failures. It is quite difficult to prepare such data as a reference.

Such data as a reference can be obtained by carrying out simulation in which a test signal is applied to an integrated circuit. However, it would take much time to carry out such simulation for each of integrated circuits.

When a plurality of integrated circuits are tested in accordance with a conventional method as to whether they are in failure or not, a majority of integrated circuits having been judged to be in no failure has actually no failures, and quite a minority of integrated circuits has a failure or failures. Accordingly, it is considered that almost all spectrum of a power source current of integrated circuits having been judged to be in no failure in accordance with a conventional method exhibit almost the same value, and only a small number of integrated circuits having a failure exhibits abnormal spectrum of a power source current.

Thus, it is possible to identify integrated circuits having no failures among a plurality of integrated circuits without data about spectrum of a power source current of an integrated circuit having no failures, by observing spectrum of a power source current of integrated circuits having been judged to be in no failure in accordance with a conventional method, and judging that integrated circuits exhibiting power source current spectrum different from power source current spectrum exhibited by a majority of integrated circuits among tested integrated circuits are in failure.

In the above-mentioned first embodiment, integrated circuits exhibiting spectrum other than spectrum exhibited by a majority of integrated circuits are identified as integrated circuits having spectrum which has a great difference from a mean value. Specifically, a difference between spectrum of each one of integrated circuits and a mean value of spectrum in each of frequencies of the power source current spectrum is divided by standard deviation. If the thus calculated quotient is greater than a predetermined value, an integrated circuit associated with the spectrum is judged to be in failure.

By repeating the above-mentioned calculation, the mean value and standard deviation of the power source current spectrum are updated. Based on the thus updated mean value and standard deviation, an integrated circuit exhibiting power source current spectrum greater than a predetermined value is judged to be in failure and removed. At the time when no integrated circuits are judged to be in failure, it is judged that all of tested integrated circuits are in no failure.

As mentioned so far, the first embodiment makes it possible to select a majority of integrated circuits having no failures from a minority of integrated circuits having failures.

Hereinbelow is explained an example of the apparatus in accordance with the first embodiment.

Figure 3:
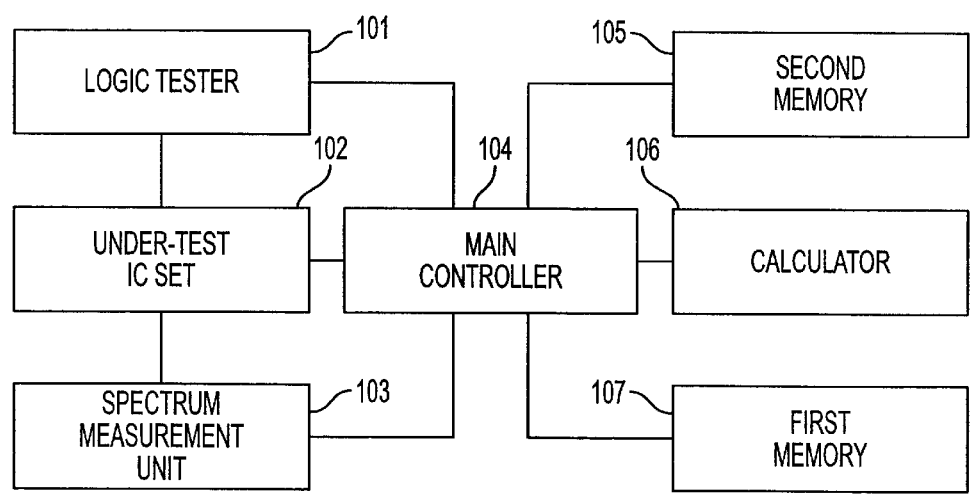
FIG. 3 is a block diagram of the apparatus in accordance with an example of the first embodiment.
Figure 4:
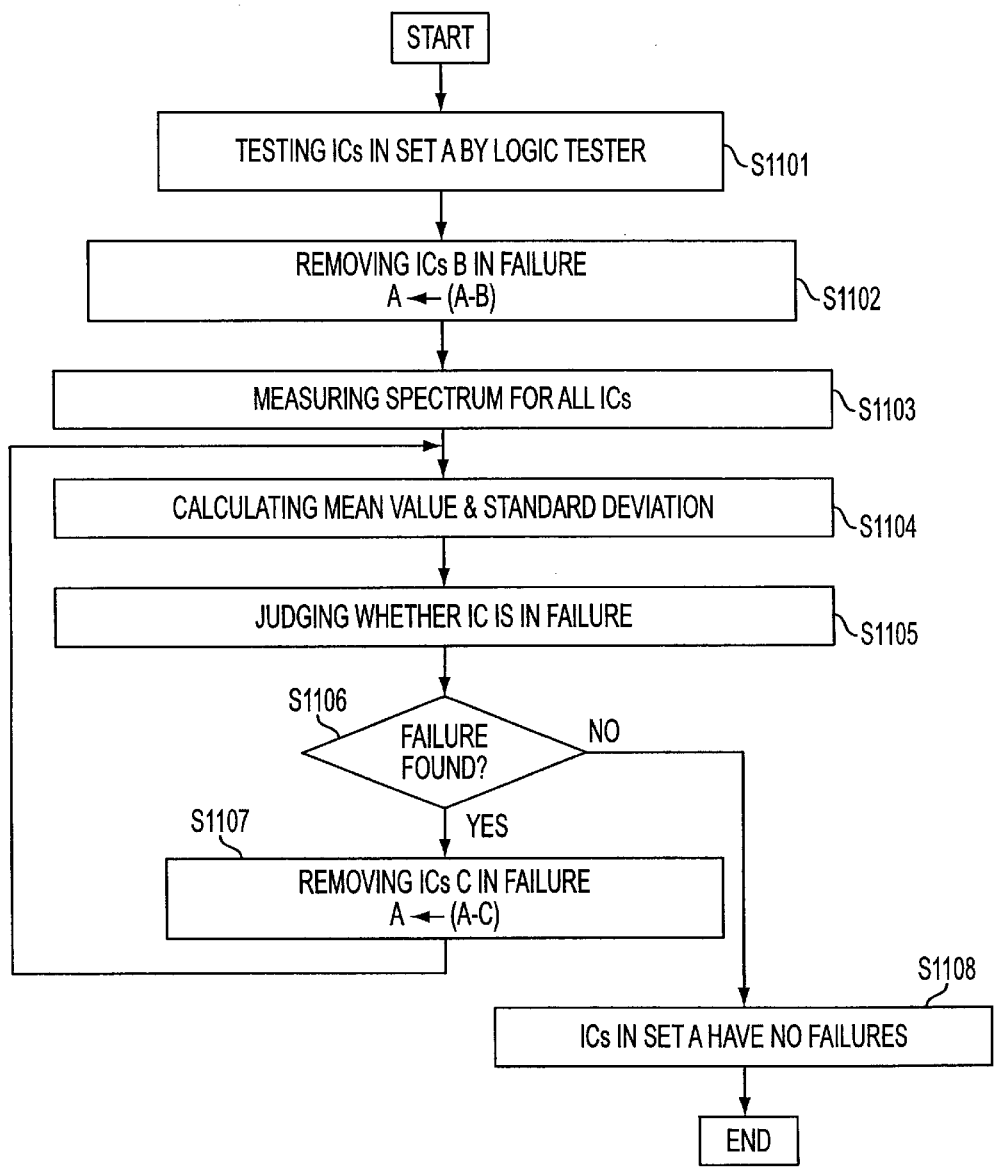
FIG. 4 is a flow-chart showing an operation of the apparatus in accordance with the example of the first embodiment.

FIG. 3 is a block diagram of an apparatus for detecting an integrated circuit having failures among a plurality of integrated circuits, in accordance with the example of the first embodiment, and FIG. 4 is a flow-chart showing an operation of the apparatus illustrated in FIG. 3.

The illustrated apparatus is comprised of a logic tester 101, an under-test integrated circuit set 102, a spectrum measurement unit 103, a main controller 104, a first memory 107, a second memory 105, and a calculator 106.

The under-test integrated circuit set 102 contains a plurality of the same integrated circuits to be tested as to whether they are in failure or not. The tester 101 is controlled by the main controller 104, and tests each one of integrated circuits in the under-test integrated circuit set 102 in accordance with a conventional test such as a function test or DC test, as to whether each one of integrated circuits is in failure or not, in step S1101. Herein, a function test is a test by which each one of integrated circuits is tested as to whether it can satisfactorily accomplish expected performances. The function test is carried out by applying a test voltage signal to an integrated circuit through an input terminal thereof, and observing fluctuation of a voltage at an output terminal. DE test is a test by which each one of integrated circuits is tested as to whether input and output characteristic of each one of integrated circuits meets with predetermined characteristic.

The results of the test carried out by the logic tester 101 are transmitted to in the first memory 107, and then, integrated circuits having been judged to be in no failure by the logic tester 101 are stored in the first memory 107 as an integrated circuit set A, in step S1102.

Then, the spectrum measurement unit 103 applies a test signal to each one of integrated circuits in the integrated circuit set A, observes a power source current running through each one of the integrated circuits, and analyzes a frequency of the observed power source current. Spectrum of a power source current, obtained as a result of analysis of the frequency, is transmitted to and stored in the first memory 107, in step S1103.

Then, the calculator 106 calculates a mean value and standard deviation for each one of frequencies of the power source current spectrum of the integrated circuits in the integrated circuit set A, based on the spectrum of the integrated circuits in the integrated circuit set A, stored in the first memory 107, in step S1104.

The calculator 106 calculates G/SD for each one of the integrated circuits for each one of frequencies wherein G indicates a difference between the spectrum of each one of integrated circuits in the integrated circuit set A and the mean value, and SD indicates the standard deviation having been calculated in step S1104. If the thus calculated G/SD is greater than a predetermined value stored in the second memory 105, the calculator 106 judges that an integrated circuit having such G/SD is in failure, in step S1105.

Then, it is judged in step S1106 whether there has been found an integrated circuit in failure in the integrated circuit set A.

If there has been found an integrated circuit having failures (YES in step S1106), such an integrated circuit is removed from the integrated circuit set A in step S1107, and steps S1104 to S1106 are repeated.

Steps S1104 to S1106 are repeated until there is no integrated circuit judged to be in failure. Thus, if there has not been found an integrated circuit having failures (NO in step S1106), all the integrated circuits in the integrated circuit set A are judged to be in no failure, in step S1108.

The above-mentioned operation may be described as a control program and stored in a recording medium such as a floppy disc or ROM equipped with the main controller 104. By carrying out the control program in the main controller 104, the above-mentioned operation can be repeated.

[Second Embodiment]

Figure 5:
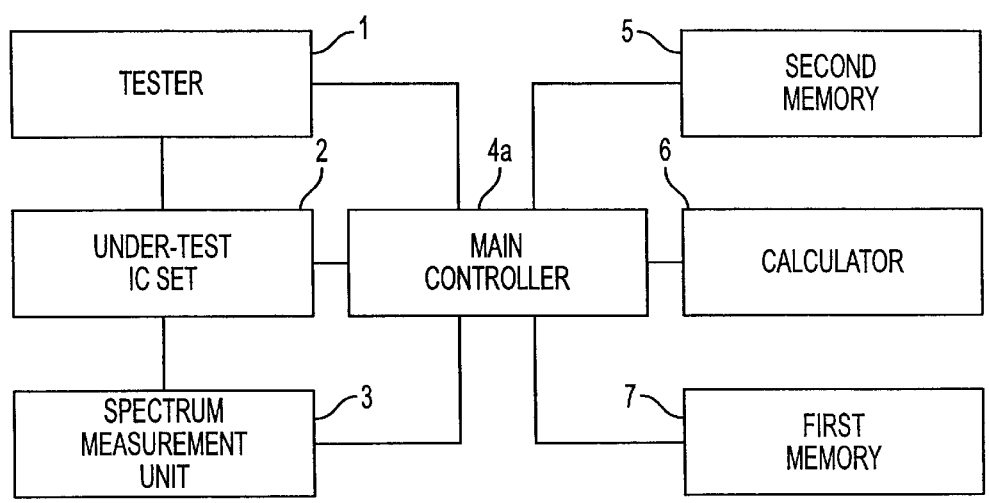
FIG. 5 is a block diagram of the apparatus in accordance with the second embodiment.

FIG. 5 is a block diagram of an apparatus for detecting an integrated circuit having failures among a plurality of integrated circuits, in accordance with the second embodiment. The illustrated apparatus is comprised of a tester 1, an under-test integrated circuit set 2, a spectrum measurement unit 3, a main controller 4a, a first memory 7, a second memory 5, and a calculator 6.

In comparison with the apparatus in accordance with the first embodiment, the apparatus in accordance with the second embodiment is designed to include the main controller 4a in place of the main controller 4. The main controller 4a has different functions from those of the main controller 4.

Figure 6:
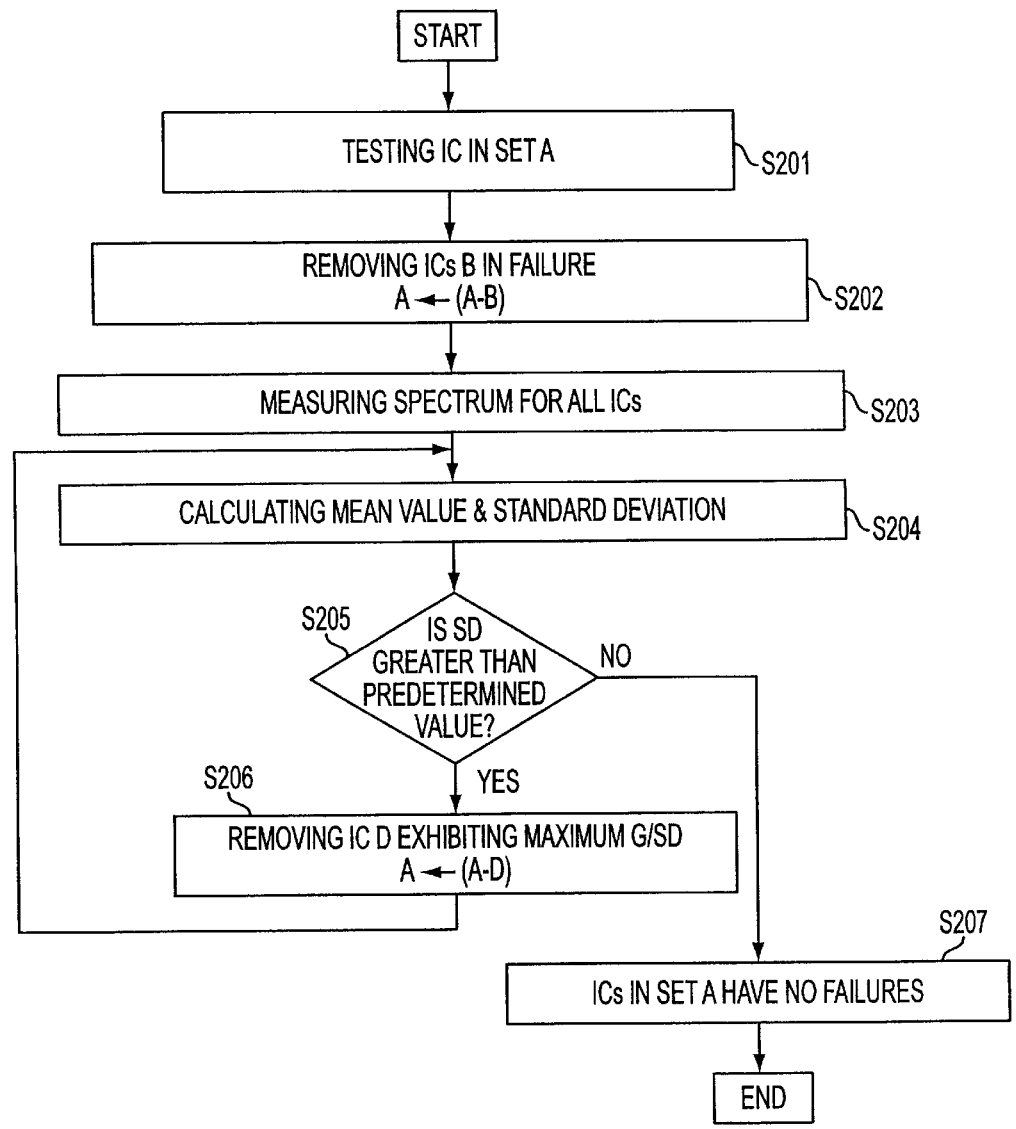
FIG. 6 is a flow-chart showing an operation of the apparatus in accordance with the second embodiment.

FIG. 6 is a flow-chart showing an operation of the apparatus in accordance with the second embodiment. Operation to be carried out in steps S201, S202, S203 and S204 in FIG. 6 are the same as operation to be carried out in steps S101, S102, S103 and S104 in FIG. 2. Hence, explanation about steps S201, S202, S203 and S204 is omitted.

The calculator 6 calculates a mean value and standard deviation for each one of frequencies of the power source current spectrum of integrated circuits in the integrated circuit set A, based on the spectrum of the integrated circuits in the integrated circuit set A, stored in the first memory 7, in step S204.

Then, it is judged whether the standard deviation is greater than a predetermined value stored in the second memory 5, in step S205. This judgement is carried out for each one of frequencies of the power source current spectrum.

If the standard deviation is greater than the predetermined value in a certain frequency (YES in step S205), an integrated circuit having a maximum gap among gaps between spectrum of each one of the integrated circuits and the mean value of the spectrum of all the integrated circuits in the frequency is removed from the integrated circuit set A, in step S206.

Then, steps S204 and S205 are repeated until the standard deviation is equal to or smaller than the predetermined value in each one of the frequencies of the power source current. Thus, when the standard deviation becomes equal to or smaller than the predetermined value in each one of the frequencies of the power source current (NO in step S205), all the integrated circuits in the integrated circuit set A are judged to be in no failure, in step S207.

The above-mentioned operation may be described as a control program and stored in a recording medium such as a floppy disc or ROM equipped with the main controller 4a. By carrying out the control program in the main controller 4a, the above-mentioned operation can be repeated.

Hereinbelow is explained advantages obtained by the above-mentioned second embodiment.

Almost all integrated circuits judged to be in no failure in accordance with a conventional test actually have no failures. If a test signal is applied to integrated circuits judged to be in no failure, a current behaves in the almost same manner in those integrated circuits, and hence, those integrated circuits have almost the same power source current spectrum.

Dispersion in power source current spectrum is caused by fluctuation in processing conditions in fabrication integrated circuits. Since such fluctuation can be predicted in advance, dispersion in power source current spectrum of integrated circuits judged to be in no failure can also be predicted. Dispersion in power source current spectrum can be indicated with standard deviation. Hence, in the second embodiment, degree of dispersion in power source current spectrum of integrated circuits judged to be in no failure is indicated with standard deviation, and is compared to a predetermined value.

Hence, if the integrated circuit set A comprised of integrated circuits having been judged to be in no failure in accordance with a conventional test contains integrated circuits having failures, the standard deviation of the power source current spectrum would be greater than a predetermined value. Thus, if the standard deviation is over a predetermined value, it is considered that an integrated circuit having a maximum gap among gaps between power source current spectrum of each one of integrated circuits and a mean value of power source current spectrum of all integrated circuits has any failures. By removing such an integrated circuit, there is obtained the integrated circuit set A comprised only of integrated circuits In addition, the apparatus in accordance with the second embodiment also has the same advantages as those provided by the apparatus in accordance with the first embodiment.

Hereinbelow is explained an operation of the apparatus in accordance with the second embodiment with reference to a specific example.

Figure 7:
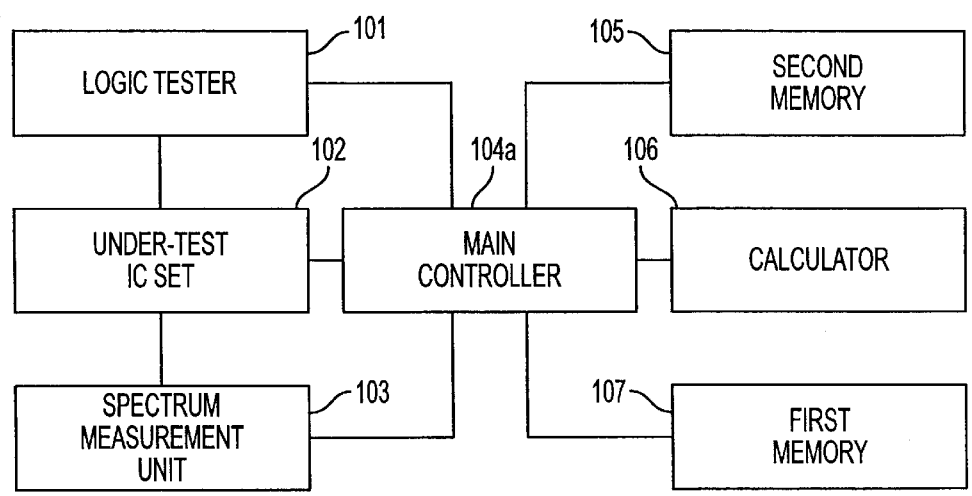
FIG. 7 is a block diagram of the apparatus in accordance with an example of the second embodiment.

FIG. 7 is a block diagram of an apparatus for detecting an integrated circuit having failures among a plurality of integrated circuits, in accordance with the example of the second embodiment.

The illustrated apparatus is comprised of a logic tester 101, an under-test integrated circuit set 102, a spectrum measurement unit 103, a main controller 104a, a first memory 107, a second memory 105, and a calculator 106.

In comparison with the apparatus in accordance with the example of the first embodiment, illustrated in FIG. 3, the apparatus in accordance with the example of the second embodiment is designed to include the main controller 104a in place of the main controller 104. The main controller 104a has different functions from those of the main controller 104.

Figure 8:
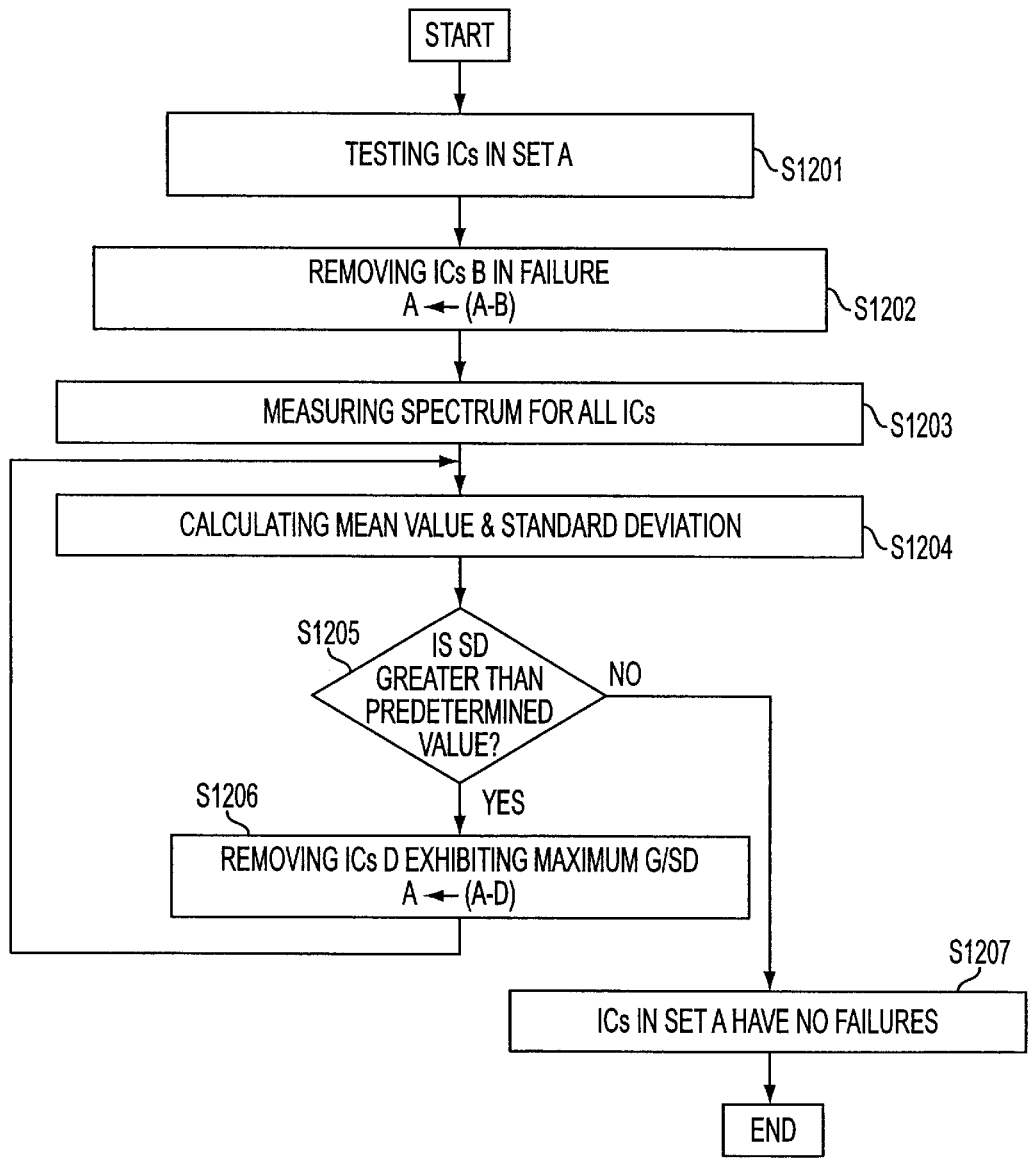
FIG. 8 is a flow-chart showing an operation of the apparatus in accordance with the example of the second embodiment.

FIG. 8 is a flow-chart showing an operation of the apparatus in accordance with the example. Operation to be carried out in steps S1201, S1202, S1203 and S1204 in FIG. 8 are the same as operation to be carried out in steps S1101, S1102, S1103 and S1104 in FIG. 4. Hence, explanation about steps S1201, S1202, S1203 and S1204 is omitted.

The calculator 6 calculates standard deviation for each one of frequencies of the power source current spectrum of integrated circuits in the integrated circuit set A, based on the spectrum of the integrated circuits in the integrated circuit set A, stored in the first memory 107, in step S1204.

Then, it is judged in the main controller 104a whether the standard deviation is greater than a predetermined value stored in the second memory 105, in step S1205. This judgement is carried out for each one of frequencies of the power source current spectrum.

If the standard deviation is greater than the predetermined value in a certain frequency (YES in step S1205), an integrated circuit having a maximum gap among gaps between spectrum of each one of integrated circuits and the mean value of the spectrum of all the integrated circuits in the frequency is removed from the integrated circuit set A, in step S1206.

Then, steps S1204 and S1205 are repeated until the standard deviation is equal to or smaller than the predetermined value in each one of the frequencies of the power source current. Thus, when the standard deviation becomes equal to or smaller than the predetermined value in each one of the frequencies of the power source current (NO in step S1205), all the integrated circuits in the integrated circuit set A are judged to be in no failure, in step S1207.

The above-mentioned operation may be described as a control program and stored in a recording medium such as a floppy disc or ROM equipped with the main controller 104a. By carrying out the control program in the main controller 104a, the above-mentioned operation can be repeated.

[Third Embodiment]

Figure 9:
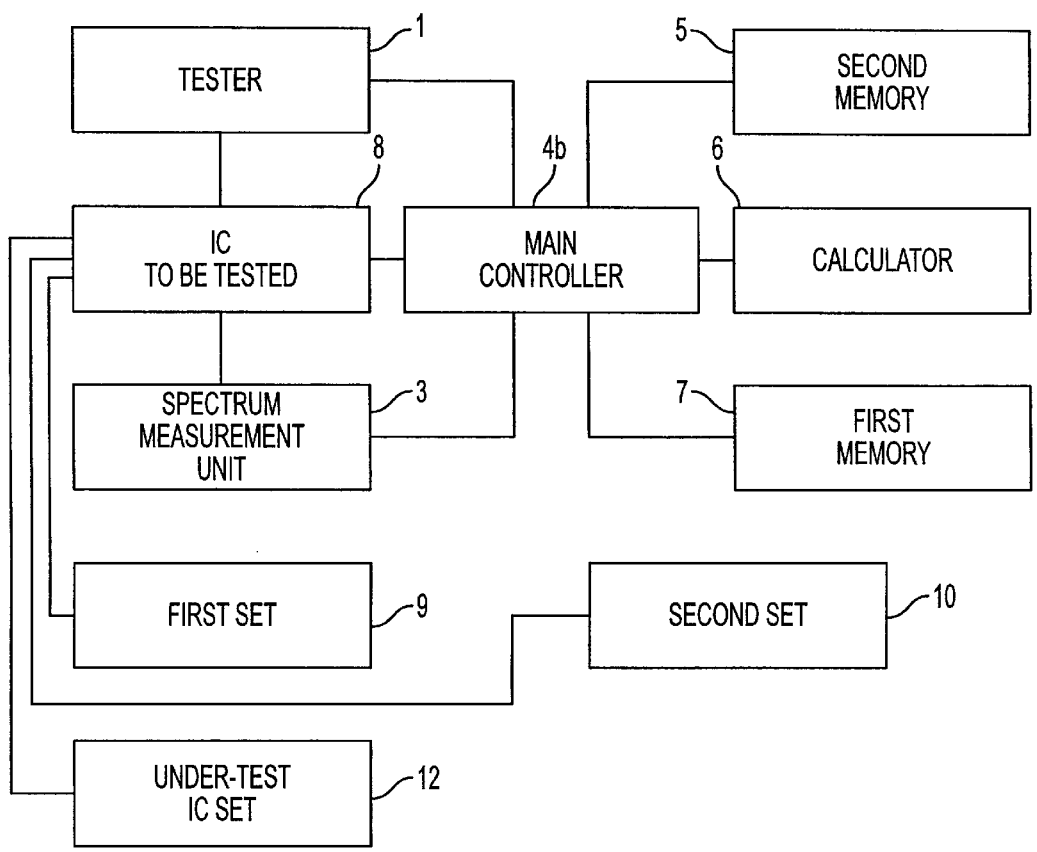
FIG. 9 is a block diagram of the apparatus in accordance with the third embodiment.

FIG. 9 is a block diagram of an apparatus for detecting an integrated circuit having failures among a plurality of integrated circuits, in accordance with the third embodiment. The illustrated apparatus is comprised of a tester 1, an under-test integrated circuit set 12, a spectrum measurement unit 3, a main controller 4b, a first memory 7, a second memory 5, a calculator 6, a first set 9 comprised of integrated circuits having been judged to have no failures, and a second set 10 comprised of integrated circuits judged to have failures.

The under-test integrated circuit set 12 is comprised of a plurality of the same integrated circuits not tested yet. An integrated circuit 8 is selected one by one from the under-test integrated circuit set 12, and is tested by the tester 1. If the integrated circuit 8 is judged to have no failures, the integrated circuit 8 is introduced into the first set 9. In contrast, if the integrated circuit 8 is judged to have failures, the integrated circuit 8 is introduced into the second set 10.

The tester 1 is controlled by the main controller 4b, and tests the integrated circuit 8 in accordance with conventional tests as to whether the integrated circuit 8 is in failure or not.

The test results are transmitted to the first memory 7 through the main controller 4b, and are stored in the first memory 7. The spectrum measurement unit 3 is controlled by the main controller 4b. The spectrum measurement unit 3 applies a test signal to the integrated circuit 8, observes a power source current running through the integrated circuit 8, and analyzes a frequency of the power source current. Power source current spectrum obtained by analysis of a frequency is stored in the first memory 7 through the main controller 4b.

On receipt of an instruction transmitted from the main controller 4b, the calculator 6 judges whether the integrated circuit 8 in failure or not, based on both data about power source current spectrum of the integrated circuit 8, stored in the first memory 7, and data indicative of a predetermined value, stored in the second memory 5.

Figure 10:
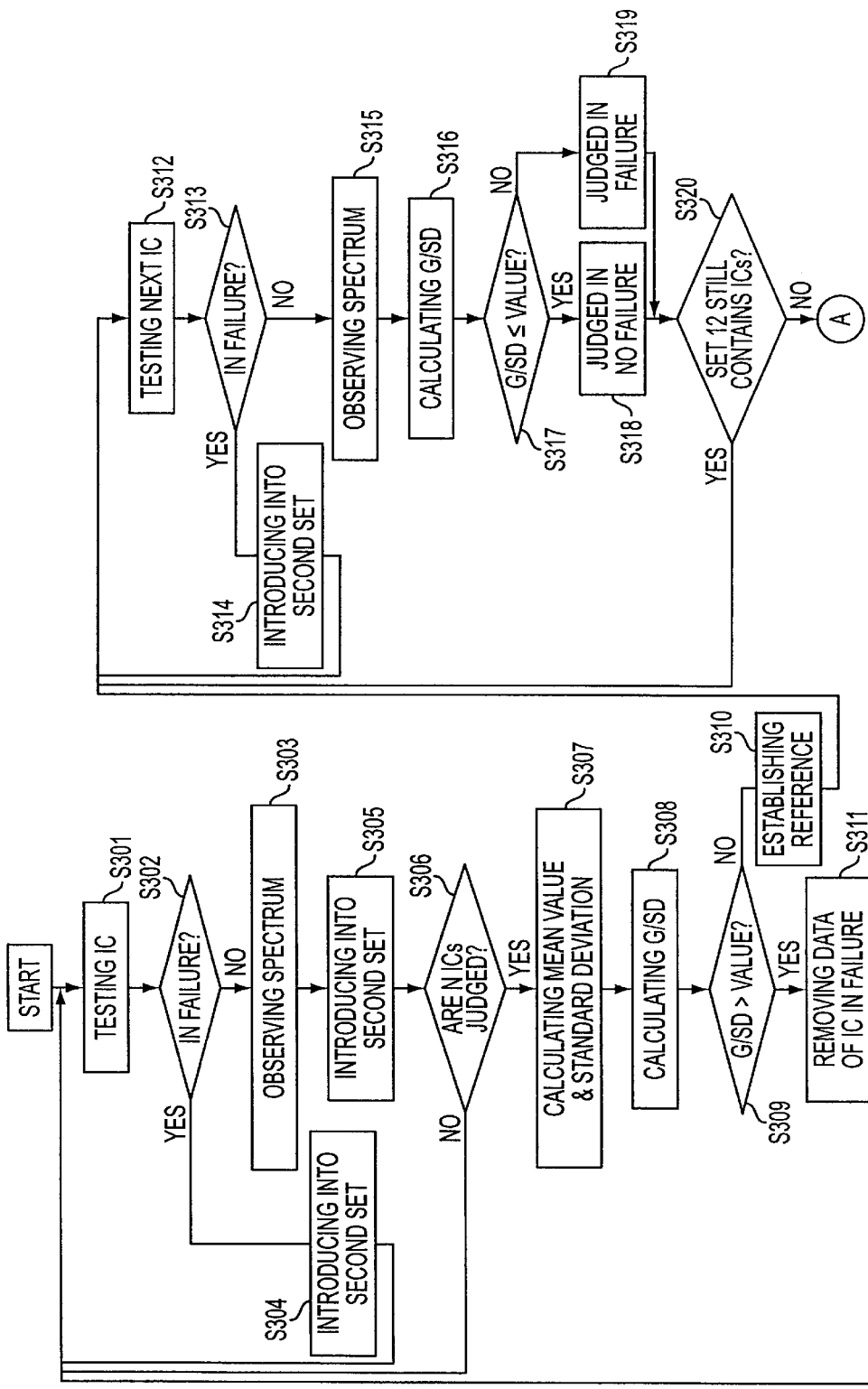
FIGS. 10 and 11 are flow-charts showing an operation of the apparatus in accordance with the third embodiment.
Figure 11:
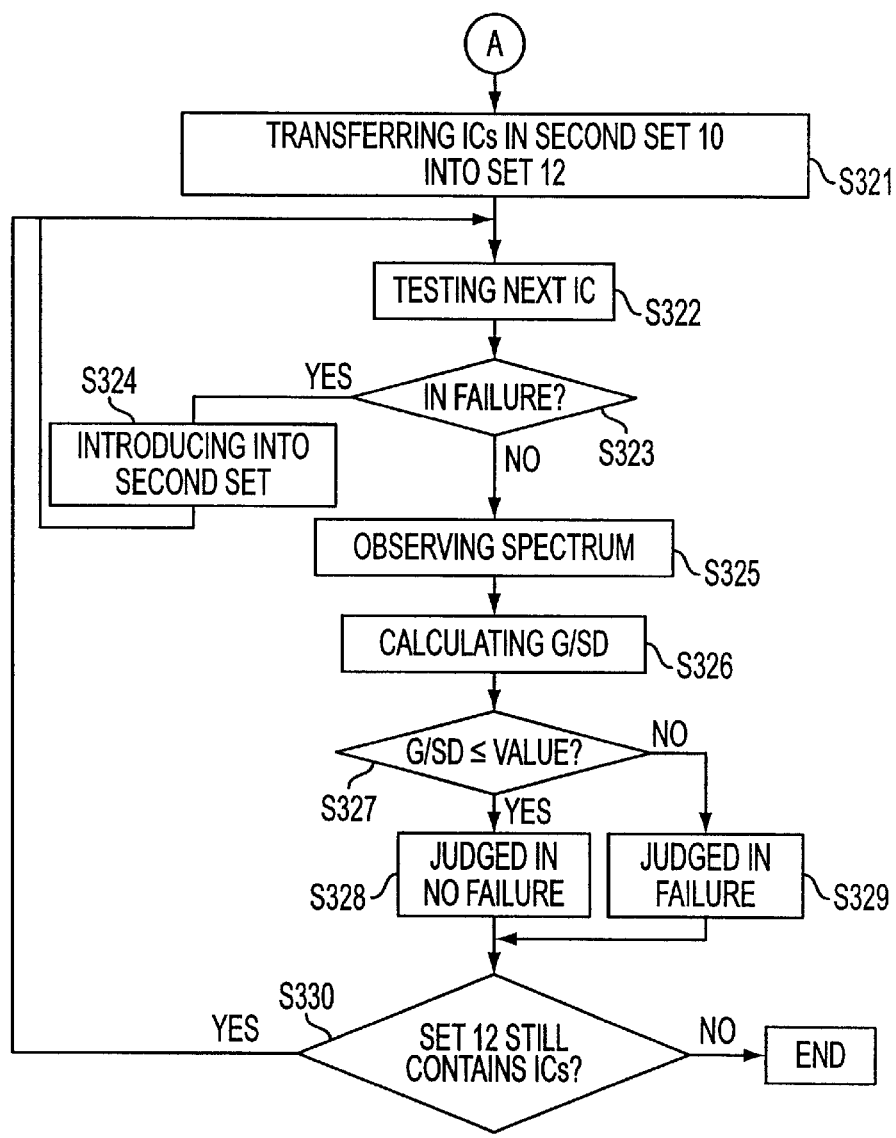

FIGS. 10 and 11 are flow-charts showing an operation of the apparatus in accordance with the third embodiment.

As mentioned earlier, the under-test integrated circuit set 12 is comprised of integrated circuits not yet judged as to whether they are in failure or not. An integrated circuit is selected one by one from the under-test integrated circuit set 12, and the thus selected integrated circuit 8 is tested by the tester 1 in accordance with conventional tests, in step S301.

Then, it is judged in step S302 that the tested integrated circuit 8 is whether in failure or not.

If the tested integrated circuit 8 is judged to be in failure (YES in step S302), the tested integrated circuit 8 is introduced into the second set 10 in step S304. Then, steps S301 and S302 are repeated.

In contrast, if the tested integrated circuit 8 is judged to be in no failure (NO in step S302), the spectrum measurement unit 3 applies a test signal to the integrated circuit 8, observes a power source current running through the integrated circuit, and analyzes a frequency of the observed power source current, in step S303. Spectrum of the power source current obtained as a result of analysis of the frequency of the observed current is transmitted to and stored in the first memory 7.

Then, the integrated circuit 8 is introduced into the second set 10, in step S305.

Then, it is judged in step S306 whether the predetermined number N of the integrated circuits 8 have already been judged to be in no failure, in step S306.

If the number of the integrated circuits 8 having been judged to be in no failure is smaller than N (NO in step S306), steps S301, S302, S303 and S305 are repeated.

In contrast, if the number of the integrated circuits 8 having been judged to be in no failure is equal to N (YES in step S306), a mean value and standard deviation are calculated by the calculator 6 for each one of the frequencies of the power source current, based on the power source current spectrum of all the integrated circuits, stored in the first memory 7, in step S307.

Then, the calculator 6 calculates a value defined as G/SD wherein G indicates a difference between the mean value of spectrum of all the integrated circuits and spectrum of each one of the integrated circuits, and SD indicates the standard deviation, in step S308. This calculation is carried out for each one of the frequencies of the power source current.

Then, it is judged in step S309 whether the value G/SD is greater than a predetermined value stored in the second memory 5.

If the value G/SD is greater than the predetermined value (YES in step S309), the integrated circuit having the value G/SD is judged to be in failure, and data about power source current spectrum of the integrated circuit is removed from the first memory 7, in step S311. Then, steps S301, S302, S305, S306, S307, S309 are repeated.

If the value G/SD is equal to or smaller than the predetermined value (NO in step S309), the mean value and the standard deviation are determined as a reference, and this reference is stored in the first memory 7, in step S310.

Then, a next integrated circuit 8 is selected from the under-test integrated circuit set 12, and is tested by the tester 1 as to whether it is in failure or not in accordance with conventional tests, in step S312.

Then, it is judged in step S313 that the tested integrated circuit 8 is whether in failure or not.

If the tested integrated circuit 8 is judged to be in failure (YES in step S313), the tested integrated circuit 8 is introduced into the second set 10 in step S314. Then, steps S312 and S313 are repeated.

In contrast, if the tested integrated circuit 8 is judged to be in no failure (NO in step S313), the spectrum measurement unit 3 applies a test signal to the integrated circuit 8, observes a power source current running through the integrated circuit, and analyzes a frequency of the observed power source current, to thereby obtain spectrum of the power source current as a result of analysis of the frequency of the observed current, in step S315.

Then, the calculator 6 evaluates the thus obtained spectrum in comparison with the reference stored in the first memory 7, as follows.

First, there is calculated a value defined as G/SD wherein G indicates a difference between a mean value of the reference and the power source current spectrum, and SD indicates standard deviation of the reference, in step S316. Then, it is judged in step S317 whether the value G/SD is equal to or smaller than a predetermined value stored in the second memory 5 in each one of the frequencies of the power source current.

If the value G/SD is equal to or smaller than the predetermined value (YES in step S317), an integrated circuit having the value G/SD is judged to be in no failure, in step S318. Then, the integrated circuit is introduced into the first set 9.

In contrast, if the value G/SD is greater than the predetermined value (NO in step S317), an integrated circuit having the value G/SD is judged to be in failure, in step S319. Then, the integrated circuit is introduced into the second set 10.

Then, it is checked in step S320 whether the under-test integrated circuit set 12 is not empty, that is, the under-test integrated circuit set 12 still contains integrated circuits not yet tested.

If the under-test integrated circuit set 12 still contains integrated circuits not yet tested (YES in step S320), steps S312, S313, S315, S316 and S317 are repeatedly carried out.

If the under-test integrated circuit set 12 is empty, that is, the under-test integrated circuit set 12 does no longer contain integrated circuits not tested (NO in step S320), the integrated circuits in the second set 10 are tested again in step S321. Specifically, the integrated circuits contained in the second set 10 are all transferred into the under-test integrated circuit set 12. As a result, the second set 10 becomes empty.

Then, a next integrated circuit 8 is selected from the under-test integrated circuit set 12, and is tested by the tester 1 as to whether it is in failure or not in accordance with conventional tests, in step S322.

Then, it is judged in step S323 that the tested integrated circuit 8 is whether in failure or not.

If the tested integrated circuit 8 is judged to be in failure (YES in step S323), the tested integrated circuit 8 is introduced into the second set 10 in step S324. Then, steps S322 and S323 are repeated.

In contrast, if the tested integrated circuit 8 is judged to be in no failure (NO in step S323), the spectrum measurement unit 3 applies a test signal to the integrated circuit 8, observes a power source current running through the integrated circuit, and analyzes a frequency of the observed power source current, to thereby obtain spectrum of the power source current as a result of analysis of the frequency of the observed current, in step S325.

Then, the calculator 6 evaluates the thus obtained spectrum in comparison with the reference stored in the first memory 7, as follows.

First, there is calculated a value defined as G/SD wherein G indicates a difference between a mean value of the reference and the power source current spectrum, and SD indicates standard deviation of the reference, in step S326. Then, it is judged in step S327 whether the value G/SD is equal to or smaller than a predetermined value stored in the second memory 5 in each one of the frequencies of the power source current.

If the value G/SD is equal to or smaller than the predetermined value (YES in step S327), an integrated circuit having the value G/SD is judged to be in no failure, in step S328. Then, the integrated circuit is introduced into the first set 9.

In contrast, if the value G/SD is greater than the predetermined value (NO in step S327), an integrated circuit having the value G/SD is judged to be in failure, in step S329. Then, the integrated circuit is introduced into the second set 10.

Then, it is checked in step S330 whether the under-test integrated circuit set 12 is not empty, that is, the under-test integrated circuit set 12 still contains integrated circuits not yet tested.

If the under-test integrated circuit set 12 still contains integrated circuits not yet tested (YES in step S330), steps S322, S323, S325, S326 and S327 are repeatedly carried out.

If the under-test integrated circuit set 12 is empty, that is, the under-test integrated circuit set 12 does no longer contain integrated circuits not tested (NO in step S330), the test is ended.

The above-mentioned operation may be described as a control program and stored in a recording medium such as a floppy disc or ROM equipped with the main controller 4b. By carrying out the control program in the main controller 4b, the above-mentioned operation can be repeated.

Hereinbelow are explained advantages obtained by the above-mentioned third embodiment.

In a conventional method of identifying an integrated circuit in failure among a plurality of integrated circuits, a reference is in advance prepared. Hence, each one of integrated circuits is judged whether it is in failure or not by comparing it to the reference.

However, it is generally difficult for the above-mentioned reasons to prepare an accurate reference. Hence, in accordance with the third embodiment, integrated circuits are all tested once. Then, there is established a reference, based on the result of the test. Then, all integrated circuits are judged whether they are in failure or not by comparing them to the thus established reference.

In the above-mentioned first and second embodiments, each one of integrated circuits to be tested is numbered, and thus, data about power source current spectrum is stored in the first memory 7 in association with each one of the integrated circuits. Hence, all the integrated circuits are judged whether they are in failure or not after data of power source current spectrum of all the integrated circuits has been collected, and integrated circuits in failure can be identified by detecting abnormal spectrum.

However, in accordance with the first and second embodiments, each one of integrated circuits to be tested has to be numbered and correlated with power source current spectrum, which might take extra time to test all the integrated circuits.

Hence, in accordance with the third embodiment, power source current spectrum is observed in a certain number of integrated circuits only for the purpose of establishing a reference. After power source current spectrum has been observed in a number of integrated circuits sufficient to establish a reference, the rest of integrated circuits are judged as to whether they are in failure or not, based on the thus established reference.

However, the integrated circuits used only for establishing a reference are not yet judged as to whether they are in failure or not. Hence, they are preferably judged as to whether they are in failure or not, based on the established reference. To this end, they are provisionally determined to be in failure when a reference is established. Then, after integrated circuits have been all judged as to whether they are in failure or not, integrated circuits having been judged to be in failure are judged again as to whether they are in failure or not. Thus, it is possible to identify all integrated circuits having no failures, and to establish a reference with a small number of steps.

In place of judging integrated circuits used for establishing a reference, to be in failure, they might be provisionally determined to be in semi-failure to distinguish from integrated circuits judged to be in failure. When all integrated circuits are judged again as to whether they are in failure or not after a reference has been established, only those integrated circuits in semi-failure are judged as to whether they are in failure or not. As a result, it is no longer necessary to judge again whether integrated circuits having been once judged to be in failure, are in failure or not.

Hereinbelow is explained an operation of the third embodiment with reference to an example.

Figure 12:
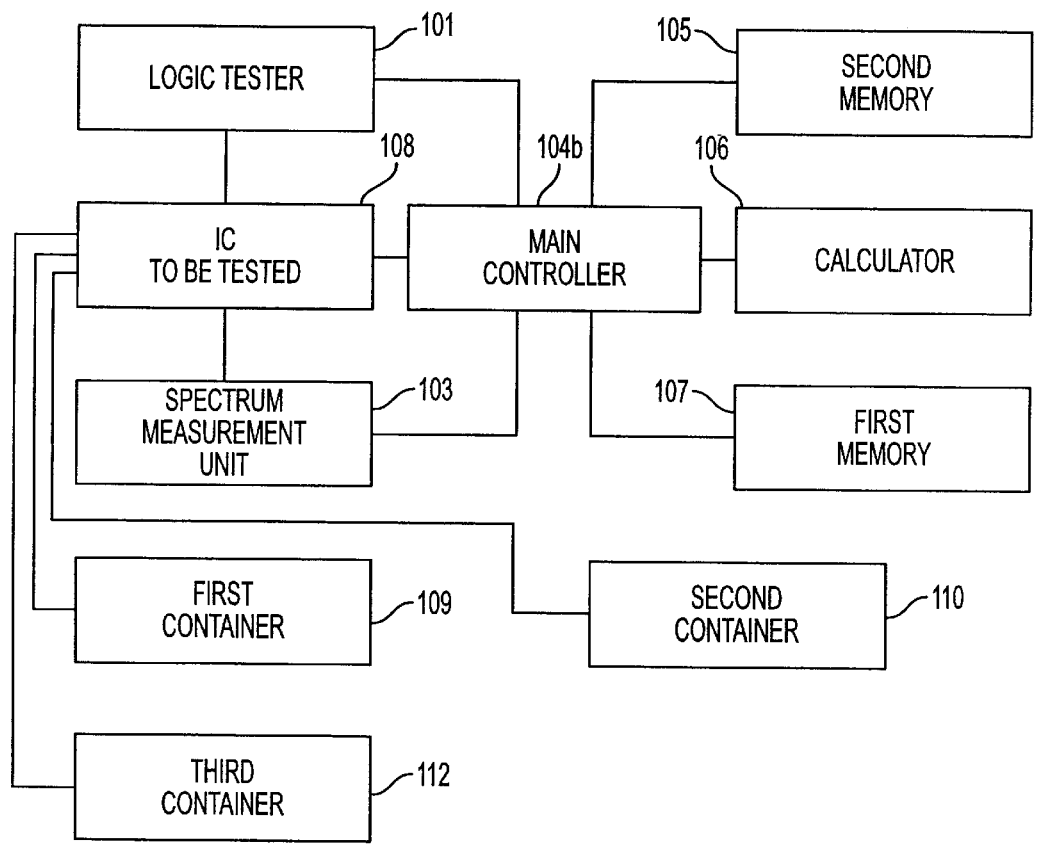
FIG. 12 is a block diagram of the apparatus in accordance with an example of the third embodiment.

FIG. 12 is a block diagram of an apparatus for detecting an integrated circuit having failures among a plurality of integrated circuits, in accordance with an example of the third embodiment. The illustrated apparatus is comprised of a logic tester 101, a spectrum measurement unit 103, a main controller 104b, a first memory 107, a second memory 105, a calculator 106, a first container 109 containing integrated circuits having been judged to have no failures, a second container 110 containing integrated circuits judged to have failures, and a third container 112 containing integrated circuits to be tested.

Figure 13:
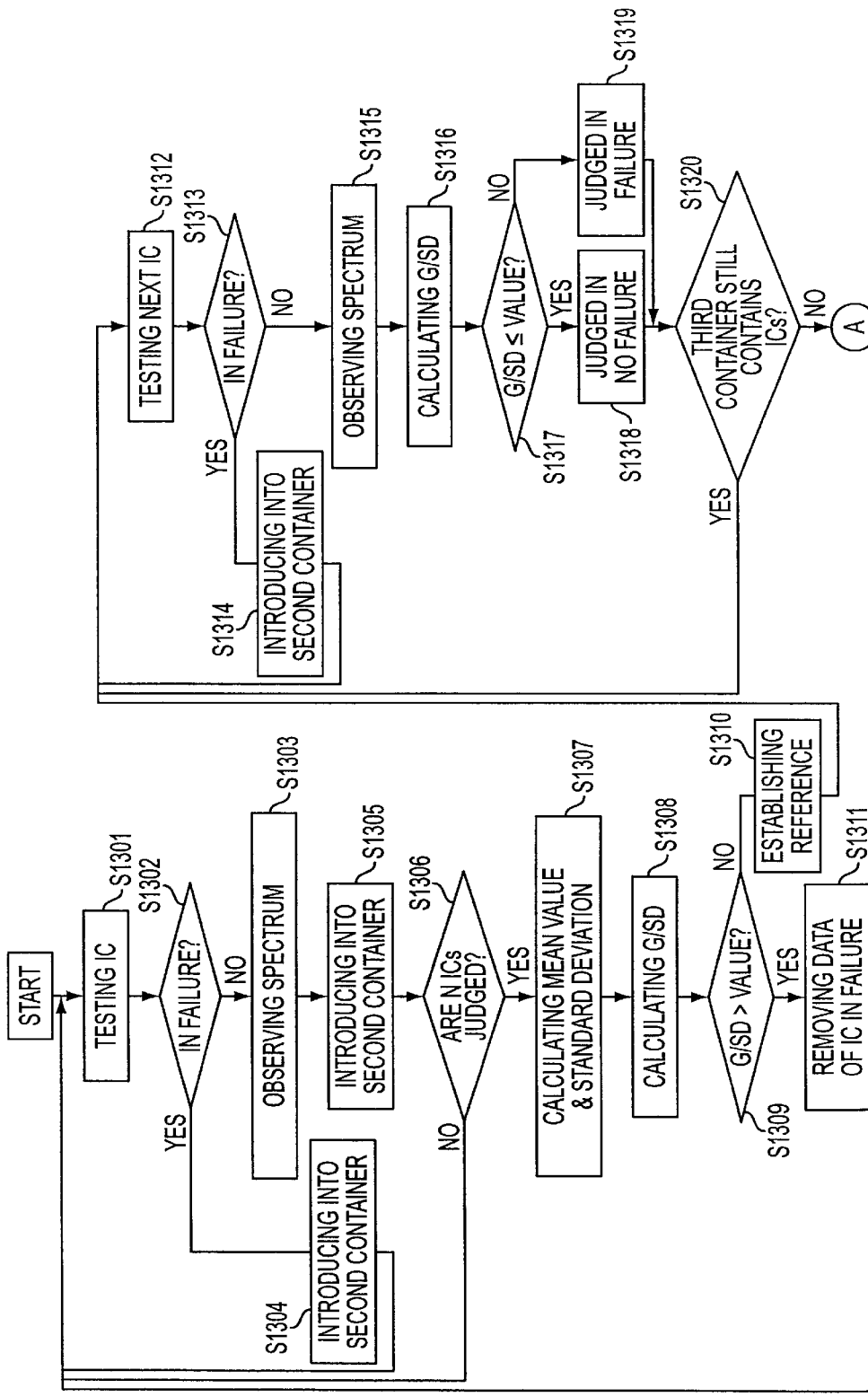
FIGS. 13 and 14 are flow-charts showing an operation of the apparatus in accordance with the example of the third embodiment.
Figure 14:
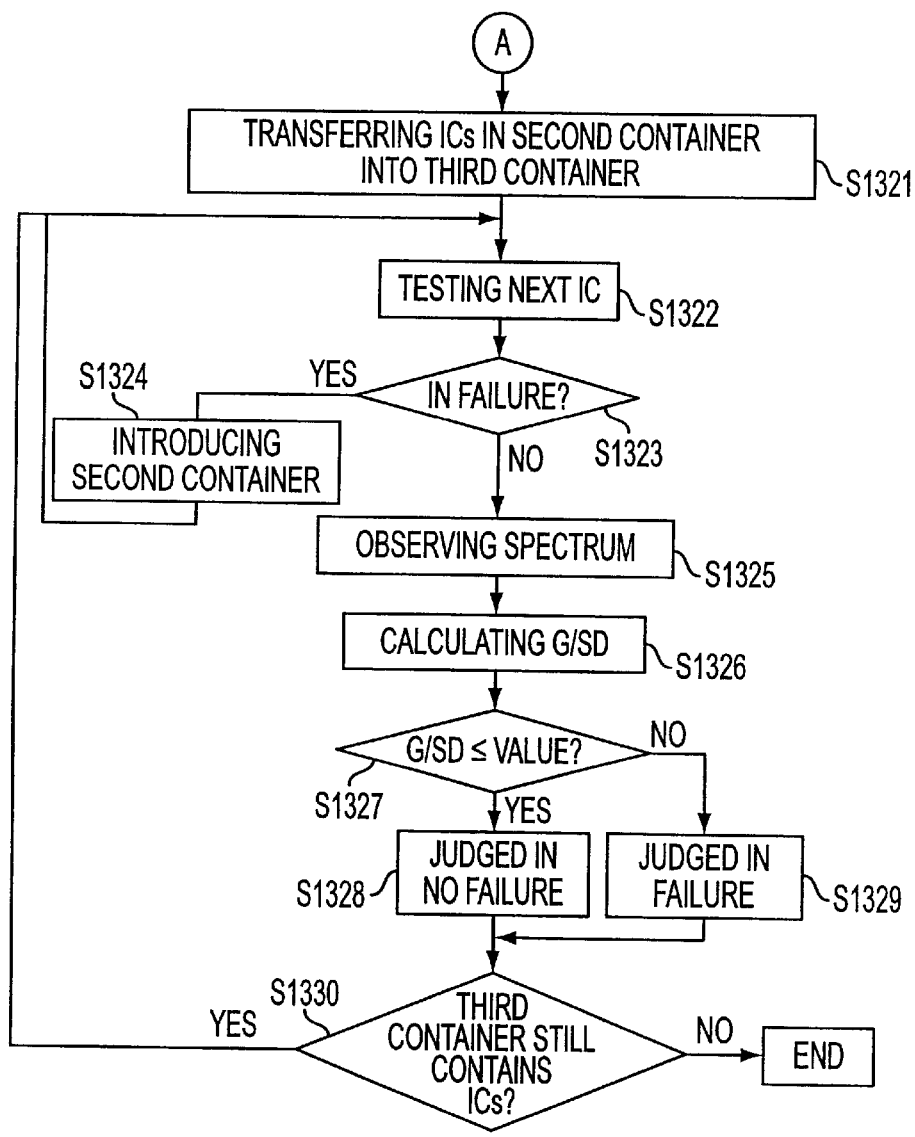

FIGS. 13 and 14 are flow-charts showing an operation of the apparatus in accordance with the example of the third embodiment.

As mentioned earlier, the third container 112 contains all of integrated circuits which are to be judged as to whether they are in failure or not. An integrated circuit is selected one by one from the third container 112, and the thus selected integrated circuit 108 is tested by the tester 101 in accordance with conventional tests such as a function test and DC test, in step S1301.

Then, it is judged in step S1302 that the tested integrated circuit 8 is whether in failure or not.

If the tested integrated circuit 108 is judged to be in failure (YES in step S1302), the tested integrated circuit 108 is introduced into the second container 110 in step S1304. Then, steps S1301 and S1302 are repeated.

In contrast, if the tested integrated circuit 108 is judged to be in no failure (NO in step S1302), the spectrum measurement unit 103 applies a test signal to the integrated circuit 108, observes a power source current running through the integrated circuit, and analyzes a frequency of the observed power source current, in step S1303. Spectrum of the power source current obtained as a result of analysis of the frequency of the observed current is transmitted to and stored in the first memory 107.

Then, the integrated circuit 108 having been judged to be in no failure is introduced into the second container 110, in step S1305.

Then, it is judged in step S1306 whether the predetermined number N of the integrated circuits 108 have already been judged to be in no failure, in step S1306.

If the number of the integrated circuits 108 having been judged to be in no failure is smaller than N (NO in step S1306), steps S1301, S1302, S1303 and S1305 are repeated.

In contrast, if the number of the integrated circuits 8 having been judged to be in no failure is equal to N (YES in step S1306), a mean value and standard deviation are calculated by the calculator 106 for each one of the frequencies of the power source current, based on the power source current spectrum of all the integrated circuits, stored in the first memory 107, in step S1307.

Then, the calculator 106 calculates a value defined as G/SD wherein G indicates a difference between the mean value of spectrum of all the integrated circuits and spectrum of each one of the integrated circuits, and SD indicates the standard deviation, in step S1308. This calculation is carried out for each one of the frequencies of the power source current.

Then, it is judged in step S1309 whether the value G/SD is greater than a predetermined value stored in the second memory 105.

If the value G/SD is greater than the predetermined value (YES in step S1309), the integrated circuit 108 having the value G/SD is judged to be in failure, and data about power source current spectrum of the integrated circuit is removed from the first memory 107, in step S1311. Then, steps S1301, S1302, S1305, S1306, S1307, S1309 are repeated.

If the value G/SD is equal to or smaller than the predetermined value (NO in step S1309), the mean value and the standard deviation are determined as a reference, and this reference is stored in the first memory 107, in step S1310.

Then, a next integrated circuit 108 is selected from the third container 112, and is tested by the logic tester 101 as to whether it is in failure or not in accordance with conventional tests such as a function test and DC test, in step S1312.

Then, it is judged in step S1313 that the tested integrated circuit 108 is whether in failure or not.

If the tested integrated circuit 108 is judged to be in failure (YES in step S1313), the tested integrated circuit 108 is introduced into the second container 110 in step S1314. Then, steps S1312 and S1313 are repeated.

In contrast, if the tested integrated circuit 108 is judged to be in no failure (NO in step S1313), the spectrum measurement unit 103 applies a test signal to the integrated circuit 108, observes a power source current running through the integrated circuit, and analyzes a frequency of the observed power source current, to thereby obtain spectrum of the power source current as a result of analysis of the frequency of the observed current, in step S1315.

Then, the calculator 106 evaluates the thus obtained spectrum in comparison with the reference stored in the first memory 107, as follows.

First, there is calculated a value defined as G/SD wherein G indicates a difference between a mean value of the reference and the power source current spectrum, and SD indicates standard deviation of the reference, in step S1316. Then, it is judged in step S1317 whether the value G/SD is equal to or smaller than a predetermined value stored in the second memory 105 in each one of the frequencies of the power source current.

If the value G/SD is equal to or smaller than the predetermined value (YES in step S1317), an integrated circuit having the value G/SD is judged to be in no failure, in step S1318. Then, the integrated circuit is introduced into the first container 109.

In contrast, if the value G/SD is greater than the predetermined value (NO in step S1317), an integrated circuit having the value G/SD is judged to be in failure, in step S1319. Then, the integrated circuit is introduced into the second container 110.

Then, it is checked in step S1320 whether the third container 112 still contains integrated circuits not yet tested.

If the third container 112 still contains integrated circuits not yet tested (YES in step S1320), steps S1312, S1313, S1315, S1316 and S1317 are repeatedly carried out.

If the third container 112 does no longer contain integrated circuits not tested (NO in step S1320), the integrated circuits in the second container 110 are tested again in step S1321. Specifically, the integrated circuits contained in the second container 110 are all transferred into the third container 112.

Then, a next integrated circuit 108 is selected from the third container 112, and is tested by the logic tester 101 as to whether it is in failure or not in accordance with conventional tests such as a function test and DC test, in step S1322.

Then, it is judged in step S1323 that the tested integrated circuit 108 is whether in failure or not.

If the tested integrated circuit 108 is judged to be in failure (YES in step S1323), the tested integrated circuit 108 is introduced into the second container 110 in step S1324. Then, steps S1322 and S1323 are repeated.

In contrast, if the tested integrated circuit 108 is judged to be in no failure (NO in step S1323), the spectrum measurement unit 103 applies a test signal to the integrated circuit 108, observes a power source current running through the integrated circuit, and analyzes a frequency of the observed power source current, to thereby obtain spectrum of the power source current as a result of analysis of the frequency of the observed current, in step S1325.

Then, the calculator 106 evaluates the thus obtained spectrum in comparison with the reference stored in the first memory 107, as follows.

First, there is calculated a value defined as G/SD wherein G indicates a difference between a mean value of the reference and the power source current spectrum, and SD indicates standard deviation of the reference, in step S1326. Then, it is judged in step S1327 whether the value G/SD is equal to or smaller than a predetermined value stored in the second memory 105 in each one of the frequencies of the power source current.

If the value G/SD is equal to or smaller than the predetermined value (YES in step S1327), the integrated circuit having the value G/SD is judged to be in no failure, in step S1328. Then, the integrated circuit is introduced into the first container 109.

In contrast, if the value G/SD is greater than the predetermined value (NO in step S1327), an integrated circuit having the value G/SD is judged to be in failure, in step S1329. Then, the integrated circuit is introduced into the second container 110.

Then, it is checked in step S1330 whether the third container 112 still contains integrated circuits not yet tested.

If the third container 112 still contains integrated circuits not yet tested (YES in step S1330), steps S1322, S1323, S1325, S1326 and S1327 are repeatedly carried out.

If the third container 112 does no longer contain integrated circuits not tested (NO in step S1330), the test is ended.

The above-mentioned operation may be described as a control program and stored in a recording medium such as a floppy disc or ROM equipped with the main controller 104b. By carrying out the control program in the main controller 104b, the above-mentioned operation can be repeated.

[Fourth Embodiment]

Figure 15:
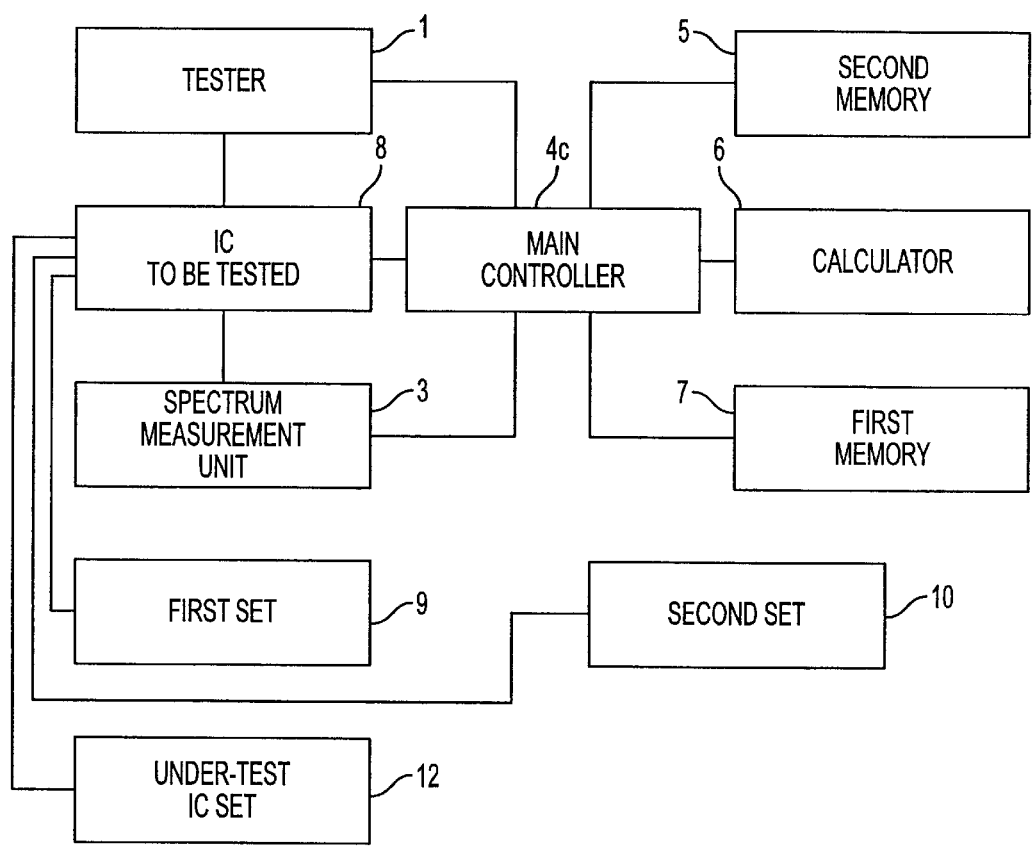
FIG. 15 is a block diagram of the apparatus in accordance with the fourth embodiment.

FIG. 15 is a block diagram of an apparatus for detecting an integrated circuit having failures among a plurality of integrated circuits, in accordance with the fourth embodiment. The illustrated apparatus is comprised of a tester 1, an under-test integrated circuit set 12, a spectrum measurement unit 3, a main controller 4c, a first memory 7, a second memory 5, a calculator 6, a first set 9 comprised of integrated circuits having been judged to have no failures, and a second set 10 comprised of integrated circuits judged to have failures.

In comparison with the apparatus in accordance with the third embodiment, illustrated in FIG. 9, the apparatus in accordance with the fourth embodiment is designed to include the main controller 4c in place of the main controller 4b. The main controller 4c has different functions from those of the main controller 4b.

Figure 16:
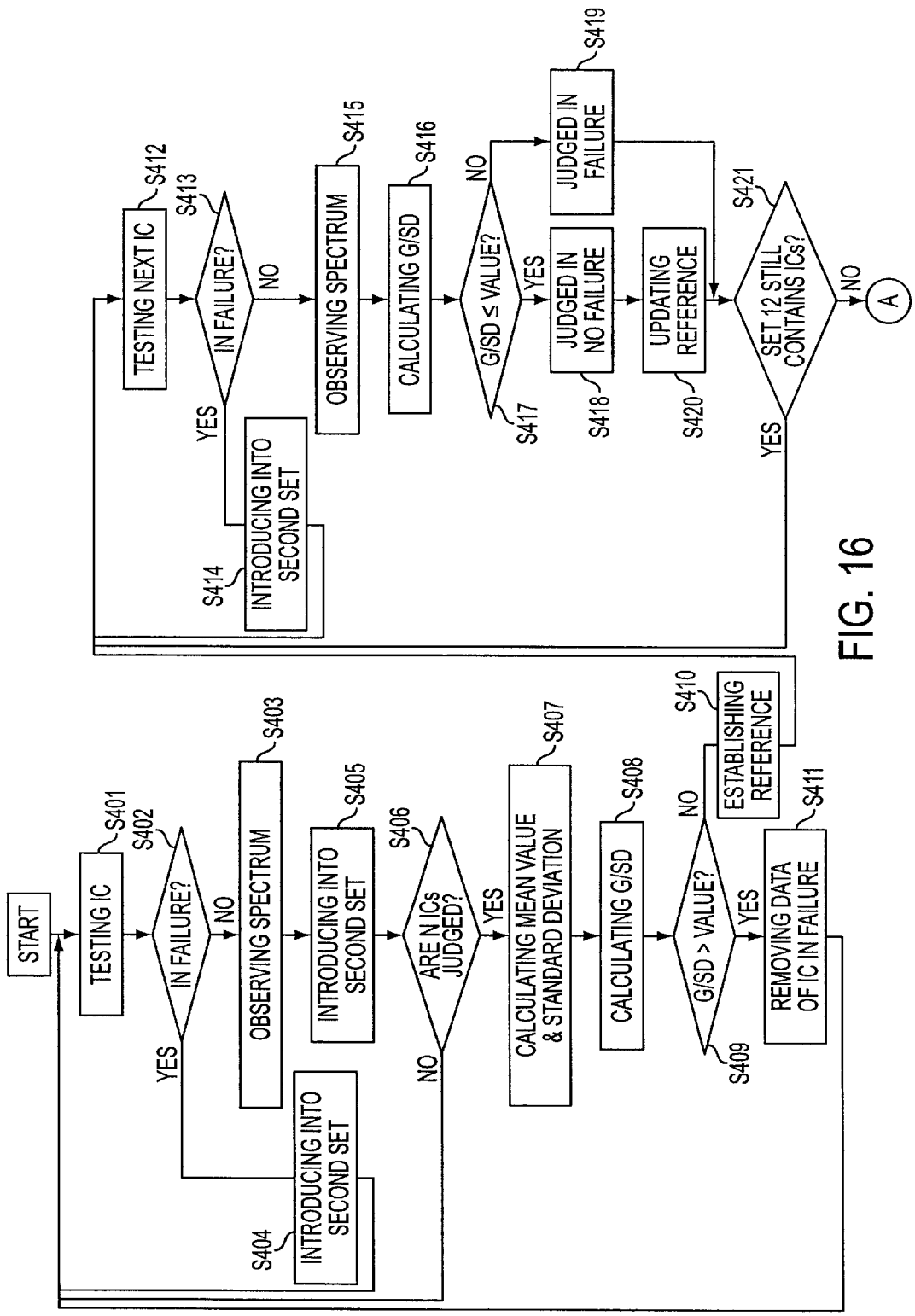
FIGS. 16 and 17 are flow-charts showing an operation of the apparatus in accordance with the fourth embodiment.
Figure 17:
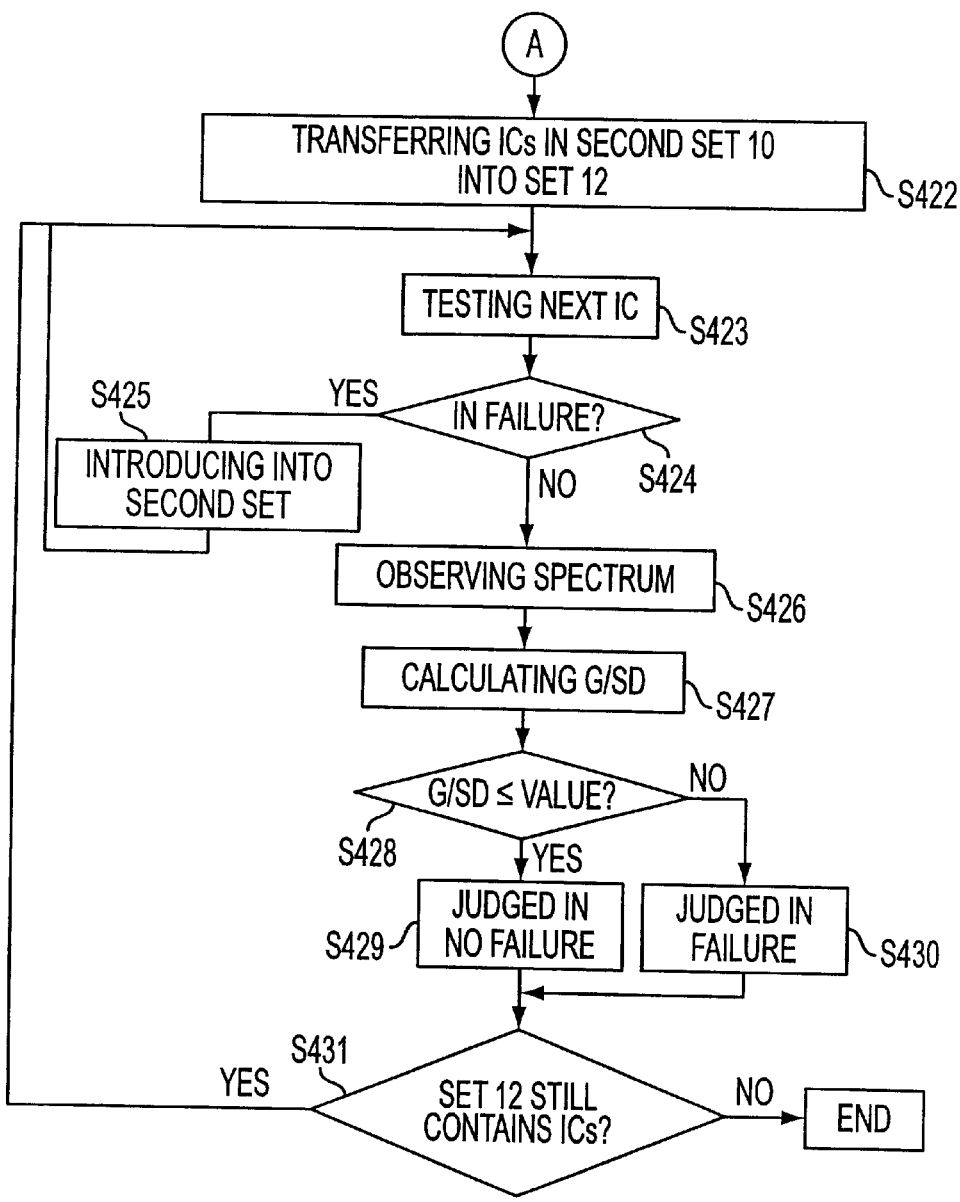

FIGS. 16 and 17 are flow-charts showing an operation of the apparatus in accordance with the fourth embodiment.

An operation of the apparatus in accordance with the fourth embodiment is identical with the operation of the apparatus in accordance with the third embodiment except the following step.

As shown in step S420, when an integrated circuit 8 has been judged to be in no failure in step S418, a reference is updated. Specifically, the power source current spectrum of the integrated circuit 8 having been judged to be in no failure in step S418 is transmitted into and stored in the first memory 7. The first memory 7 already stores data about power source current spectrum of integrated circuits used for establishing a reference. The calculator 6 calculates again a mean value and standard deviation of power source current spectrum of all integrated circuits, based on both data about the spectrum already stored in the first memory 7 and data about the spectrum additionally stored in the first memory 7. The thus calculated mean value and standard deviation are stored in the first memory 7 as an updated reference, in step S420.

The steps other than step S420 are identical with the associated steps in the third embodiment. Specifically, steps S401 to S419 and steps S421 to S431 in the fourth embodiment, illustrated in FIGS. 16 and 17 are identical with steps S301 to S319 and steps S320 to S330 in the third embodiment, illustrated in FIGS. 10 and 11, respectively.

Hereinbelow is explained advantages obtained by the above-mentioned fourth embodiment.

In the third embodiment, the power source current spectrum of N integrated circuits having been judged to be in no failure was used to establish a reference. Though it is preferable that a reference is established based on the power source current spectrum of all of integrated circuits to be tested, it is quite difficult to establish such a reference, because observation of power source current spectrum is successively carried out, and at that time an integrated circuit has to be judged as to whether it is in failure or not.

Hence, in accordance with the fourth embodiment, a reference is successively updated, based on power source current spectrum of the integrated circuits having been judged to be in no failure. Thus, the fourth embodiment can update a reference and finally establish an ideal reference.

Hereinbelow is explained an example of the fourth embodiment.

Figure 18:
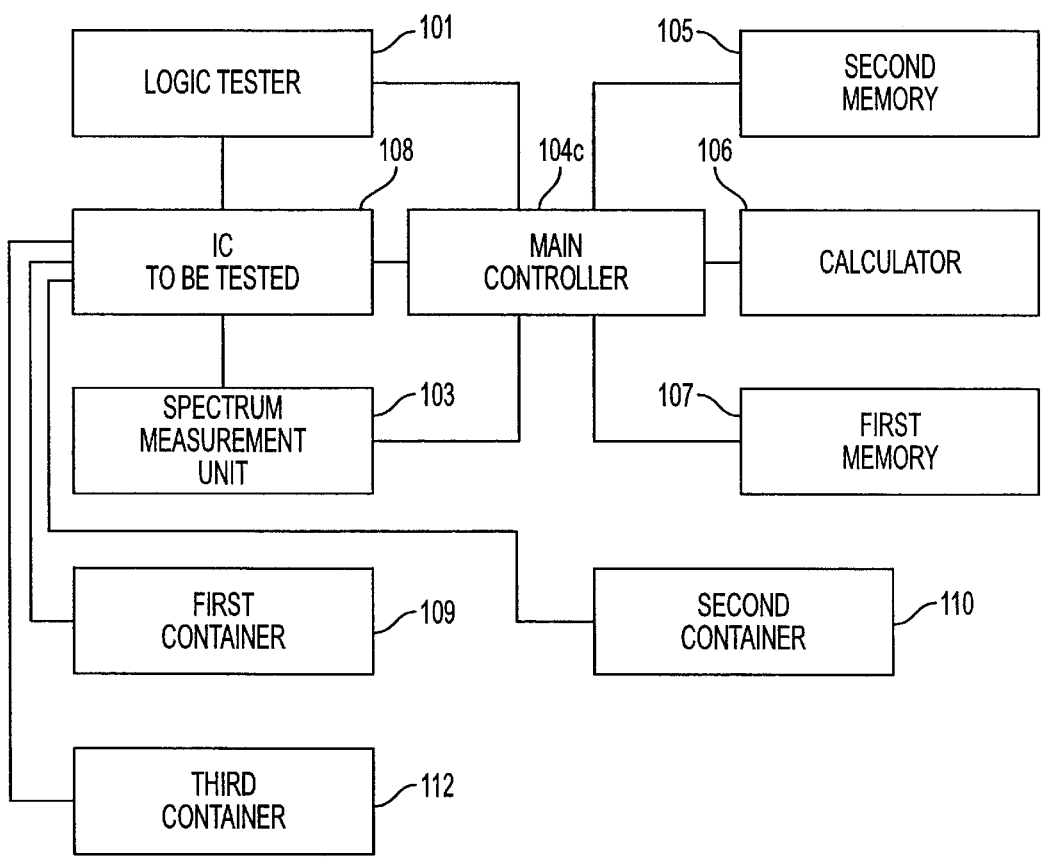
FIG. 18 is a block diagram of the apparatus in accordance with an example of the fourth embodiment.

FIG. 18 is a block diagram of an apparatus for detecting an integrated circuit having failures among a plurality of integrated circuits, in accordance with an example of the fourth embodiment. The illustrated apparatus is comprised of a logic tester 101, a spectrum measurement unit 103, a main controller 104c, a first memory 107, a second memory 105, a calculator 106, a first container 109 containing integrated circuits having been judged to have no failures, a second container 110 containing integrated circuits judged to have failures, and a third container 112 containing integrated circuits to be tested.

In comparison with the apparatus in accordance with the third embodiment, illustrated in FIG. 12, the apparatus in accordance with the example of the fourth embodiment is designed to include the main controller 104c in place of the main controller 104b. The main controller 104c has different functions from those of the main controller 104b.

Figure 19:
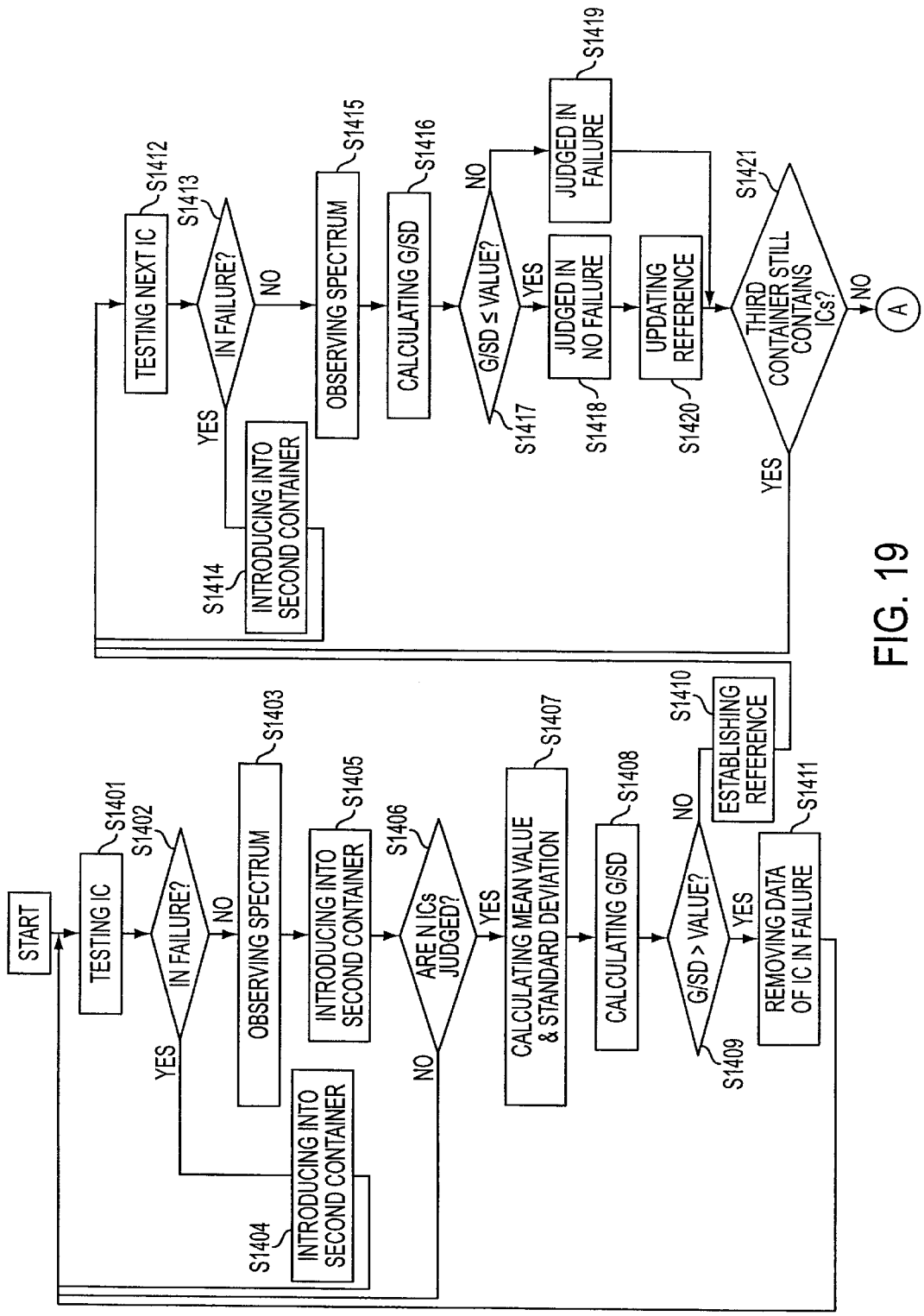
FIGS. 19 and 20 are flow-charts showing an operation of the apparatus in accordance with the example of the fourth embodiment.
Figure 20:
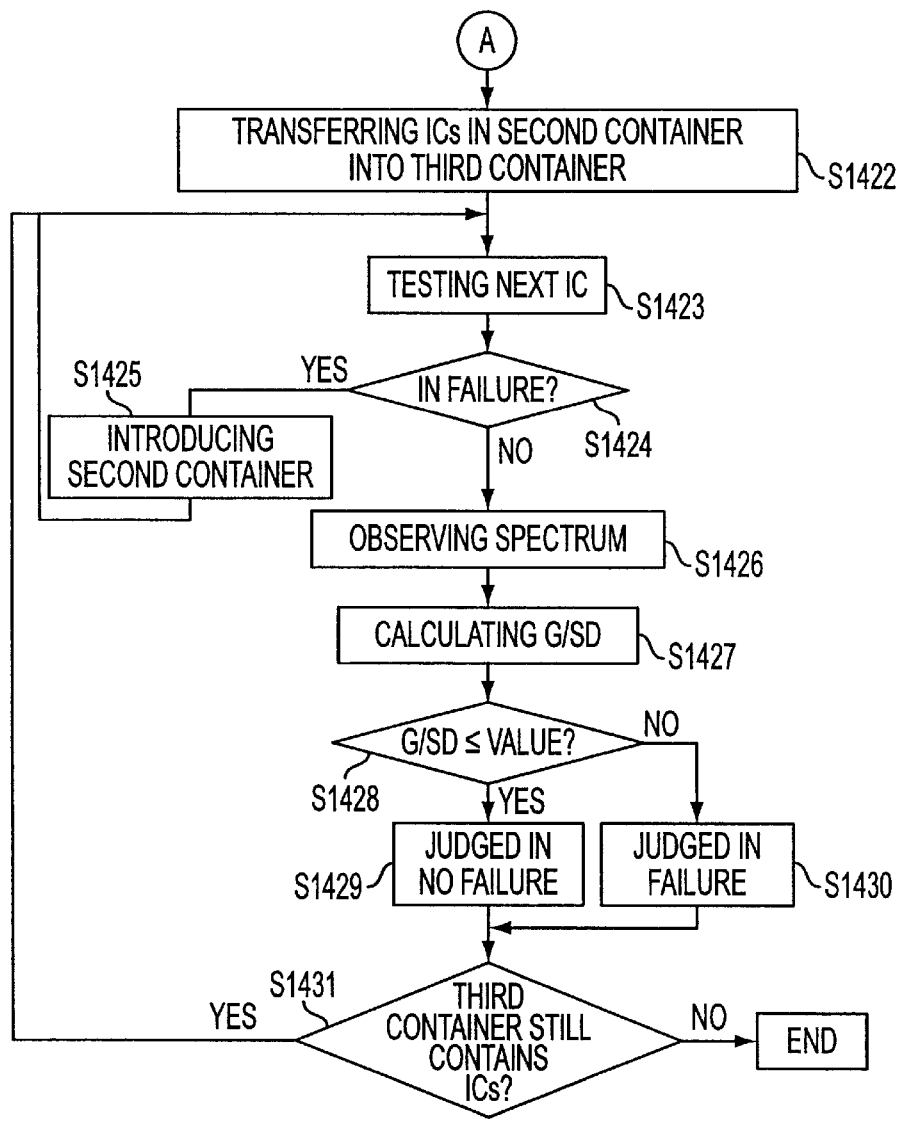

FIGS. 19 and 20 are flow-charts showing an operation of the apparatus in accordance with the example of the fourth embodiment.

As shown in step S1420, when an integrated circuit 108 has been judged to be in no failure in step S1418, a reference is updated. Specifically, the power source current spectrum of the integrated circuit 108 having been judged to be in no failure in step S1418 is transmitted into and stored in the first memory 107. The first memory 107 already stores data about power source current spectrum of integrated circuits used for establishing a reference. The calculator 106 calculates again a mean value and standard deviation of power source current spectrum of all integrated circuits, based on both data about the spectrum already stored in the first memory 107 and data about the spectrum additionally stored in the first memory 107. The thus calculated mean value and standard deviation are stored in the first memory 107 as an updated reference, in step S1420.

The steps other than step S1420 are identical with the associated steps in the third embodiment. Specifically, steps S1401 to S1419 and steps S1421 to S1431 in the example of the fourth embodiment, illustrated in FIGS. 19 and 20 are identical with steps S1301 to S1319 and steps S1320 to S1330 in the third embodiment, illustrated in FIGS. 13 and 14, respectively.

[Fifth Embodiment]

Figure 21:
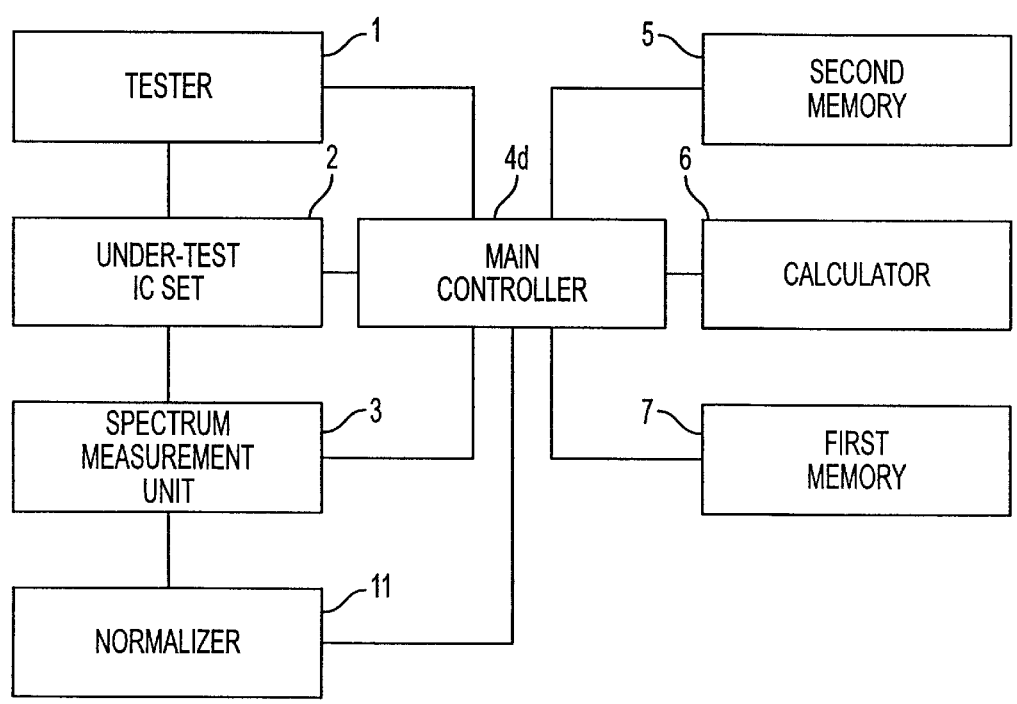
FIG. 21 is a block diagram of the apparatus in accordance with the fifth embodiment.

FIG. 21 is a block diagram of an apparatus for detecting an integrated circuit having failures among a plurality of integrated circuits, in accordance with the fifth embodiment. The illustrated apparatus is comprised of a tester 1, an under-test integrated circuit set 2, a spectrum measurement unit 3, a main controller 4d, a first memory 7, a second memory 5, a calculator 6, and a normalizer 11.

In comparison with the apparatus in accordance with the first embodiment, illustrated in FIG. 1, the apparatus in accordance with the fifth embodiment is designed to include the main controller 4d in place of the main controller 4 and additionally include the normalizer 11. The main controller 4d has different functions from those of the main controller 4. The normalizer 11 is electrically connected to the spectrum measurement unit 3, normalizes power source current spectrum measured by the spectrum measurement unit 3, and transmits the result of normalization to the first memory 7.

Figure 22:
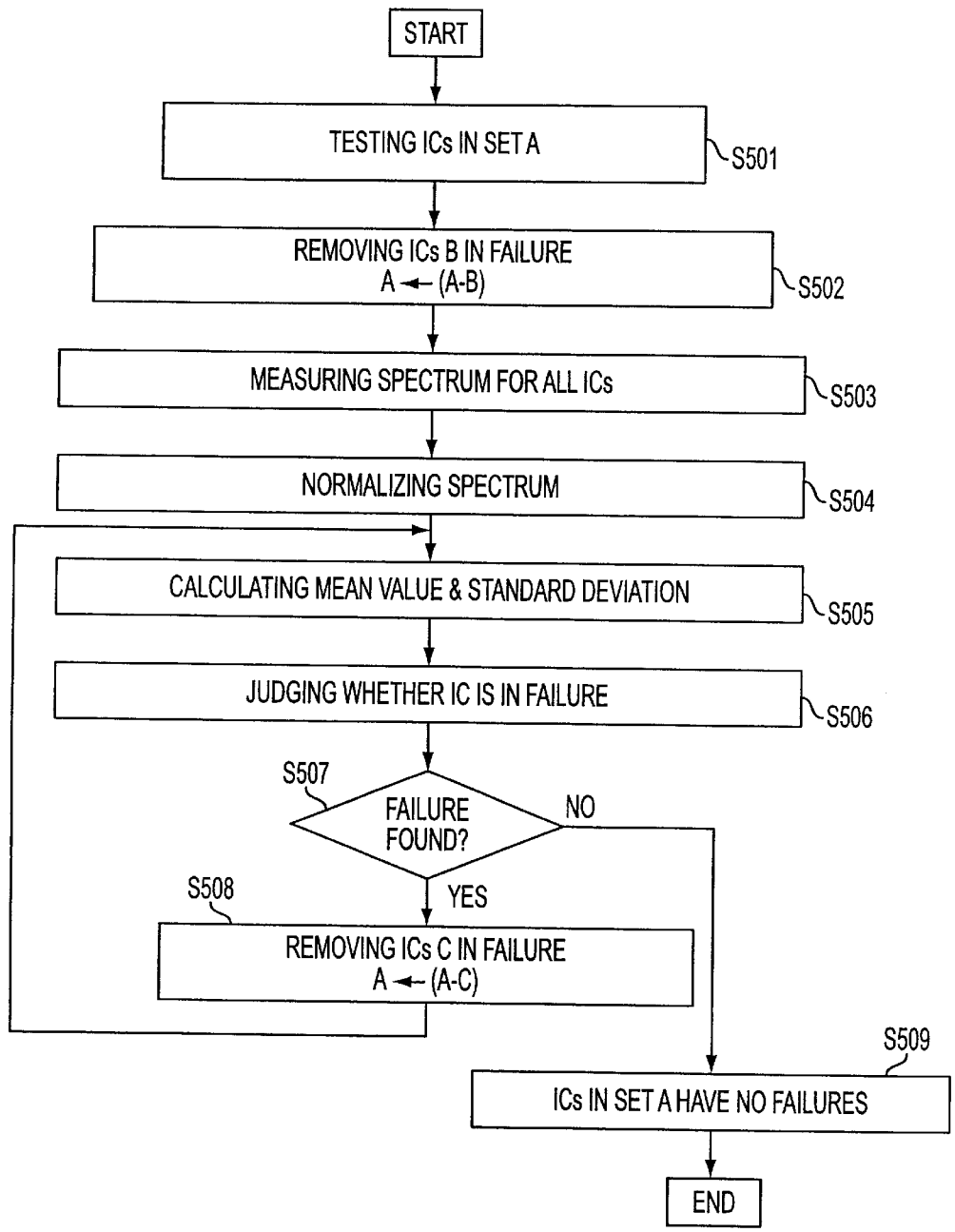
FIG. 22 is a flow-chart showing an operation of the apparatus in accordance with the fifth embodiment.

FIG. 22 is a flow-chart showing an operation of the apparatus in accordance with the fifth embodiment. Herein, the under-test integrated circuit set 2 containing a plurality of the same integrated circuits to be tested is indicated with "A". At this stage, the integrated circuit set A is identical with the under-test integrated circuit set 2.

First, integrated circuits in the integrated circuit set A are tested by the tester 1 as to whether they are in failure or not in accordance with conventional tests, in step S501.

The results of the test are transmitted to and stored in the first memory 7. At the same time, integrated circuits having been judged to be in failure by the tester 1 are removed from the integrated circuit set A, in step S502.

The spectrum measurement unit 3 applies a test signal to each one of integrated circuits in the integrated circuit set A, that is, each one of the integrated circuits having been judged to be in no failure among the under-test integrated circuit set 2 in step S501, observes a power source current running through each one of the integrated circuits, and analyzes a frequency of the observed current, in step S503.

Spectrum of a power source current, obtained as a result of analysis of the frequency, is transmitted to the normalizer 11, and then, is normalized by the normalizer 11, in step S504. For instance, the normalizer 11 calculates a sum of the power source current spectrum for each one of the frequencies of the observed spectrum, and divides the sum by the power source current spectrum for each one of the frequencies. The thus calculated quotient is defined as normalized spectrum.

Then, the calculator 6 calculates a mean value and standard deviation for each one of frequencies of the power source current spectrum of the integrated circuits in the integrated circuit set A, based on the spectrum of the integrated circuits in the integrated circuit set A, stored in the first memory 7, in step S505.

In addition, the calculator 6 calculates G/SD for each one of the integrated circuits for each one of frequencies wherein G indicates a difference between the spectrum of each one of integrated circuits in the integrated circuit set A and the mean value, and SD indicates the standard deviation having been calculated in step S505. If the thus calculated G/SD is greater than the predetermined value stored in the second memory 5, the calculator 6 judges that an integrated circuit having such G/SD is in failure, in step S506.

Then, it is judged in step S507 whether there has been found an integrated circuit in failure in the integrated circuit set A.

If there has been found an integrated circuit having failures (YES in step S507), such an integrated circuit is removed from the integrated circuit set A, in step S508, and steps S505 to S507 are repeated.

If there has not been found an integrated circuit having failures (NO in step S507), all the integrated circuits in the integrated circuit set A are judged to be in no failure, in step S509.

Hereinbelow is explained advantaged obtained by the above-mentioned fifth embodiment.

As mentioned earlier, power source current spectrum is obtained by analyzing a frequency of a power source current running through an integrated circuit when a test signal is applied to the integrated circuit. A power source current is an analog value, and hence, is likely to be much influenced by fluctuation in processing conditions in fabrication of integrated circuits. Since fluctuation in processing conditions is unavoidable, it is also unavoidable for a power source current or power source current spectrum to be influenced by fluctuation in processing conditions.

In the fifth embodiment, since an integrated circuit is judged as to whether it is in failure or not by detecting an abnormal power source current caused by a failure in an integrated circuit, it is necessary to distinguish fluctuation in power source current spectrum caused by a failure in an integrated circuit from fluctuation in power source current spectrum caused by fluctuation in processing conditions.

It is considered that fluctuation in processing conditions merely causes uniform fluctuation in power source current spectrum in each of the frequencies of the spectrum. Thus, by normalizing the power source current spectrum in each one of the frequencies with a sum of the power source current spectrum in all of the frequencies, it would be possible to avoid the power source current spectrum from being influenced by fluctuation in processing conditions, ensuring higher accuracy with which a failure is detected.

Hereinbelow is explained one example of the fifth embodiment.

Figure 23:
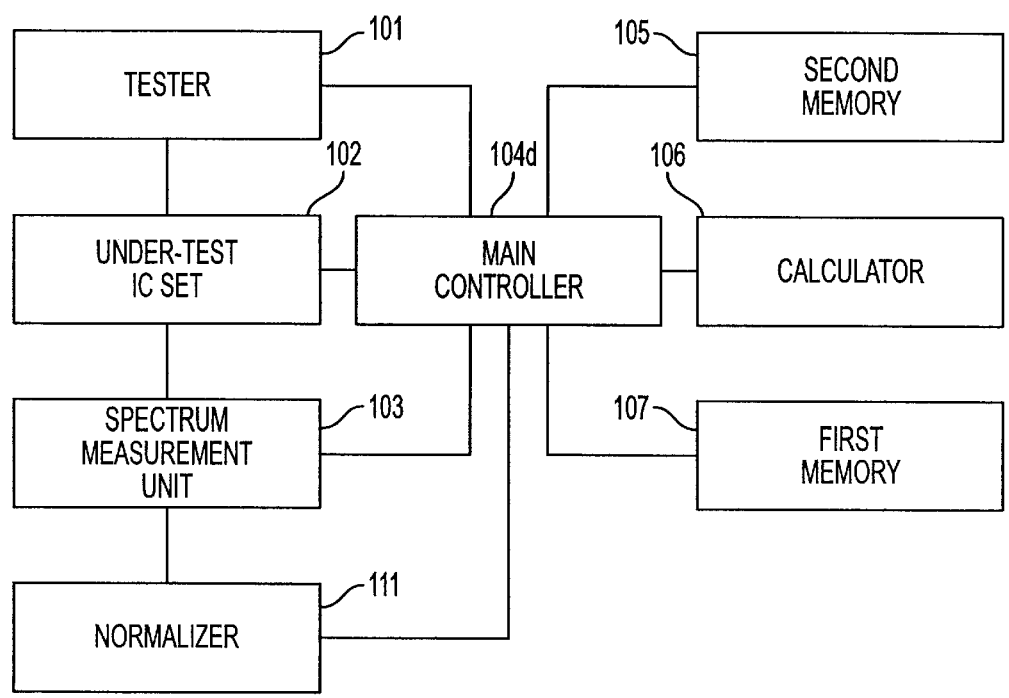
FIG. 23 is a block diagram of the apparatus in accordance with an example of the fifth embodiment.

FIG. 23 is a block diagram of an apparatus for detecting an integrated circuit having failures among a plurality of integrated circuits, in accordance with an example of the fifth embodiment. The illustrated apparatus is comprised of a logic tester 101, an under-test integrated circuit set 102, a spectrum measurement unit 103, a main controller 104d, a first memory 107, a second memory 105, a calculator 106, and a normalizer 111.

In comparison with the apparatus in accordance with the first embodiment, illustrated in FIG. 1, the apparatus in accordance with the example of the fifth embodiment is designed to include the main controller 104d in place of the main controller 4 and additionally include the normalizer 111. The main controller 4d has different functions from those of the main controller 4.

The normalizer 111 is electrically connected to the spectrum measurement unit 103, normalizes power source current spectrum measured by the spectrum measurement unit 103, and transmits the result of normalization to the first memory 107.

Figure 24:
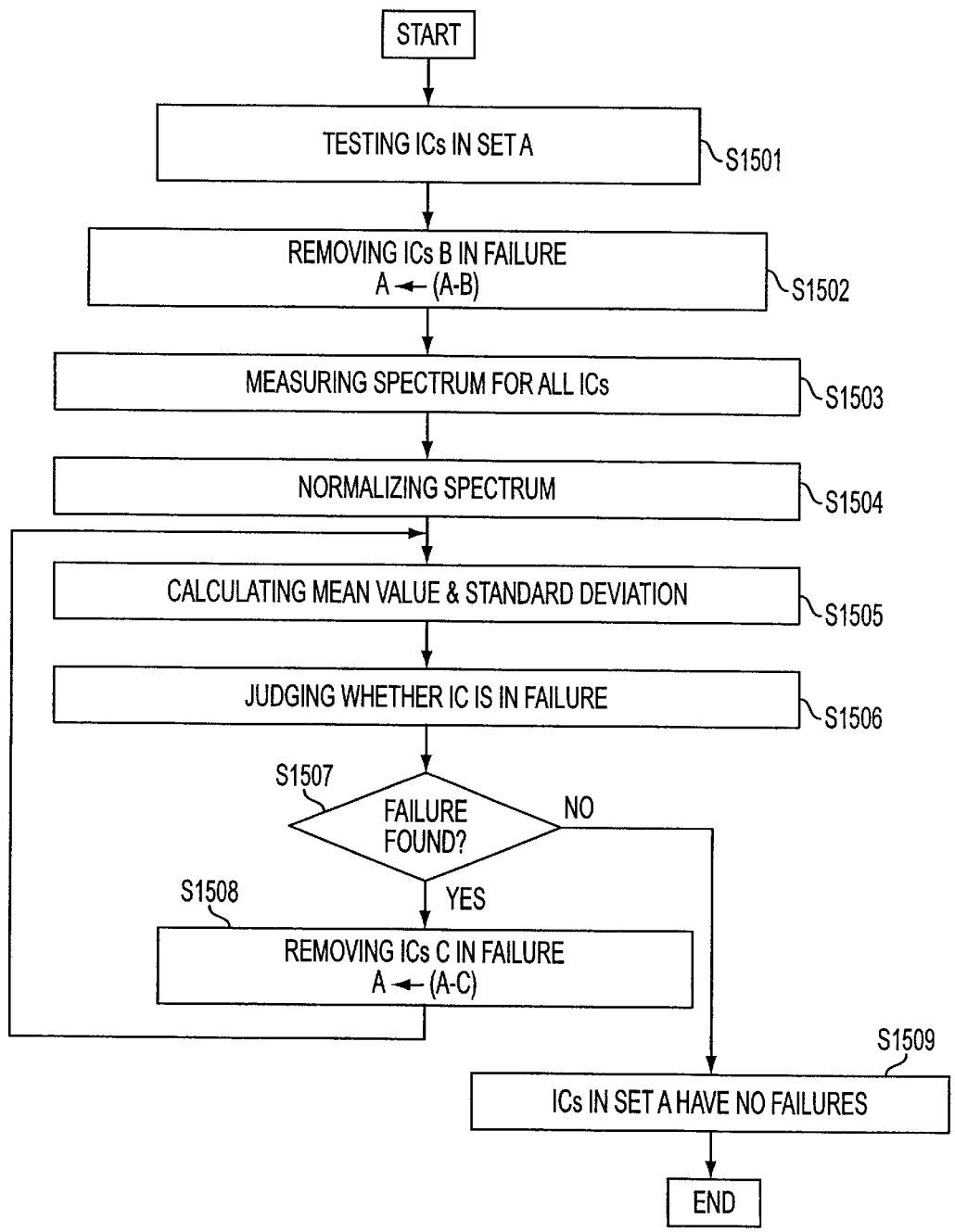
FIG. 24 is a flow-chart showing an operation of the apparatus in accordance with the example of the fifth embodiment.

FIG. 24 is a flow-chart showing an operation of the apparatus in accordance with the example of the fifth embodiment.

As shown in step S1504, power source current spectrum observed by the spectrum measurement unit 103 is normalized by the normalizer 111. The thus normalized spectrum is transmitted to and stored in the first memory 107.

The normalizer 111 normalizes power source current spectrum as follows, for instance.

Herein, it is assumed that power source current spectrum in each of frequencies is indicated as p(1), p(2), p(3), - - -, p(n), wherein p(i) indicates power source current spectrum at a frequency i. It is also assumed that a sum of power source current spectrum in all of the frequencies is indicated as S. That is, S is defined as follows.

$$S=p(1)+p(2)+p(3)+ - - - +p(n)$$

By dividing p(i) by S, there are obtained p(1)/S, p(2)/S, p(3)/S, - - -, p(n)/S, with which the previous spectrum are replaced. Namely, p(1)/S, p(2)/S, p(3)/S, - - -, p(n)/S are used as power source current spectrum hereinafter.

The steps other than step S1504 are identical with the associated steps in the first embodiment. Specifically, steps S1501 to S1503 and steps S1505 to S1509 in the example of the fifth embodiment, illustrated in FIG. 24 are identical with steps S1101 to S1103 and steps S1104 to S1108 in the first embodiment, illustrated in FIG. 4, respectively.

The above-mentioned operation may be described as a control program and stored in a recording medium such as a floppy disc or ROM equipped with the main controller 104d. By carrying out the control program in the main controller 104d, the above-mentioned operation can be repeated.

[Sixth Embodiment]

Figure 25:
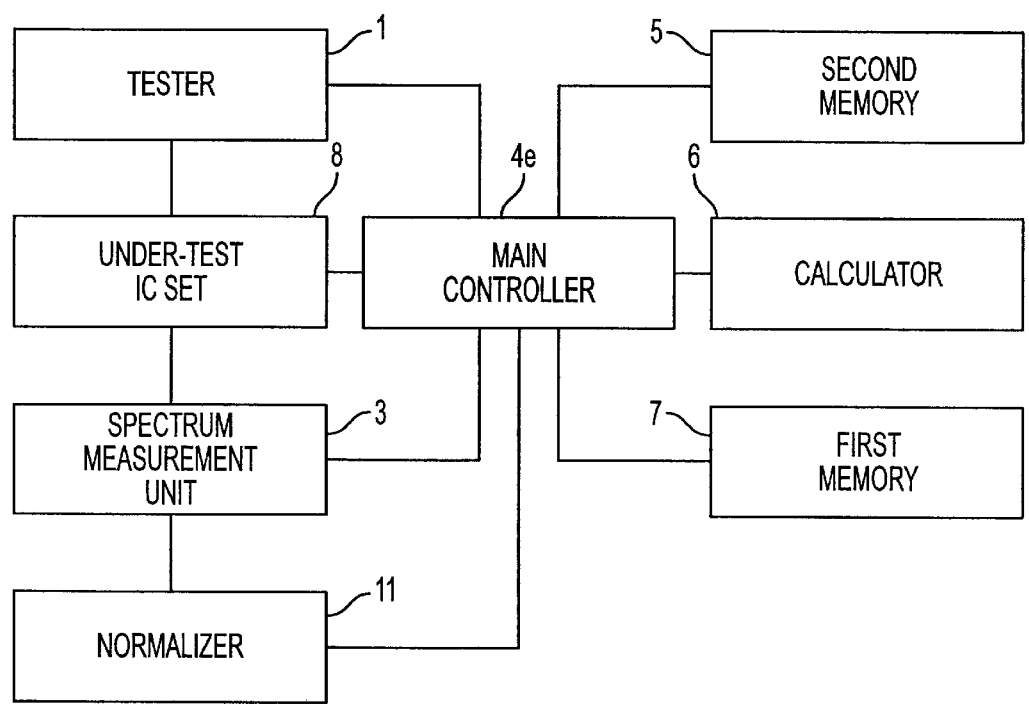
FIG. 25 is a block diagram of the apparatus in accordance with the sixth embodiment.

FIG. 25 is a block diagram of an apparatus for detecting an integrated circuit having failures among a plurality of integrated circuits, in accordance with the sixth embodiment. The illustrated apparatus is comprised of a tester 1, an under-test integrated circuit set 2, a spectrum measurement unit 3, a main controller 4e, a first memory 7, a second memory 5, a calculator 6, and a normalizer 11.

In comparison with the apparatus in accordance with the second embodiment, illustrated in FIG. 5, the apparatus in accordance with the sixth embodiment is designed to include the main controller 4e in place of the main controller 4a and additionally include the normalizer 11. The main controller 4e has different functions from those of the main controller 4a. The normalizer 11 is electrically connected to the spectrum measurement unit 3, normalizes power source current spectrum measured by the spectrum measurement unit 3, and transmits the result of normalization to the first memory 7.

Figure 26:
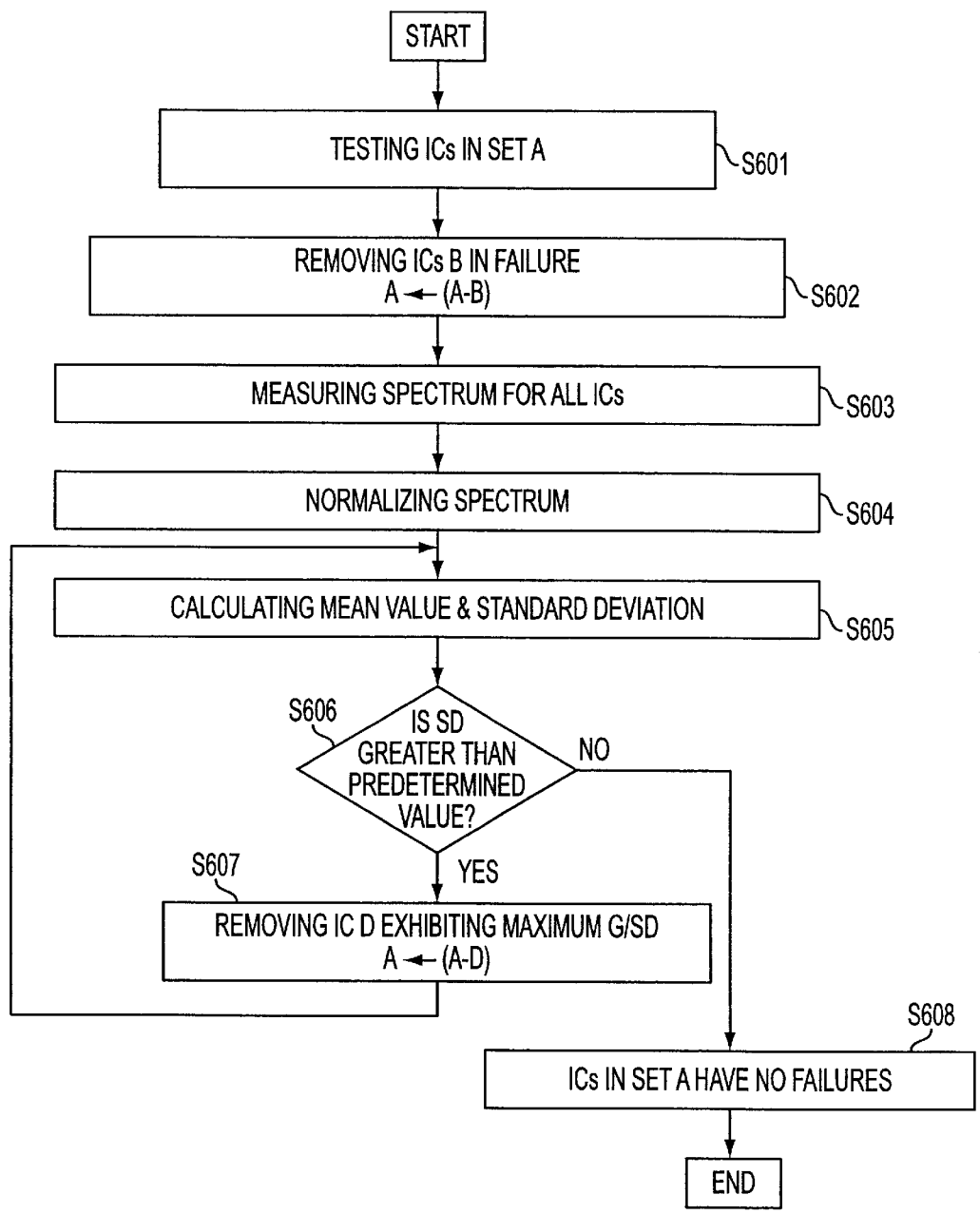
FIG. 26 is a flow-chart showing an operation of the apparatus in accordance with the sixth embodiment.

FIG. 26 is a flow-chart showing an operation of the apparatus in accordance with the sixth embodiment.

An operation to be carried out in step S604 in FIG. 26 is identical with an operation to be carried out in step S504 in FIG. 22. An operation of the apparatus in accordance with the sixth embodiment, to be carried out in other steps is identical with an operation of the apparatus in accordance with the second embodiment. Specifically, an operation to be carried out in steps S601, S602, S603, S605, S606, S607 and S608 in FIG. 26 is identical with an operation to be carried out in steps S201, S202, S203, S204, S205, S206 and S207 in FIG. 6.

The above-mentioned operation of the apparatus in accordance with the sixth embodiment is controlled by the main controller 4e. The above-mentioned operation may be described as a control program and stored in a recording medium such as a floppy disc or ROM equipped with the main controller 4e. By carrying out the control program in the main controller 4e, the above-mentioned operation can be repeated.

The sixth embodiment provides the same advantages as those obtained by the fifth embodiment.

Hereinbelow is explained an example of the sixth embodiment.

Figure 27:
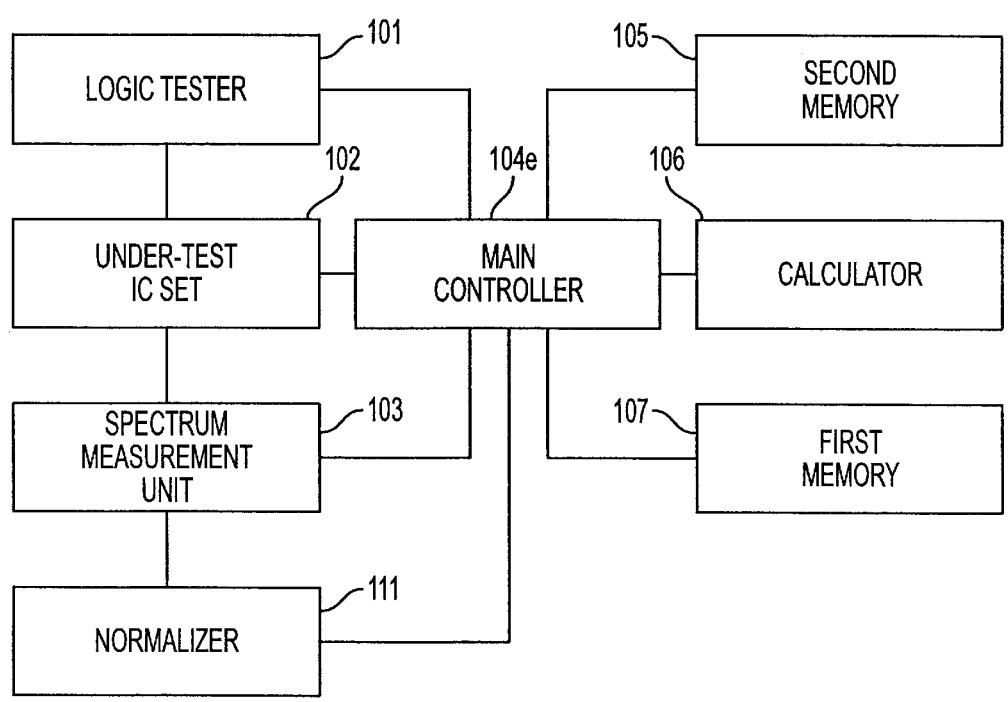
FIG. 27 is a block diagram of the apparatus in accordance with an example of the sixth embodiment.

FIG. 27 is a block diagram of an apparatus for detecting an integrated circuit having failures among a plurality of integrated circuits, in accordance with the example of the sixth embodiment. The illustrated apparatus is comprised of a logic tester 101, an under-test integrated circuit set 102, a spectrum measurement unit 103, a main controller 104e, a first memory 107, a second memory 105, a calculator 106, and a normalizer 111.

In comparison with the apparatus in accordance with the second embodiment, illustrated in FIG. 5, the apparatus illustrated in FIG. 27 is designed to include the main controller 104e in place of the main controller 4a and additionally include the normalizer 111. The main controller 104e has different functions from those of the main controller 4a. The normalizer 111 is electrically connected to the spectrum measurement unit 103, normalizes power source current spectrum measured by the spectrum measurement unit 103, and transmits the result of normalization to the first memory 107.

Figure 28:
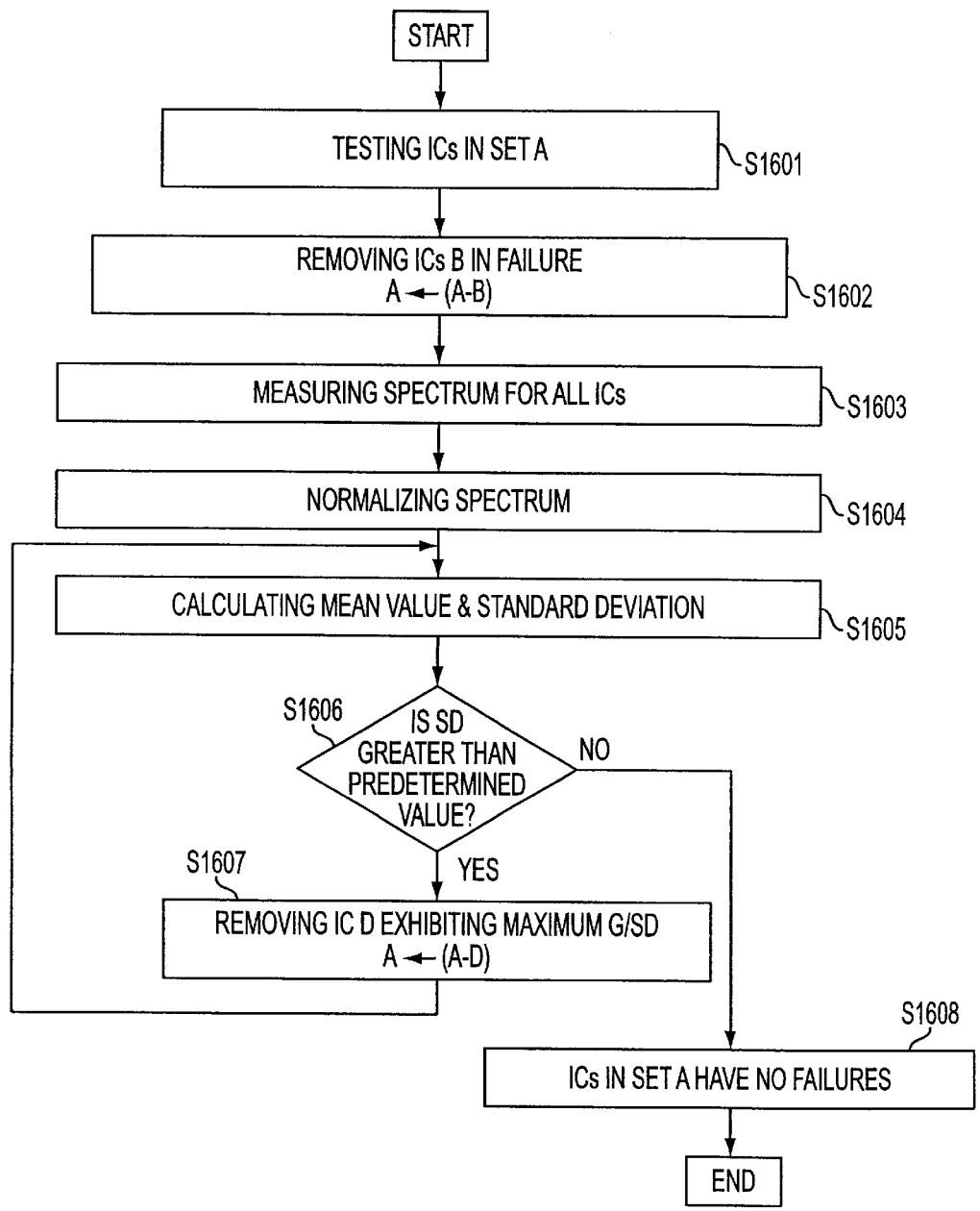
FIG. 28 is a flow-chart showing an operation of the apparatus in accordance with the example of the sixth embodiment.

FIG. 28 is a flow-chart showing an operation of the apparatus in accordance with the example of the sixth embodiment.

An operation to be carried out in step S1604 in FIG. 28 is identical with an operation to be carried out in step S1504 in FIG. 24. An operation of the apparatus in accordance with the example of the sixth embodiment, to be carried out in other steps is identical with an operation of the apparatus in accordance with the second embodiment. Specifically, an operation to be carried out in steps S1601, S1602, S1603, S1605, S1606, S1607 and S1608 in FIG. 28 is identical with an operation to be carried out in steps S1201, S1202, S1203, S1204, S1205, S1206 and S1207 in FIG. 8.

The above-mentioned operation of the apparatus in accordance with the example of the sixth embodiment is controlled by the main controller 104e. The above-mentioned operation may be described as a control program and stored in a recording medium such as a floppy disc or ROM equipped with the main controller 104e. By carrying out the control program in the main controller 104e, the above-mentioned operation can be repeated.

[Seventh Embodiment]

Figure 29:
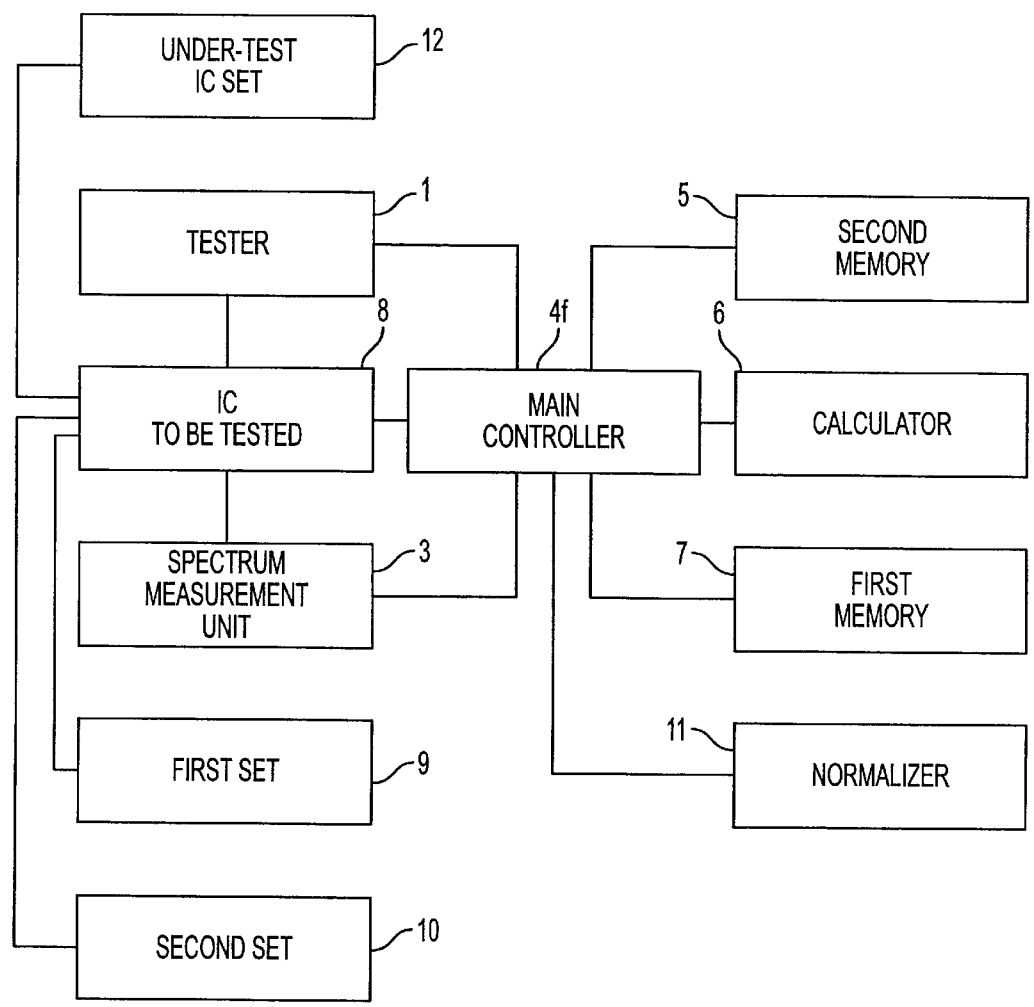
FIG. 29 is a block diagram of the apparatus in accordance with the seventh embodiment.

FIG. 29 is a block diagram of an apparatus for detecting an integrated circuit having failures among a plurality of integrated circuits, in accordance with the seventh embodiment. The illustrated apparatus is comprised of a tester 1, an under-test integrated circuit set 12, a spectrum measurement unit 3, a main controller 4f, a first memory 7, a second memory 5, a calculator 6, a normalizer 11, a first set 9 comprised of integrated circuits having been judged to have no failures, and a second set 10 comprised of integrated circuits judged to have failures.

In comparison with the apparatus in accordance with the third embodiment, illustrated in FIG. 9, the apparatus in accordance with the seventh embodiment is designed to include the main controller 4f in place of the main controller 4b and additionally include the normalizer 11. The main controller 4f has different functions from those of the main controller 4b. The normalizer 11 is electrically connected to the spectrum measurement unit 3, normalizes power source current spectrum measured by the spectrum measurement unit 3, and transmits the result of normalization to the first memory 7 through the main controller 4f.

Figure 30:
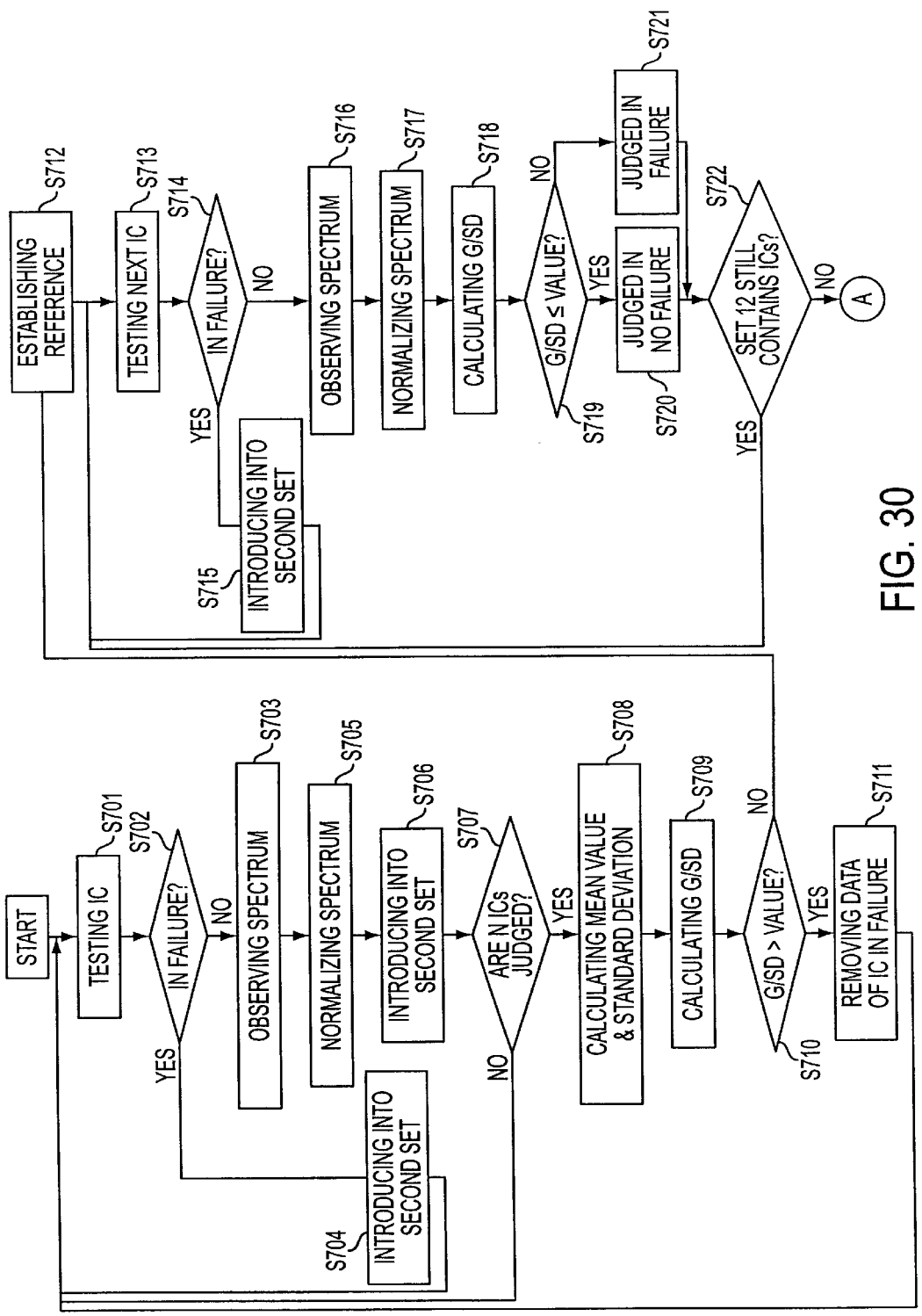
FIGS. 30 and 31 are flow-charts showing an operation of the apparatus in accordance with the seventh embodiment.
Figure 31:
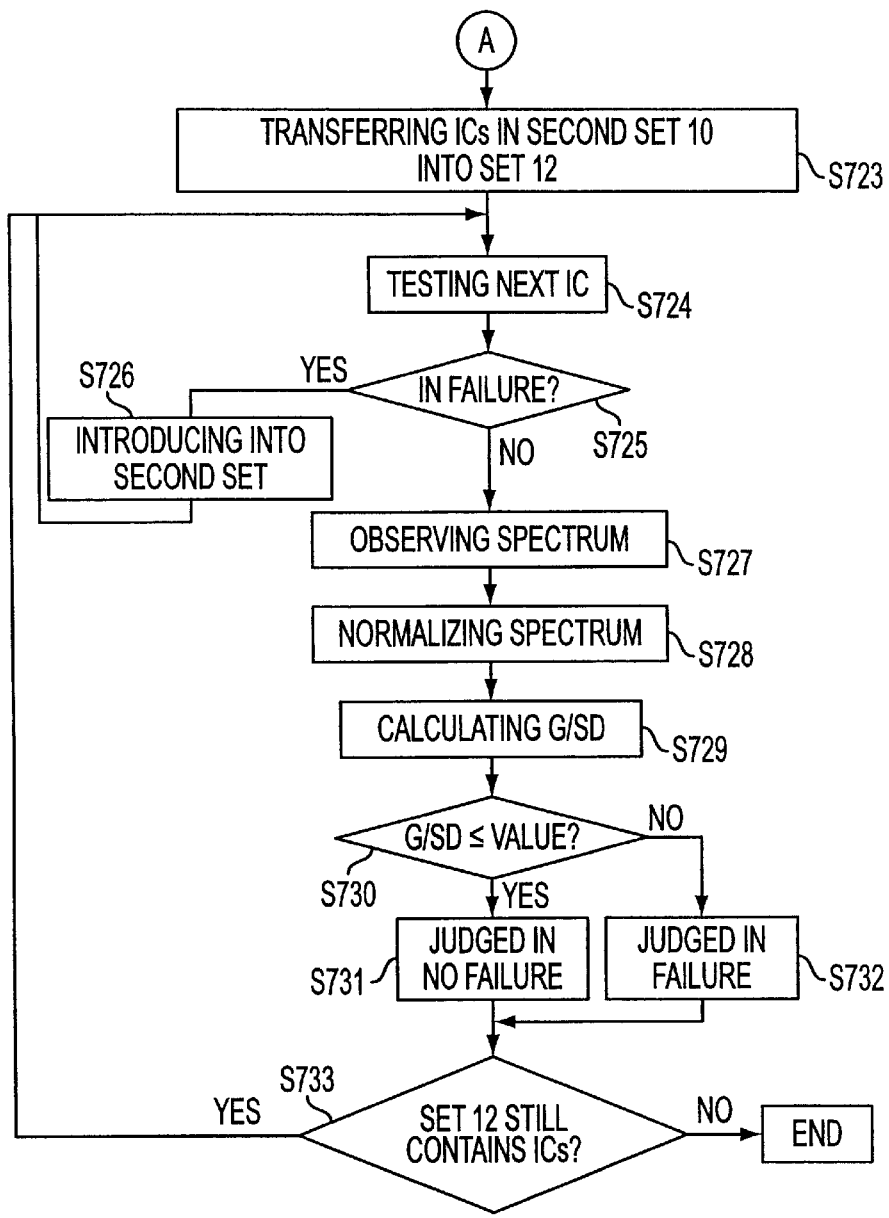

FIGS. 30 and 31 are flow-charts showing an operation of the apparatus in accordance with the seventh embodiment.

An operation to be carried out in steps S705, S717 and S728 in FIGS. 30 and 31 is identical with an operation to be carried out in step S504 in the fifth embodiment illustrated in FIG. 22. An operation of the apparatus in accordance with the seventh embodiment, to be carried out in other steps is identical with an operation of the apparatus in accordance with the third embodiment. Specifically, an operation to be carried out in steps S701 to S704, S706 to S716, S718 to S727 and S729 to S733 in FIGS. 30 and 31 is identical with an operation to be carried out in steps S301 to S304, S305 to S315, S316 to S325 and S326 to S330 in FIGS. 10 and 11, respectively.

The above-mentioned operation of the apparatus in accordance with the seventh embodiment is controlled by the main controller 4f. The above-mentioned operation may be described as a control program and stored in a recording medium such as a floppy disc or ROM equipped with the main controller 4f. By carrying out the control program in the main controller 4f, the above-mentioned operation can be repeated.

The seventh embodiment provides the same advantages as a sum of the advantages obtained by the third embodiment and the advantages obtained by the fifth embodiment.

Hereinbelow is explained an example of the seventh embodiment.

Figure 32:
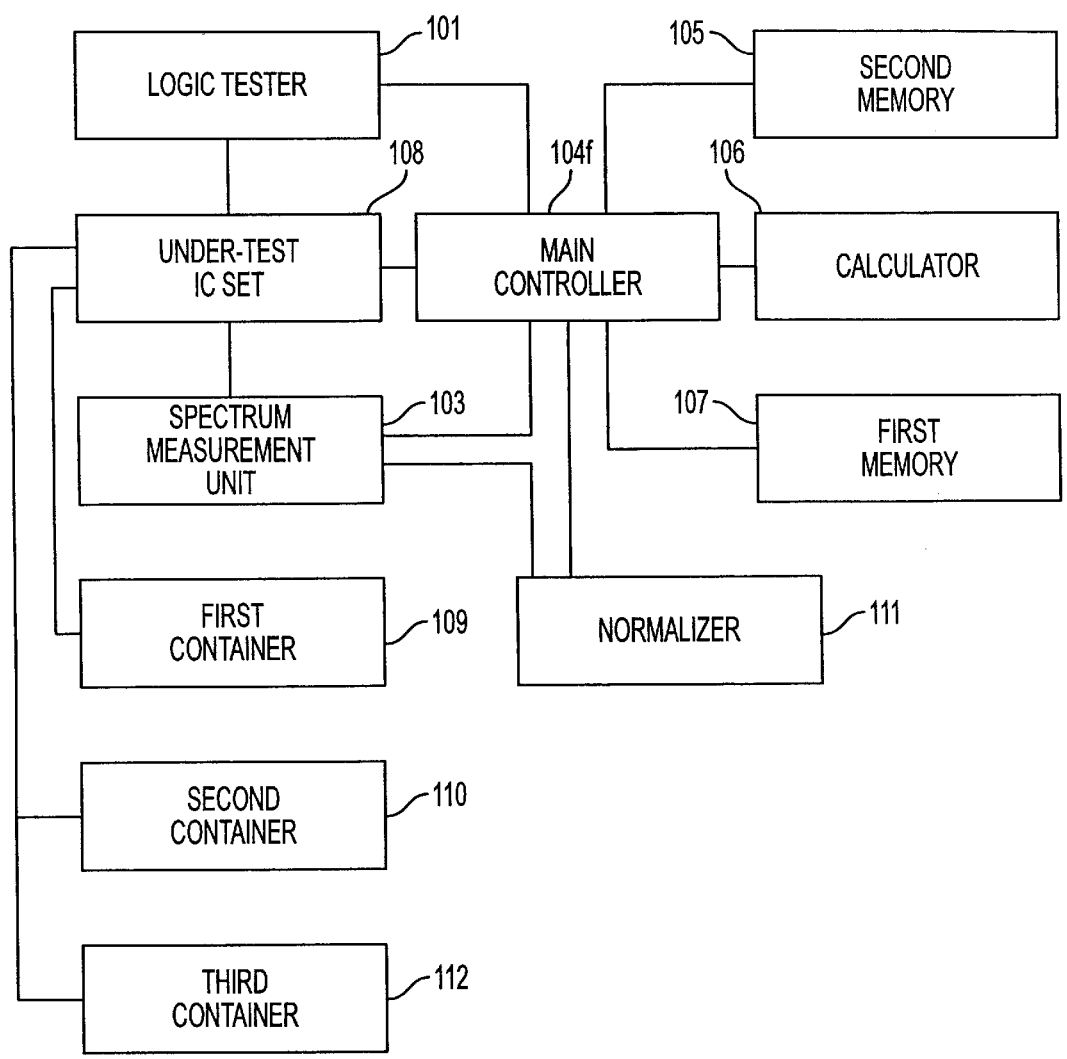
FIG. 32 is a block diagram of the apparatus in accordance with an example of the seventh embodiment.

FIG. 32 is a block diagram of an apparatus for detecting an integrated circuit having failures among a plurality of integrated circuits, in accordance with the example of the seventh embodiment. The illustrated apparatus is comprised of a logic tester 101, a spectrum measurement unit 103, a main controller 104f, a first memory 107, a second memory 105, a calculator 106, a first container 109 containing integrated circuits having been judged to have no failures, a second container 110 containing integrated circuits judged to have failures, a third container 112 containing integrated circuits to be tested and a normalizer 111.

In comparison with the apparatus in accordance with the example of the third embodiment, illustrated in FIG. 9, the apparatus in accordance with the example of the seventh embodiment is designed to include the main controller 104f in place of the main controller 104b and additionally include the normalizer 111. The main controller 104f has different functions from those of the main controller 104b. The normalizer 111 is electrically connected to the spectrum measurement unit 103, normalizes power source current spectrum measured by the spectrum measurement unit 103, and transmits the result of normalization to the first memory 107 through the main controller 104f.

Figure 33:
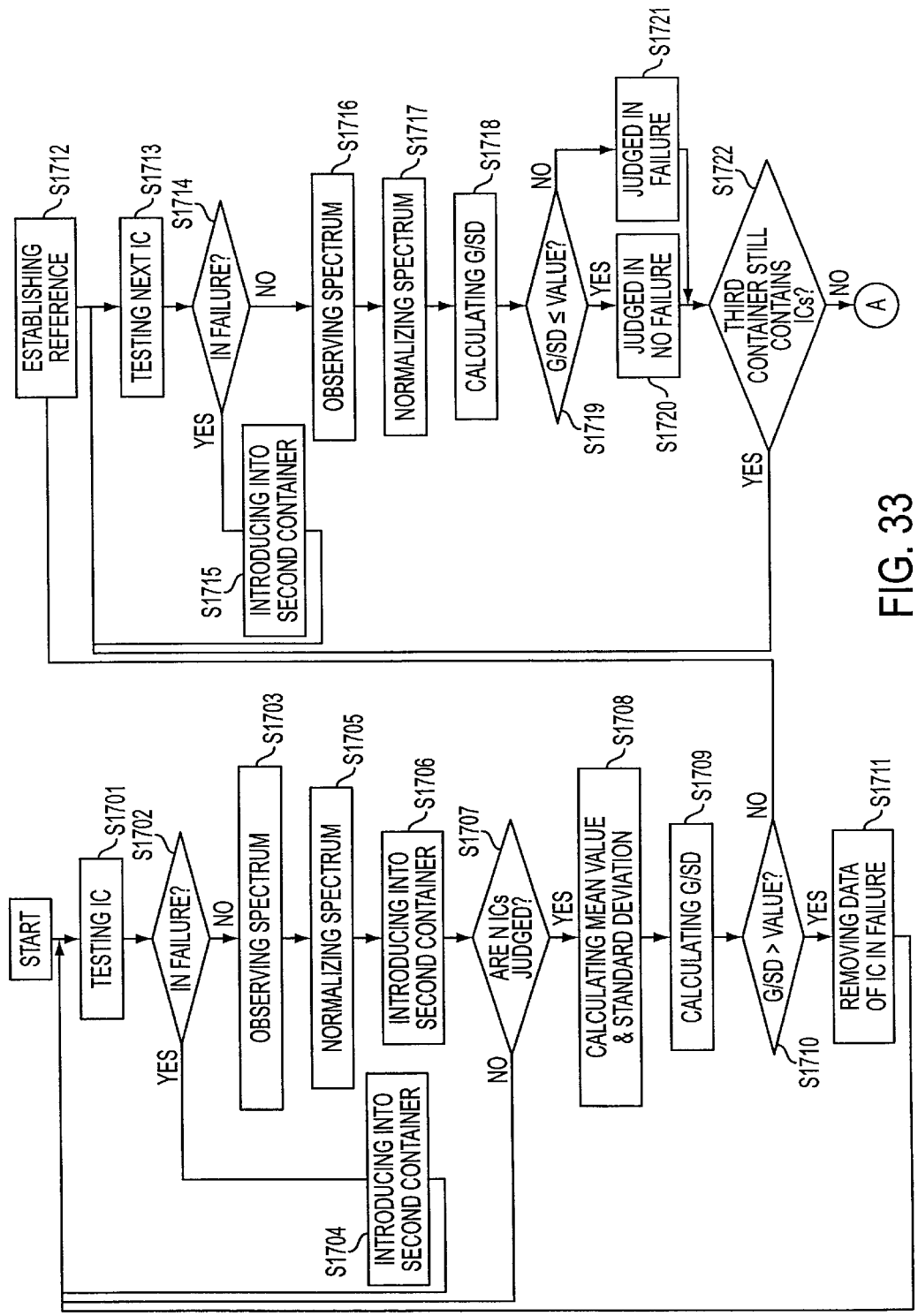
FIGS. 33 and 34 are flow-charts showing an operation of the apparatus in accordance with the example of the seventh embodiment.
Figure 34:
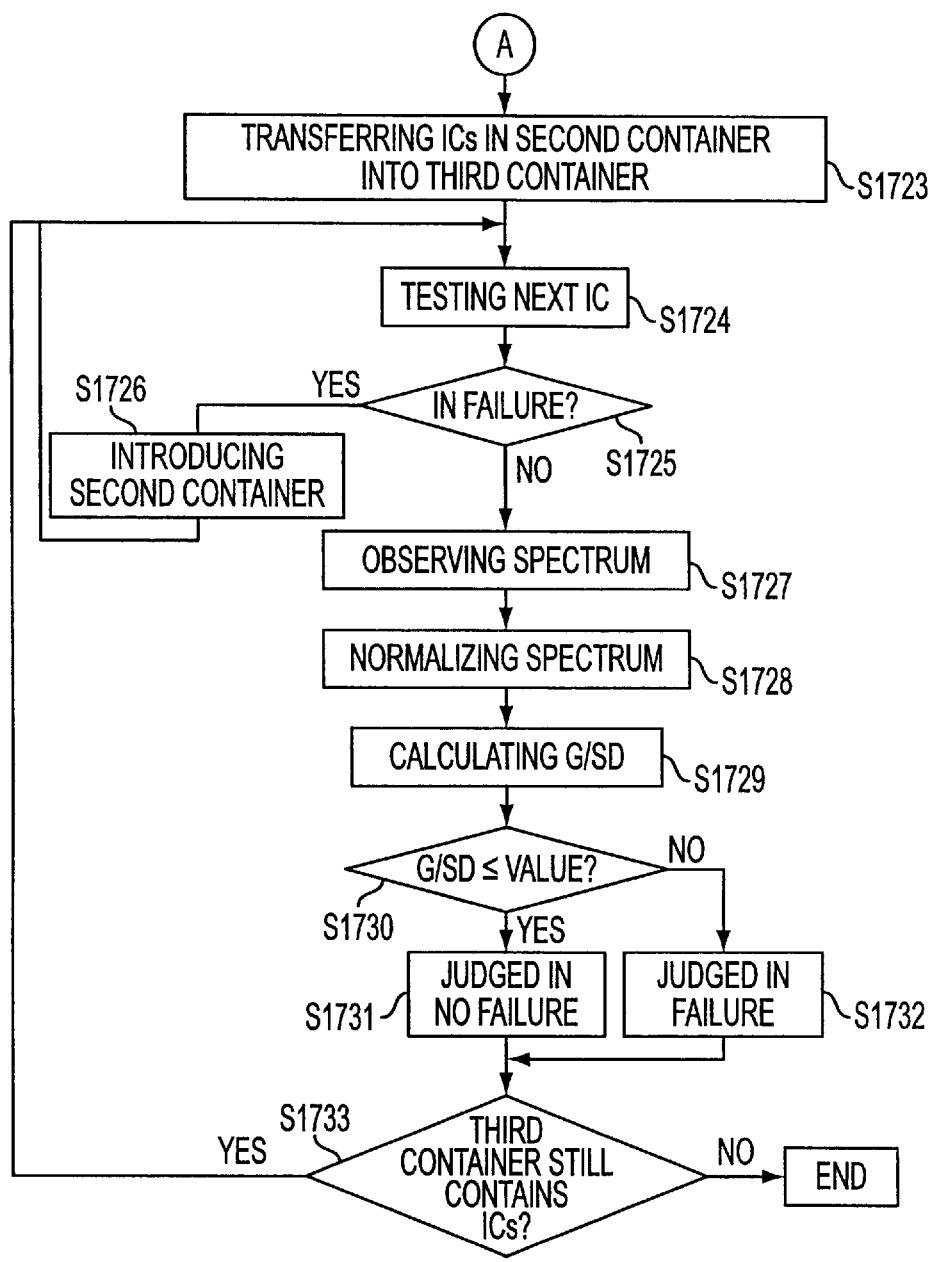

FIGS. 33 and 34 are flow-charts showing an operation of the apparatus in accordance with the example of the seventh embodiment.

An operation to be carried out in steps S1705, S1717 and S1728 in FIGS. 33 and 34 is identical with an operation to be carried out in step S1504 in the example of the fifth embodiment, illustrated in FIG. 24. An operation of the apparatus in accordance with the example of the seventh embodiment, to be carried out in other steps is identical with an operation of the apparatus in accordance with the example of the fifth embodiment. Specifically, an operation to be carried out in steps S1701 to S1704, S1706 to S1716, S1718 to S1727 and S1729 to S1733 in FIGS. 33 and 34 is identical with an operation to be carried out in steps S1301 to S1304, S1305 to S1315, S1316 to S1325 and S1326 to S1330 in FIGS. 13 and 14, respectively.

The above-mentioned operation of the apparatus in accordance with the example of the seventh embodiment is controlled by the main controller 104f. The above-mentioned operation may be described as a control program and stored in a recording medium such as a floppy disc or ROM equipped with the main controller 104f. By carrying out the control program in the main controller 104f, the above-mentioned operation can be repeated.

[Eighth Embodiment]

Figure 35:
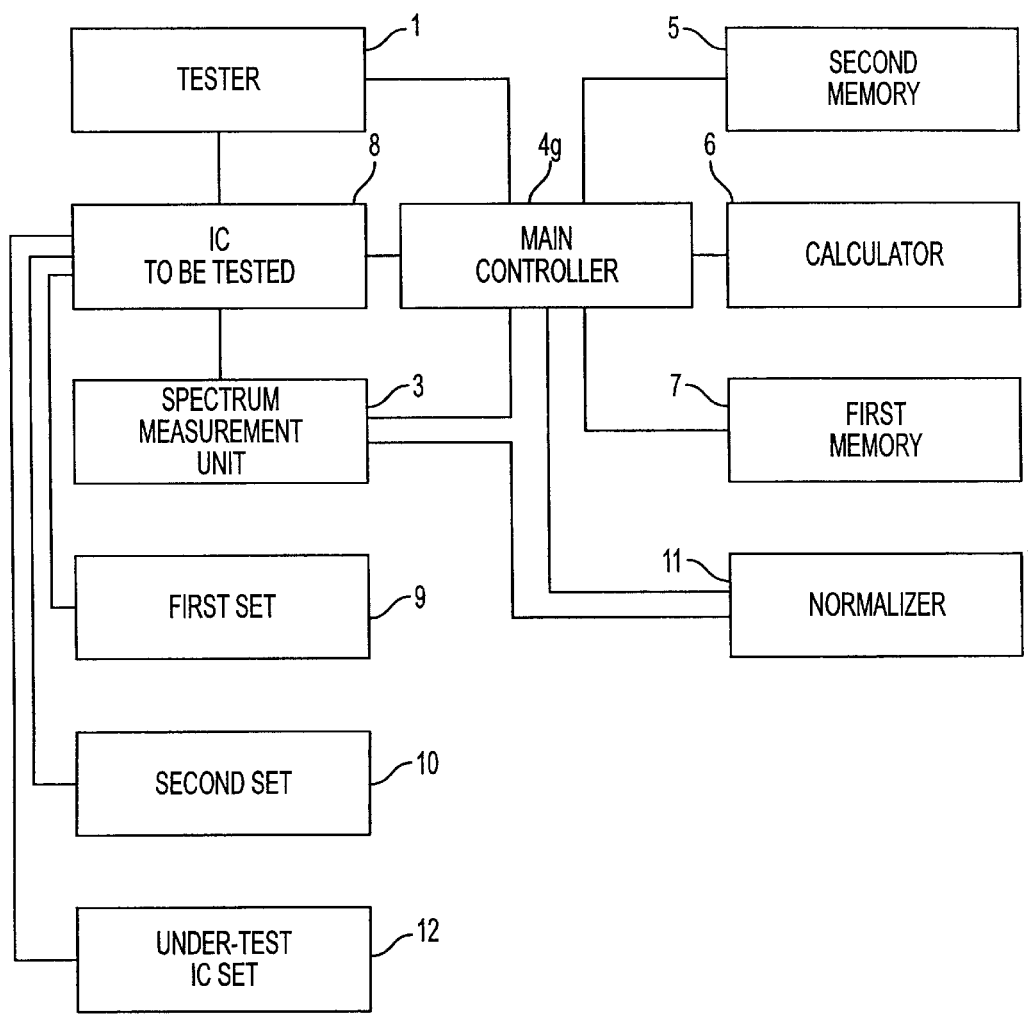
FIG. 35 is a block diagram of the apparatus in accordance with the eighth embodiment.

FIG. 35 is a block diagram of an apparatus for detecting an integrated circuit having failures among a plurality of integrated circuits, in accordance with the eighth embodiment. The illustrated apparatus is comprised of a tester 1, an under-test integrated circuit set 12, a spectrum measurement unit 3, a main controller 4g, a first memory 7, a second memory 5, a calculator 6, a first set 9 comprised of integrated circuits having been judged to have no failures, a second set 10 comprised of integrated circuits judged to have failures, and a normalizer 11.

In comparison with the apparatus in accordance with the fourth embodiment, illustrated in FIG. 15, the apparatus in accordance with the eighth embodiment is designed to include the main controller 4g in place of the main controller 4c and additionally include the normalizer 11. The main controller 4g has different functions from those of the main controller 4c. The normalizer 11 is electrically connected to the spectrum measurement unit 3, normalizes power source current spectrum measured by the spectrum measurement unit 3, and transmits the result of normalization to the first memory 7 through the main controller 4g.

Figure 36:
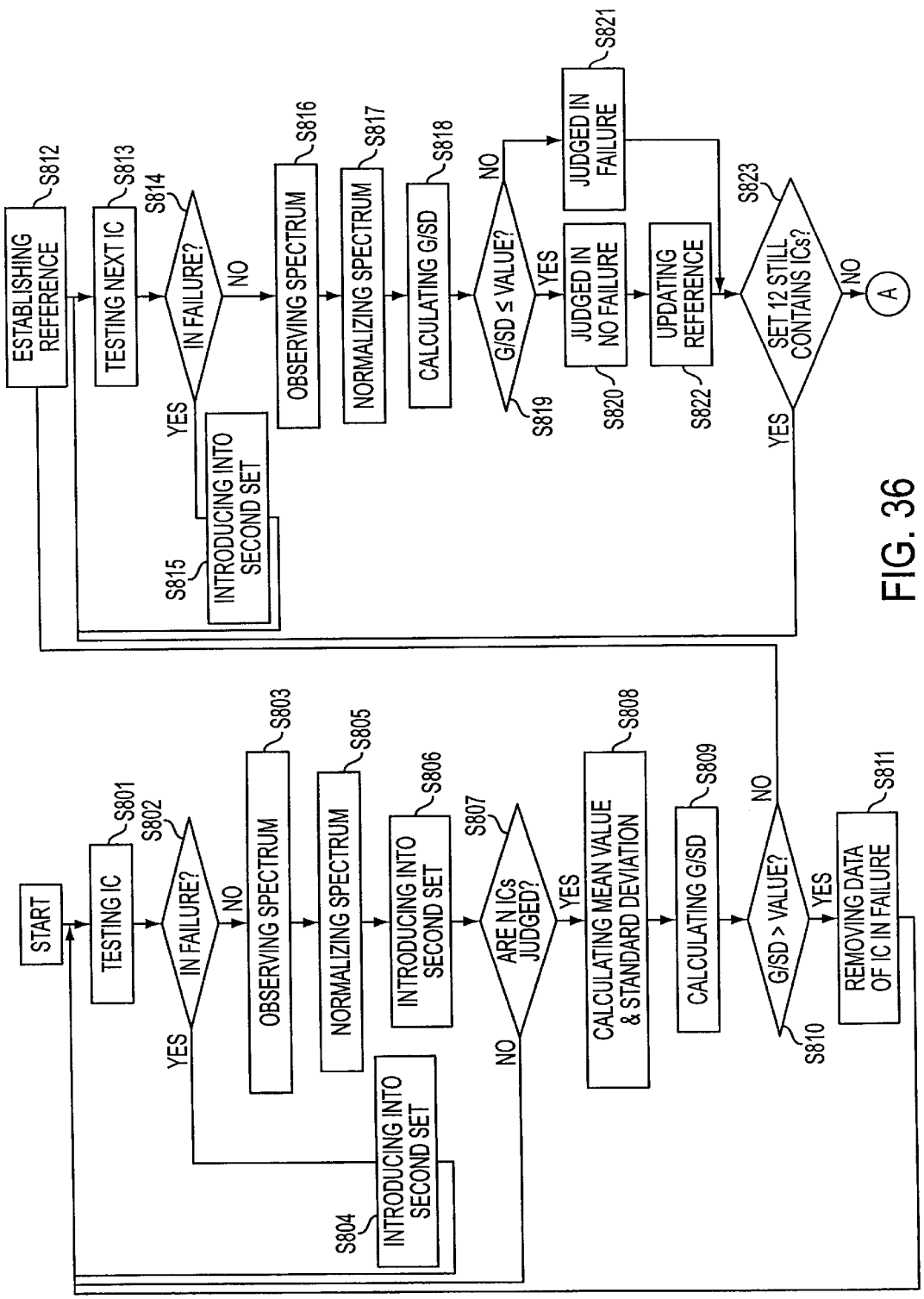
FIGS. 36 and 37 are flow-charts showing an operation of the apparatus in accordance with the eighth embodiment.
Figure 37:
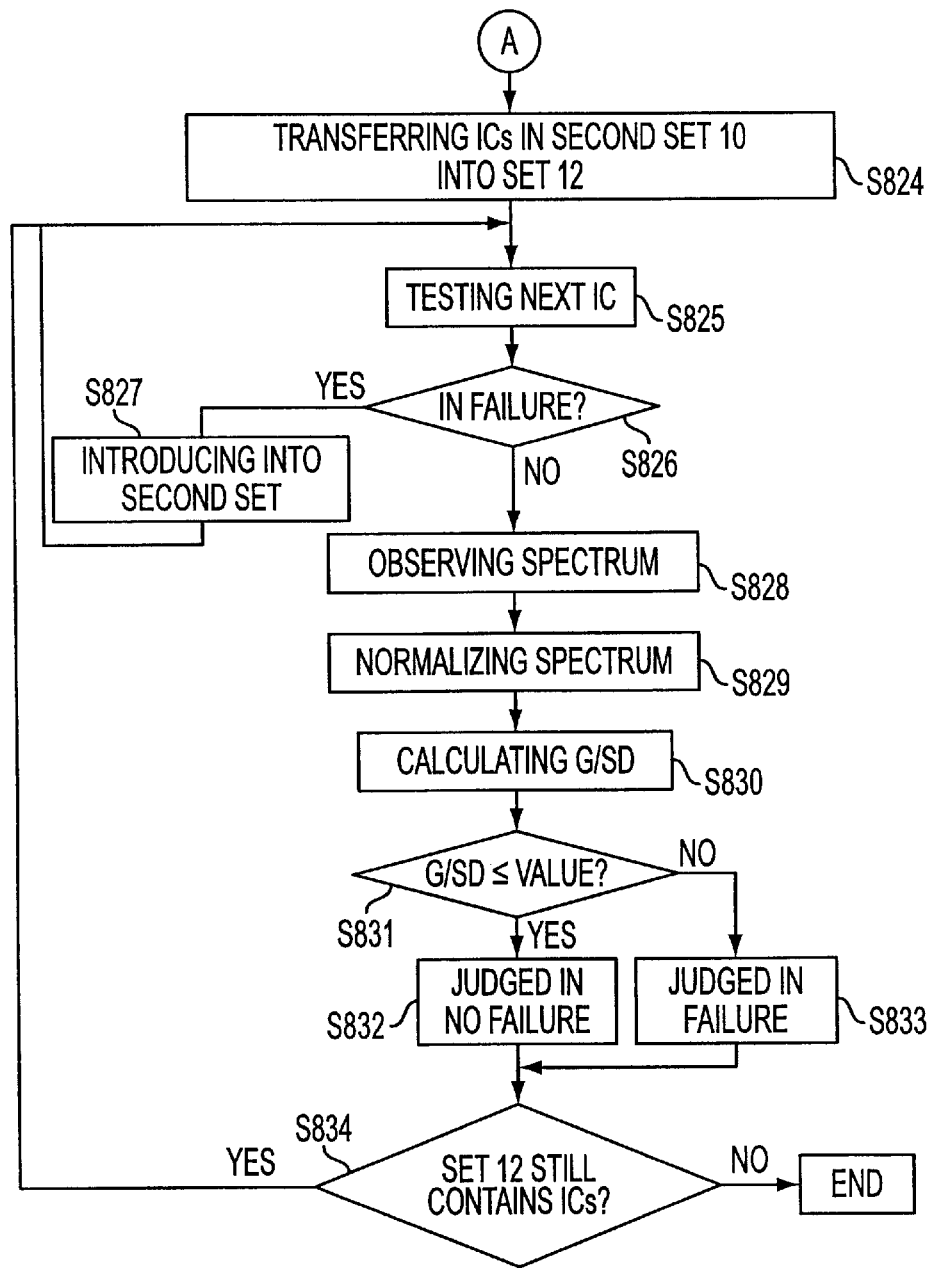

FIGS. 36 and 37 are flow-charts showing an operation of the apparatus in accordance with the example of the eighth embodiment.

An operation to be carried out in steps S805, S817 and S828 in FIGS. 36 and 37 is identical with an operation to be carried out in step S504 in the fifth embodiment, illustrated in FIG. 22. An operation of the apparatus in accordance with the eighth embodiment, to be carried out in other steps is identical with an operation of the apparatus in accordance with the example of the fourth embodiment. Specifically, an operation to be carried out in steps S801 to S804, S806 to S816, S818 to S828 and S830 to S834 in FIGS. 36 and 37 is identical with an operation to be carried out in steps S401 to S404, S405 to S415, S416 to S426 and S427 to S431 in FIGS. 16 and 17, respectively.

The above-mentioned operation of the apparatus in accordance with the eighth embodiment is controlled by the main controller 4g. The above-mentioned operation may be described as a control program and stored in a recording medium such as a floppy disc or ROM equipped with the main controller 4g. By carrying out the control program in the main controller 4g, the above-mentioned operation can be repeated.

The eighth embodiment provides the same advantages as a sum of the advantages obtained by the fourth embodiment and the advantages obtained by the fifth embodiment.

Hereinbelow is explained an example of the eighth embodiment.

Figure 38:
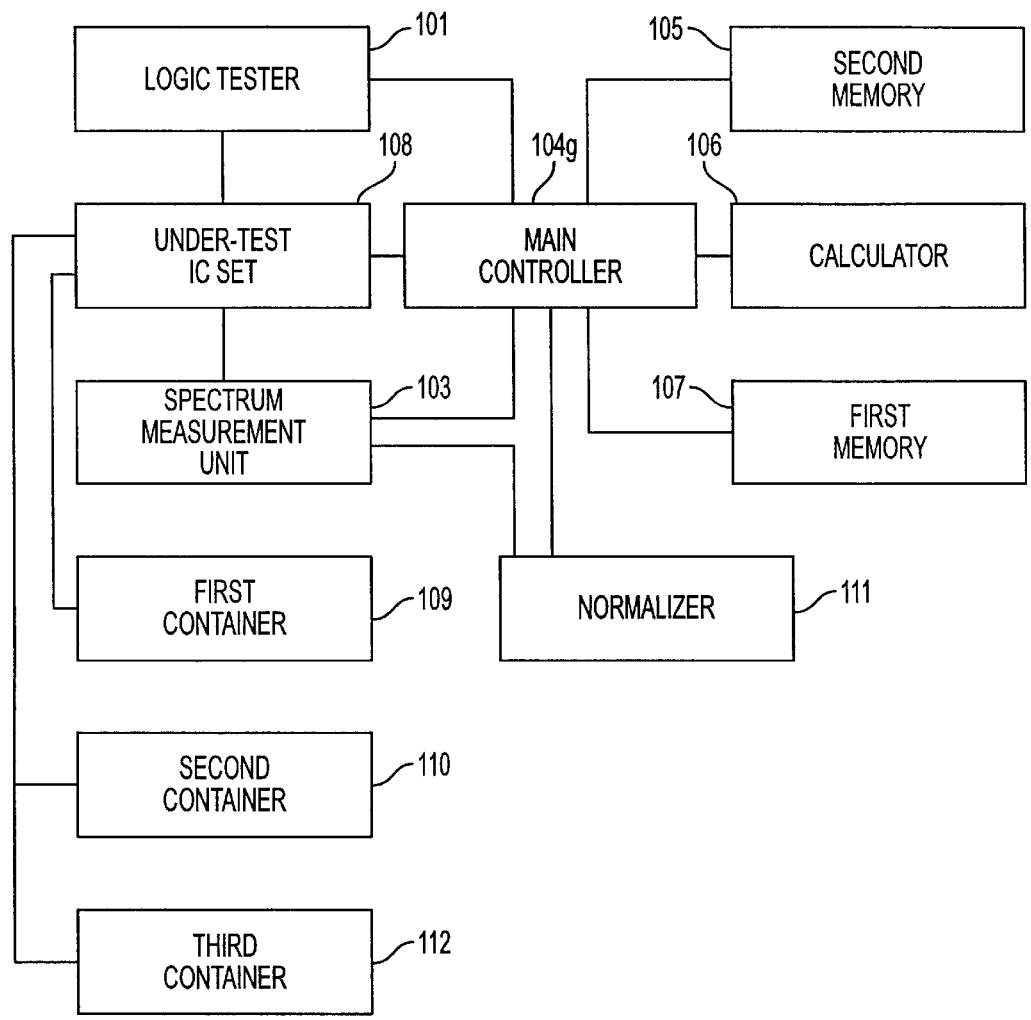
FIG. 38 is a block diagram of the apparatus in accordance with an example of the eighth embodiment.

FIG. 38 is a block diagram of an apparatus for detecting an integrated circuit having failures among a plurality of integrated circuits, in accordance with the example of the eighth embodiment. The illustrated apparatus is comprised of a logic tester 101, a spectrum measurement unit 103, a main controller 104g, a first memory 107, a second memory 105, a calculator 106, a first container 109 containing integrated circuits having been judged to have no failures, a second container 110 containing integrated circuits judged to have failures, a third container 112 containing integrated circuits to be tested and a normalizer 111.

In comparison with the apparatus in accordance with the example of the fourth embodiment, illustrated in FIG. 18, the apparatus in accordance with the example of the eighth embodiment is designed to include the main controller 104g in place of the main controller 104c and additionally include the normalizer 111. The main controller 104g has different functions from those of the main controller 104c. The normalizer 111 is electrically connected to the spectrum measurement unit 103, normalizes power source current spectrum measured by the spectrum measurement unit 103, and transmits the result of normalization to the first memory 107 through the main controller 104g.

Figure 39:
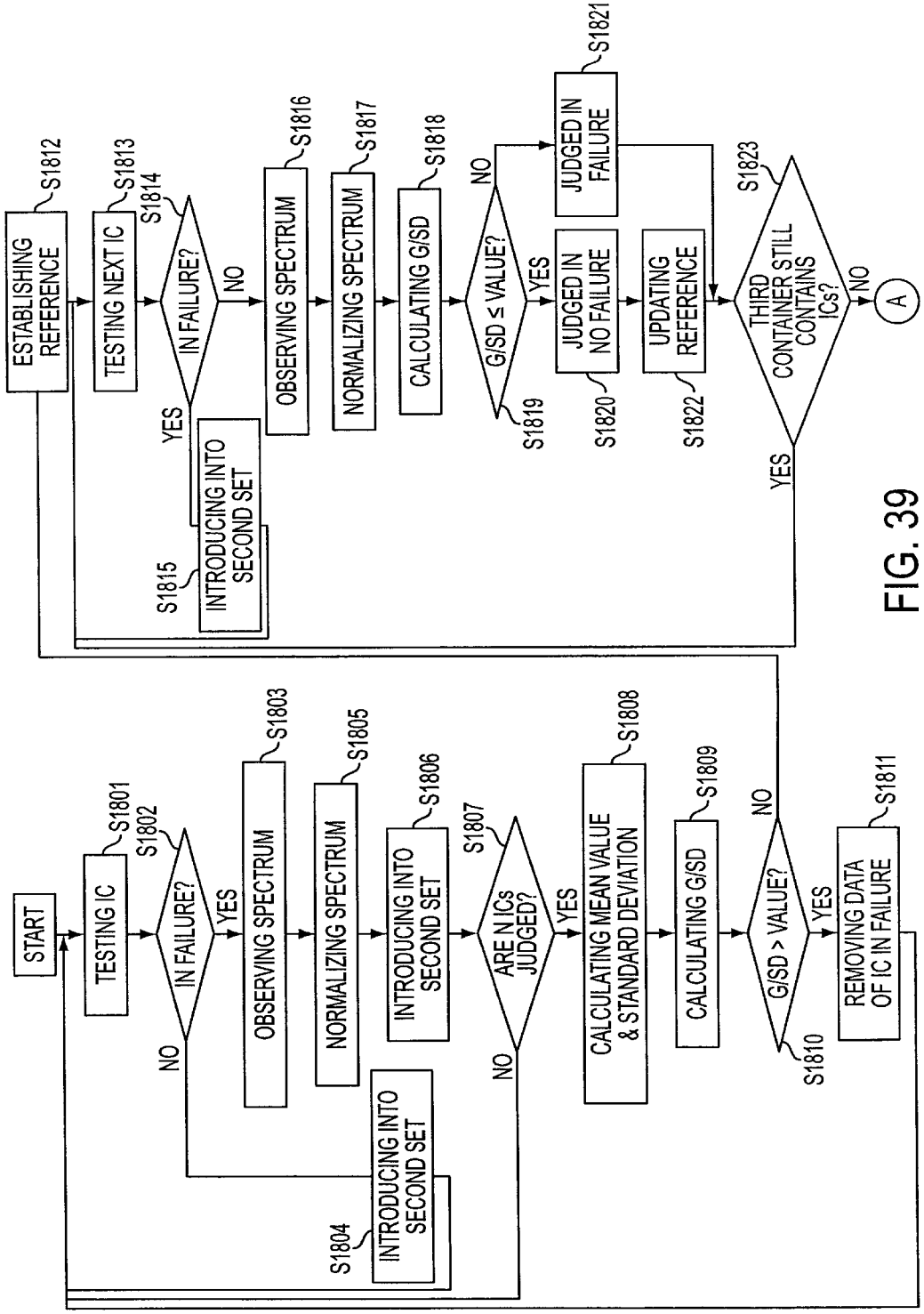
FIGS. 39 and 40 are flow-charts showing an operation of the apparatus in accordance with the example of the eighth embodiment.
Figure 40:
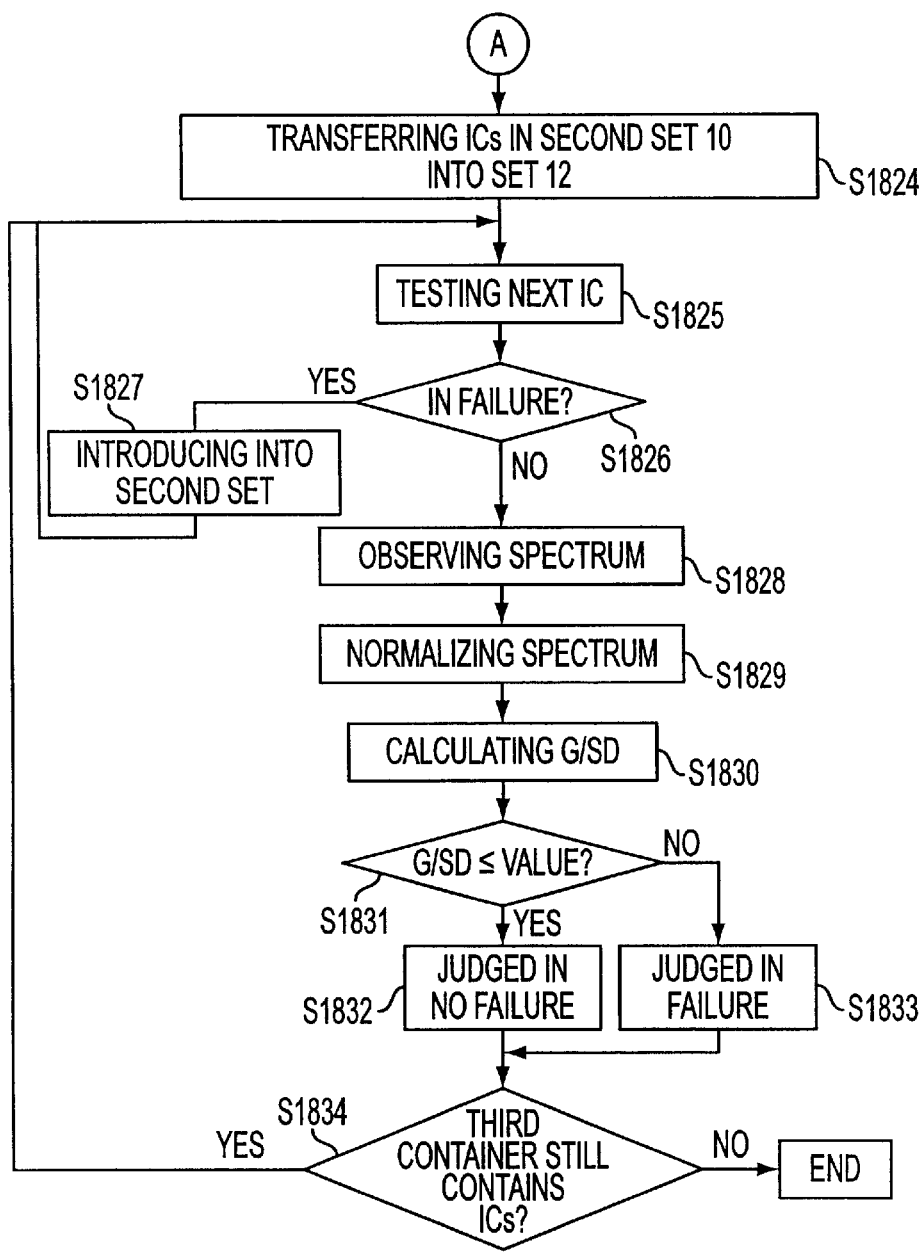

FIGS. 39 and 40 are flow-charts showing an operation of the apparatus in accordance with the example of the eighth embodiment.

An operation to be carried out in steps S1805, S1817 and S1829 in FIGS. 39 and 40 is identical with an operation to be carried out in step S1504 in the example of the fifth embodiment, illustrated in FIG. 24. An operation of the apparatus in accordance with the example of the eighth embodiment, to be carried out in other steps is identical with an operation of the apparatus in accordance with the example of the fourth embodiment. Specifically, an operation to be carried out in steps S1801 to S1804, S1806 to S1816, S1818 to S1828 and S1830 to S1834 in FIGS. 39 and 40 is identical with an operation to be carried out in steps S1401 to S1404, S1405 to S1415, S1416 to S1426 and S1427 to S1431 in FIGS. 19 and 20, respectively.

The above-mentioned operation of the apparatus in accordance with the example of the eighth embodiment is controlled by the main controller 104g. The above-mentioned operation may be described as a control program and stored in a recording medium such as a floppy disc or ROM equipped with the main controller 104g. By carrying out the control program in the main controller 104g, the above-mentioned operation can be repeated.

Hereinbelow is explained an embodiment of a recording medium storing a program therein for accomplishing the above-mentioned apparatus and method.

A recording medium storing a program for accomplishing the above-mentioned apparatus for detecting an integrated circuit having failures among a plurality of integrated circuits may be accomplished by programming functions of the above-mentioned apparatuses and systems with a programming language readable by a computer, and recording the program in a recording medium such as CD-ROM, a floppy disc, a magnetic tape, and any other suitable means for storing a program therein.

A hard disc equipped in a server may be employed as a recording medium. It is also possible to accomplish the recording medium in accordance with the present invention by storing the above-mentioned computer program in such a recording medium as mentioned above, and reading the computer program by other computers through a network.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 11-182726 filed on Jun. 29, 1999 including specification, claims, drawings and summary is incorporated herein by reference in its entirety.

What is claimed is:

1. A method of detecting an integrated circuit in failure among integrated circuits, based on spectrum which is a result of analyzing a frequency of a current running through an integrated circuit when a test signal is applied to said integrated circuit, without preparing data of an integrated circuit in no failure, as a reference, said method comprising the steps of:

(a) assuming that all integrated circuits under test define a under-test integrated circuit set, and testing each one of said integrated circuits in said under-test integrated circuit set to judge if any one of said integrated circuits is in failure;

(b) modifying said under-test integrated circuit set by removing integrated circuits having been judged to be in failure in said step (a), from said under-test integrated circuit set;

(c) measuring spectrum of a current supplied from a power source into each one of said integrated circuits in said under-test integrated circuit set modified in step (b);

(d) calculating a mean value and standard deviation of said spectrum for said under-test integrated circuit set modified in step (b);

(e) judging whether said standard deviation is equal to or smaller than a predetermined value;

(f) modifying said under-test integrated circuit set by removing an integrated circuit having specific spectrum determined based on said mean value, from said under-test integrated circuit set, if said standard deviation is greater than said predetermined value, and repeating said steps (d), (e) and (f); and (g) judging said under-test integrated circuit set modified in said step (b) to be in no failure, if said standard deviation has been judged to be equal to or smaller than said predetermined value in said step (e).

2. The method as set forth in claim 1, further comprising the step (h) of normalizing said spectrum, said step (h) being carried out subsequently to said step (c).

3. The method as Set forth in claim 2, wherein said step (h) further comprises the steps of: (h1) summing up spectrum for all frequencies to have a total; and (h2) calculating a ratio of spectrum for each one of frequencies to said total.

4. The method as set forth in claim 2, wherein said step (f) further includes comprises the steps of: (f1) calculating a gap between said spectrum and said mean value for each one of frequencies; (f2) identifying an integrated circuit having a maximum gap among gaps calculated in said step (f1); and (f3) removing said integrated circuit identified in said step (f2), from said under-test integrated circuit set.

5. An apparatus for detecting an integrated circuit in failure among integrated circuits, based on spectrum which is a result of analyzing a frequency of a current running through an integrated circuit when a test signal is applied to said integrated circuit, without preparing data of an integrated circuit in no failure, as a reference, said apparatus comprising:

(a) a tester which tests an integrated circuit as to whether said integrated circuit is in failure or not;

(b) a spectrum measurement unit which measures spectrum of said integrated circuit;

(c) a first memory storing said spectrum therein; and (d) a controller which establishes a reference, based on spectrum of the predetermined number of integrated circuits under test, and judges whether an integrated circuit among said integrated circuits is in failure or not, by comparing spectrum of each one of said integrated circuits under test to said reference.

6. The apparatus as set forth in claim 5, wherein said controller updates said reference, based on spectrum of an integrated circuit having been judged to be in no failure.

7. The apparatus as set forth in claim 5, further comprising a normalizer which normalizes said spectrum and replaces the previous spectrum with the normalized spectrum.

8. The apparatus as set forth in claim 6, further comprising a normalizer which normalizes said spectrum and replaces the previous spectrum with the normalized spectrum.

9. A recording medium readable by a computer, storing a program therein for causing a computer to carry out a method of detecting an integrated circuit in failure among integrated circuits, based on spectrum which is a result of analyzing a frequency of a current running through an integrated circuit when a test signal is applied to said integrated circuit, without preparing data of an integrated circuit in no failure, as a reference, said method comprising the steps of:

(a) assuming that all integrated circuits under test define a under-test integrated circuit set, and testing each one of said integrated circuits in said under-test integrated circuit set to judge if any one of said integrated circuits is in failure;

(b) modifying said under-test integrated circuit set by removing integrated circuits having been judged to be in failure in said step (a), from said under-test integrated circuit set;

(c) measuring spectrum of a current supplied from a power source into each one of said integrated circuits in said under-test integrated circuit set modified in step (b);

(d) calculating a mean value and standard deviation of said spectrum for said under-test integrated circuit set modified in step (b);

(e) judging whether said standard deviation is equal to or smaller than a predetermined value;

(f) modifying said under-test integrated circuit set by removing an integrated circuit having specific spectrum determined based on said mean value, from said under-test integrated circuit set, if said standard deviation is greater than said predetermined value, and repeating said steps (d), (e) and (f); and (g) judging said under-test integrated circuit set modified in said step (b) to be in no failure, if said standard deviation has been judged to be equal to or smaller than said predetermined value in said step (e).

10. The recording medium as set forth in claim 9, wherein said method further comprises the step (h) of normalizing said spectrum, said step (h) being carried out subsequently to said step (c).

11. The recording medium as set forth in claim 10, wherein said step (h) further comprises the steps of: (h1) summing up spectrum for all frequencies to have a total; and (h2) calculating a ratio of spectrum for each one of frequencies to said total.

12. The recording medium as set forth in claim 10, wherein said step (f) further comprises the steps of: (f1) calculating a gap between said spectrum and said mean value for each one of frequencies; (f2) identifying an integrated circuit having a maximum gap among gaps calculated in said step (f1); and (f3) removing said integrated circuit identified in said step (f2), from said under-test integrated circuit set.

13. A recording medium readable by a computer, storing a program therein for causing a computer to act as an apparatus for detecting an integrated circuit in failure among integrated circuits, based on spectrum which is a result of analyzing a frequency of a current running through an integrated circuit when a test signal is applied to said integrated circuit, without preparing data of an integrated circuit in no failure, as a reference, said apparatus comprising:

(a) a tester which tests an integrated circuit as to whether said integrated circuit is in failure or not;

(b) a spectrum measurement unit which measures spectrum of said integrated circuit;

(c) a first memory storing said spectrum therein; and (d) a controller which establishes a reference, based on spectrum of the predetermined number of integrated circuits under test, and judges whether an integrated circuit among said integrated circuits is in failure or not, by comparing spectrum of each one of said integrated circuits under test to said reference.

14. The recording medium as set forth in claim 13, wherein said controller updates said reference, based on spectrum of an integrated circuit having been judged to be in no failure.

15. The recording medium as set forth in claim 13, wherein said apparatus further comprises a normalizer which normalizes said spectrum and replaces the previous spectrum with the normalized spectrum.

16. The recording medium as set forth in claim 14, wherein said apparatus further comprises a normalizer which normalizes said spectrum and replaces the previous spectrum with the normalized spectrum.

* * * * *

UNITED STATES PATENT AND TRADEMARK OFFICE
CERTIFICATE OF CORRECTION

| | |
|---|---|
| PATENT NO. | : 6,684,170 B2 |
| APPLICATION NO. | : 10/320499 |
| DATED | : January 27, 2004 |
| INVENTOR(S) | : Kazuhiro Sakaguchi |

It is certified that error appears in the above-identified patent and that said Letters Patent is hereby corrected as shown below:

Foreign Priority Data missing.

Insert, --Foreign Application Priority Data, June 29, 1999, (JP) .11-182726--.

Delete the "Abstract" and replace it with the previously presented amended "Abstract"

--Detecting failed integrated circuit among integrated circuits by (a) assuming that all integrated circuits under test define under-test set, and testing each one of the integrated circuits in the under-test set, (b) removing integrated circuits judged to be in failure in step (a) from the under-test set, (c) measuring spectrum of a current supplied from a power source into each one of integrated circuits in under-test set, (d) calculating both mean value and standard deviation of spectrum for under-test set, (e) judging whether an integrated circuit is in failure or not, based on both the mean value and the standard deviation of the spectrum, (f) removing integrated circuits having been judged to be in failure in step (e), from the under-test set, and (g) judging under-test set to be in no failure. Thus, it is possible to find failed integrated circuits without preparing data of integrated circuit in no failure, as a reference.--

Claim 4, col 31, line 6, delete "comprises"

Signed and Sealed this

Seventh Day of October, 2008

JON W. DUDAS
*Director of the United States Patent and Trademark Office*